United States Patent
Wang et al.

(10) Patent No.: US 11,652,043 B2
(45) Date of Patent: May 16, 2023

(54) INTEGRATED CIRCUIT STRUCTURE WITH BACKSIDE VIA

(71) Applicant: Taiwan Semiconductor Manufacturing Co., Ltd., Hsinchu (TW)

(72) Inventors: Pei-Yu Wang, Hsinchu (TW); Yu-Xuan Huang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 107 days.

(21) Appl. No.: 17/158,409

(22) Filed: Jan. 26, 2021

(65) Prior Publication Data

US 2021/0343639 A1 Nov. 4, 2021

Related U.S. Application Data

(60) Provisional application No. 63/017,147, filed on Apr. 29, 2020.

(51) Int. Cl.
  *H01L 23/522* (2006.01)
  *H01L 21/768* (2006.01)
  *H01L 27/088* (2006.01)

(52) U.S. Cl.
  CPC .... *H01L 23/5226* (2013.01); *H01L 21/76802* (2013.01); *H01L 27/088* (2013.01)

(58) Field of Classification Search
  CPC .......... H01L 23/5226; H01L 21/76802; H01L 21/28518; H01L 21/76831; H01L 21/76897; H01L 21/823418; H01L 21/823475; H01L 27/088; H01L 29/66439; H01L 29/42392

USPC ......................................................... 257/368
See application file for complete search history.

(56) References Cited

U.S. PATENT DOCUMENTS

| | | | |
|---|---|---|---|
| 2018/0323295 A1 | 11/2018 | Okayasu et al. | |
| 2019/0148498 A1 | 5/2019 | Lee et al. | |
| 2019/0157310 A1 | 5/2019 | Glass et al. | |
| 2019/0237552 A1 | 8/2019 | LaRoche | |
| 2020/0013900 A1 | 1/2020 | Carr et al. | |
| 2021/0335783 A1* | 10/2021 | Chiu | H01L 21/7682 |

(Continued)

FOREIGN PATENT DOCUMENTS

| | | | |
|---|---|---|---|
| TW | 201742224 A | 12/2017 | |
| TW | 201919161 A | 5/2019 | |
| TW | 201937605 A | 9/2019 | |

*Primary Examiner* — Dao H Nguyen
(74) *Attorney, Agent, or Firm* — Slater Matsil, LLP

(57) ABSTRACT

An integrated circuit (IC) structure includes a gate structure, a source epitaxial structure, a drain epitaxial structure, a front-side interconnection structure, a backside dielectric layer, an epitaxial regrowth layer, and a backside via. The source epitaxial structure and the drain epitaxial structure are respectively on opposite sides of the gate structure. The front-side interconnection structure is over a front-side of the source epitaxial structure and a front-side of the drain epitaxial structure. The backside dielectric layer is over a backside of the source epitaxial structure and a backside of the drain epitaxial structure. The epitaxial regrowth layer is on the backside of a first one of the source epitaxial structure and the drain epitaxial structure. The backside via extends through the backside dielectric layer and overlaps the epitaxial regrowth layer.

20 Claims, 73 Drawing Sheets

(56) References Cited

U.S. PATENT DOCUMENTS

| | | | |
|---|---|---|---|
| 2021/0343578 A1* | 11/2021 | Chang | H01L 23/5226 |
| 2021/0358842 A1* | 11/2021 | Huang | H01L 21/76897 |
| 2022/0328657 A1* | 10/2022 | Lu | H01L 29/42392 |
| 2022/0359264 A1* | 11/2022 | Yu | H01L 29/66439 |
| 2022/0359375 A1* | 11/2022 | Huang | H01L 21/845 |

* cited by examiner

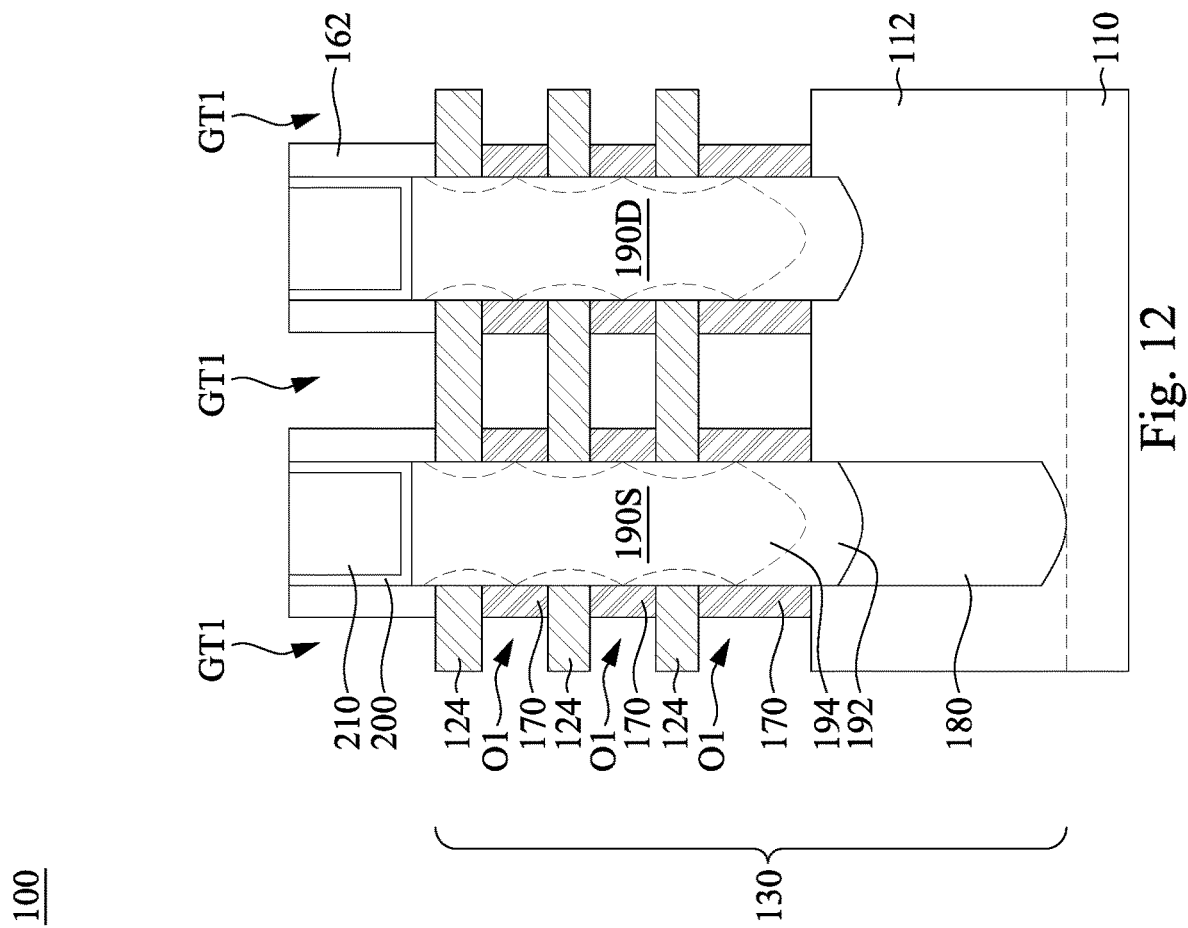

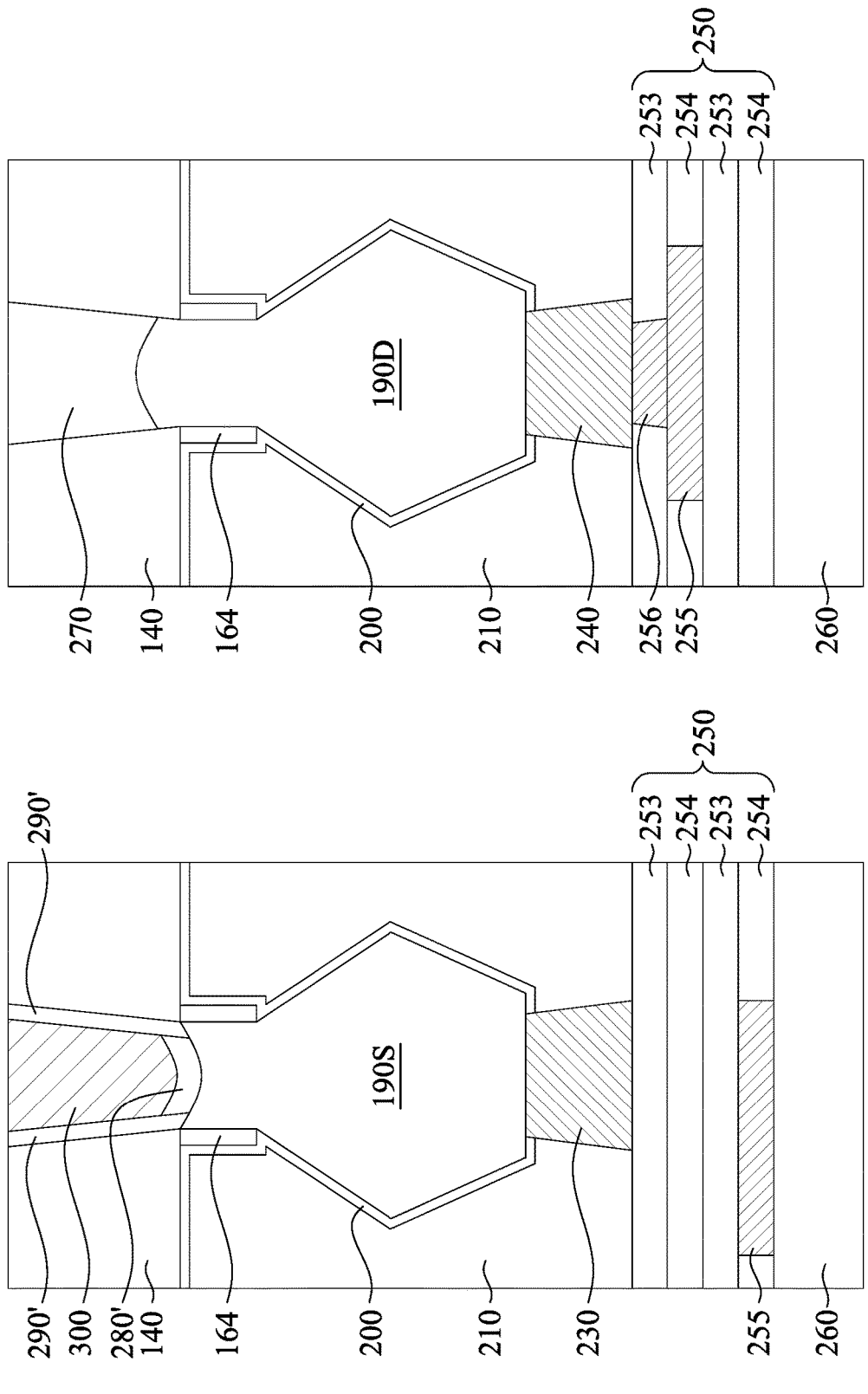

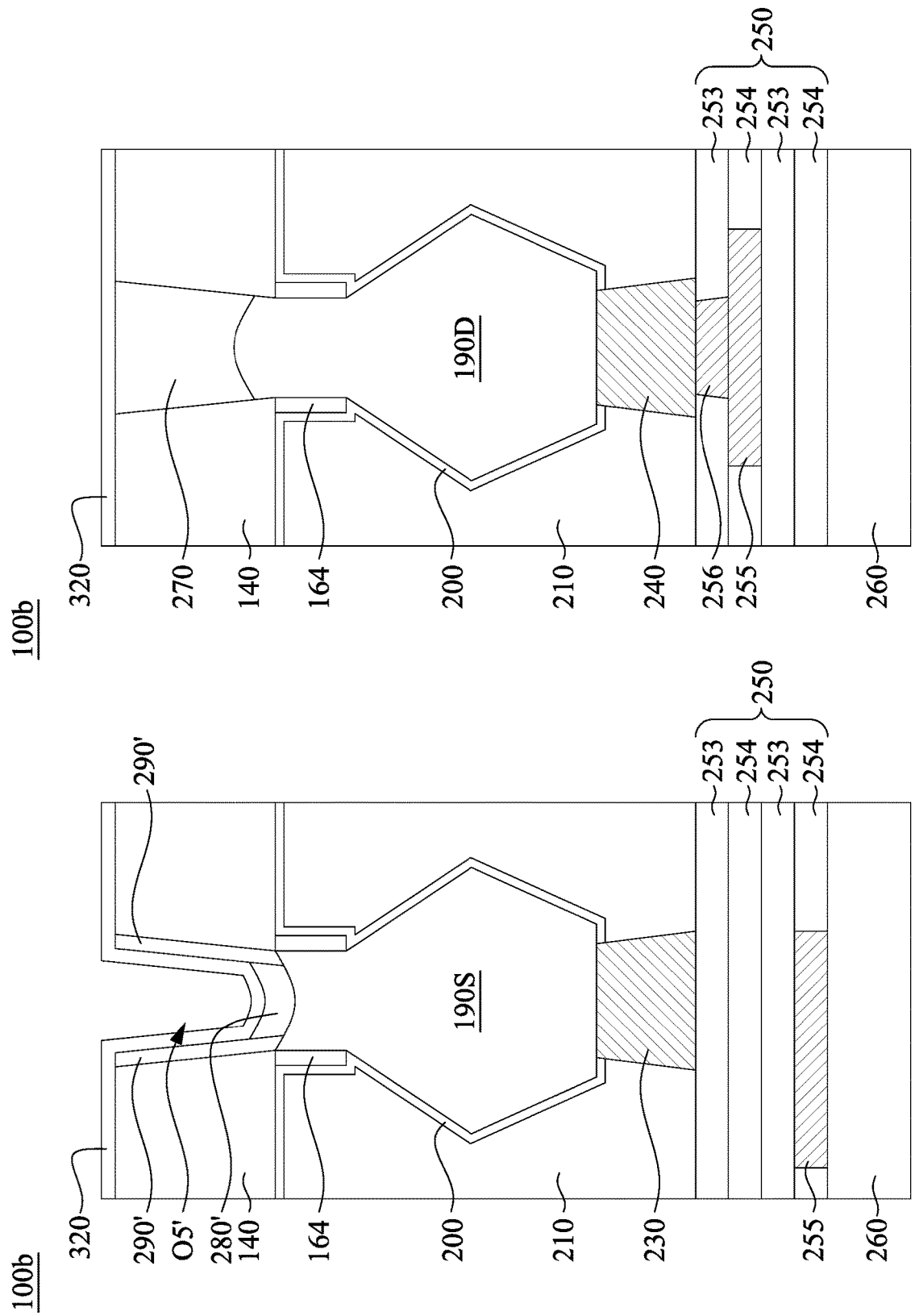

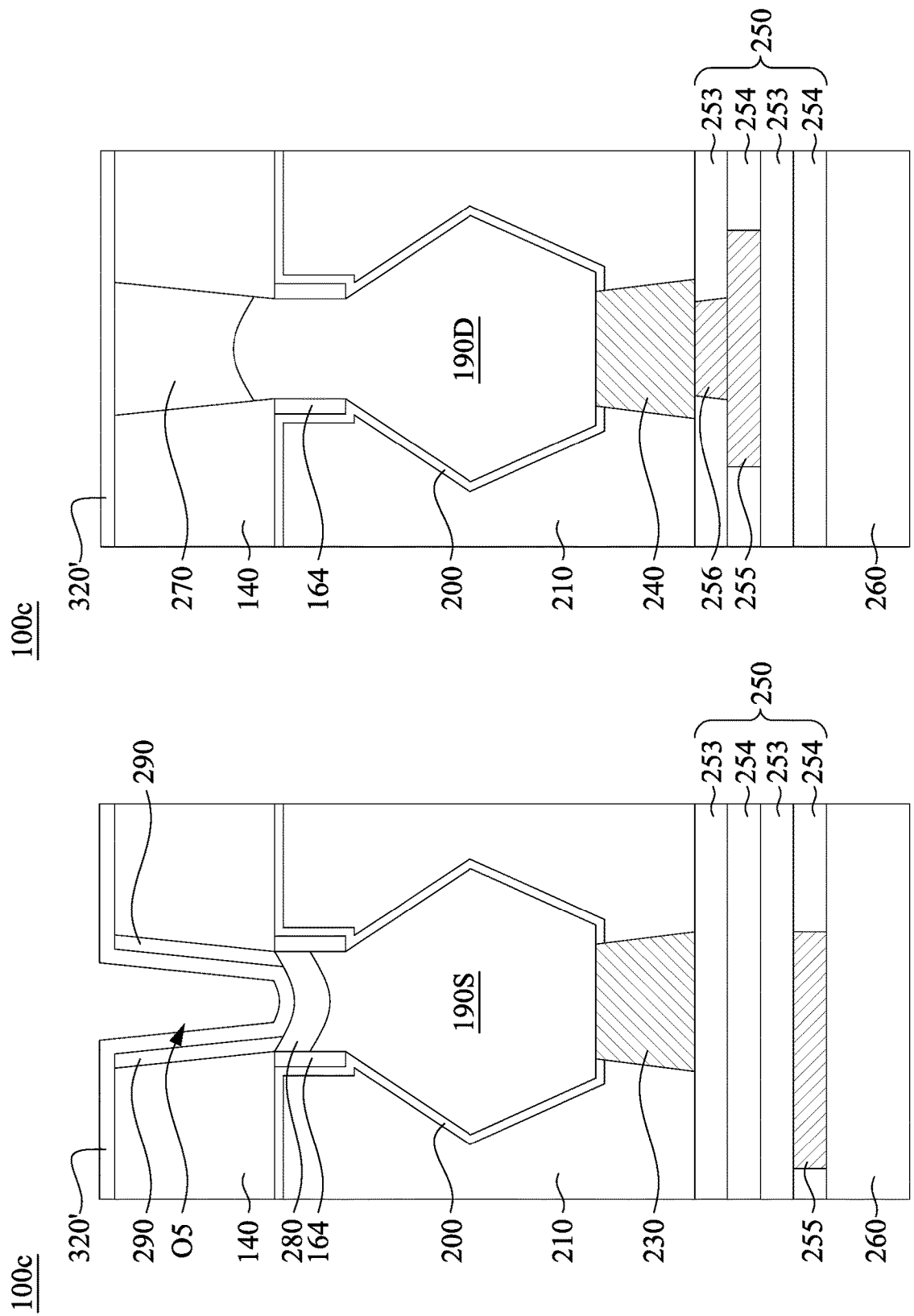

INTEGRATED CIRCUIT STRUCTURE WITH BACKSIDE VIA

PRIORITY CLAIM AND CROSS-REFERENCE

This application claims priority to U.S. Provisional Application No. 63/017,147, filed Apr. 29, 2020, entitled "Buried PR with Contact on Regrowth EPI Scheme," which is herein incorporated by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a multigate field effect transistor (FET), including a fin FET (Fin FET) and a gate-all-around (GAA) FET. In a Fin FET, a gate electrode is adjacent to three side surfaces of a channel region with a gate dielectric layer interposed therebetween. Because the gate structure surrounds (wraps) the fin on three surfaces, the transistor essentially has three gates controlling the current through the fin or channel region. Unfortunately, the fourth side, the bottom part of the channel is far away from the gate electrode and thus is not under close gate control. In contrast, in a GAA FET, all side surfaces of the channel region are surrounded by the gate electrode, which allows for fuller depletion in the channel region and results in less short-channel effects due to steeper sub-threshold current swing (SS) and smaller drain induced barrier lowering (DIBL).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B, 5B, 6B, 7B, 8, 9, 10A, 11A, 12, 13A, 14A, 15A, 16A, 17A, 18A, 19A, 20A, 21A, 22A, 23A, 24A and 25 are cross-sectional views of intermediate stages of fabricating the integrated circuit structure along a first cut, which is along a lengthwise direction of channels and perpendicular to a top surface of the substrate.

FIGS. 10B, 11B, 14B, 15B, 16B, 17B, 18B, 19B, 20B, 21B, 22B, 23B and 24B are cross-sectional views of intermediate stages of fabricating the integrated circuit structure along a second cut, which is in the source region and perpendicular to the lengthwise direction of channels.

FIGS. 10C, 11C, 14C, 15C, 16C, 17C, 18C, 19C, 20C, 21C, 22C, 23C and 24C are cross-sectional views of intermediate stages of fabricating the integrated circuit structure along a third cut, which is in the drain region and perpendicular to the lengthwise direction of channels.

FIGS. 27B, 28B, 29B and 30B are cross-sectional views of intermediate stages of fabricating the integrated circuit structure along a second cut, which is in the source region and perpendicular to the lengthwise direction of channels.

FIGS. 27C, 28C, 29C and 30C are cross-sectional views of intermediate stages of fabricating the integrated circuit structure along a third cut, which is in the drain region and perpendicular to the lengthwise direction of channels.

FIGS. 33B, 34B and 35B are cross-sectional views of intermediate stages of fabricating the integrated circuit structure along a second cut, which is in the source region and perpendicular to the lengthwise direction of channels.

FIGS. 33C, 34C and 35C are cross-sectional views of intermediate stages of fabricating the integrated circuit structure along a third cut, which is in the drain region and perpendicular to the lengthwise direction of channels.

FIGS. 38B, 39B and 40B are cross-sectional views of intermediate stages of fabricating the integrated circuit structure along a second cut, which is in the source region and perpendicular to the lengthwise direction of channels.

FIGS. 38C, 39C and 40C are cross-sectional views of intermediate stages of fabricating the integrated circuit structure along a third cut, which is in the drain region and perpendicular to the lengthwise direction of channels.

DETAILED DESCRIPTION

Figure 1:
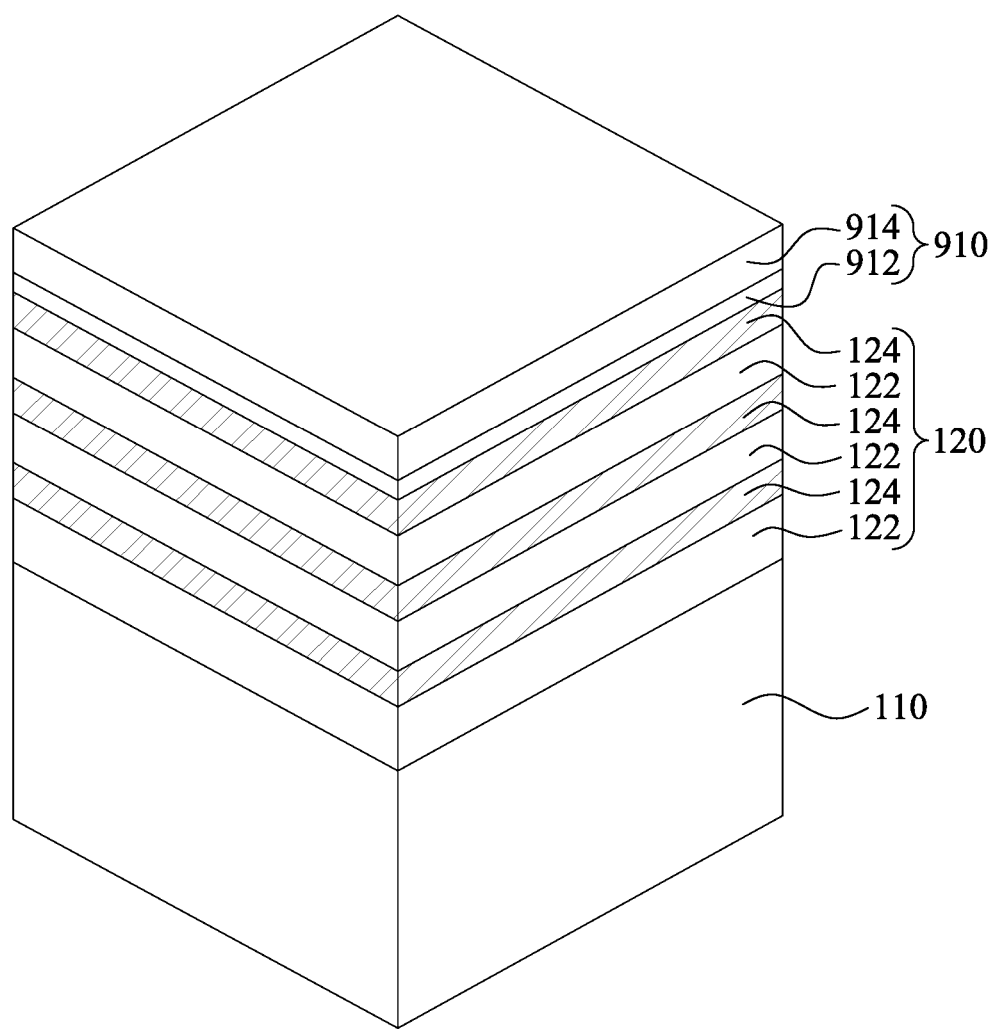
FIGS. 1, 2, 3, 4A, 5A, 6A and 7A are perspective views of intermediate stages in the fabricating an integrated circuit structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

The present disclosure is generally related to integrated circuit structures and methods of forming the same, and more particularly to fabricating gate-all-around (GAA) transistors with backside vias below source regions and/or drain regions of the GAA transistors. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel (s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

As scales of the fin width in fin field effect transistors (FinFET) decreases, channel width variations might cause mobility loss. GAA transistors, such as nanosheet transistors are being studied as an alternative to fin field effect transistors. In a nanosheet transistor, the gate of the transistor is made all around the channel (e.g., a nanosheet channel or a nanowire channel) such that the channel is surrounded or encapsulated by the gate. Such a transistor has the advantage of improving the electrostatic control of the channel by the gate, which also mitigates leakage currents.

In some embodiments, a backside power rail is utilized, thereby creating more routing space for an integrated circuit (IC) structure having a large number of GAA transistors. Backside metal vias provide an electrical connection to the GAA transistors, such as to the source epitaxial region. In some embodiments of the present disclosure, an epitaxial regrowth layer is formed on a backside of source epitaxial structure after the wafer front-side processing as well as the carrier substrate bonding processing. In this way, the epitaxial regrowth layer experiences less thermal processes than the source epitaxial structure, and thus has a better quality than the source epitaxial structure, which in turn helps in reducing the contact resistance between the backside via and the epitaxial regrowth layer.

FIGS. 1-25 illustrate perspective views and cross-sectional views of intermediate stages in formation of an integrated circuit having multi-gate devices, in accordance with some embodiments of the present disclosure. The steps shown in FIGS. 1-25 are also reflected schematically in the process flow shown in FIG. 26. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanosheet device having gate material disposed on at least four sides of at least one channel of the device. The channel region may be referred to as a "nanostructures," which as used herein includes channel regions of various geometries (e.g., cylindrical, bar-shaped, sheets, etc.) and various dimensions.

FIGS. 1, 2, 3, 4A, 5A, 6A and 7A are perspective views of intermediate stages in the fabricating an integrated circuit structure 100 in accordance with some embodiments of the present disclosure. FIGS. 4B, 5B, 6B, 7B, 8, 9, 10A, 11A, 12, 12A, 14A, 15A, 16A, 17A, 18A, 19A, 20A, 21A, 22A, 23A, 24A and 25 are cross-sectional views of intermediate stages of fabricating the integrated circuit structure 100 along a first cut (e.g., cut X-X in FIG. 4A), which is along a lengthwise direction of channels and perpendicular to a top surface of the substrate. FIGS. 10B, 11B, 14B, 15B, 16B, 17B, 18B, 19B, 20B, 21B, 22B, 23B and 24B are cross-sectional views of intermediate stages of fabricating the integrated circuit structure 100 along a second cut (e.g., cut Y1-Y1 in FIG. 4A), which is in the source region and perpendicular to the lengthwise direction of channels. FIGS. 10C, 11C, 14C, 15C, 16C, 17C, 18C, 19C, 20C, 21C, 22C, 23C and 24C are cross-sectional views of intermediate stages of fabricating the integrated circuit structure 100 along a third cut (e.g., cut Y2-Y2 in FIG. 4A), which is in the drain region and perpendicular to the lengthwise direction of channels. FIG. 13B is a cross-sectional view of an intermediate stage of fabricating the integrated circuit structure 100 along a fourth cut (e.g., cut Y3-Y3 in FIG. 4A), which is in the gate region and perpendicular to the lengthwise direction of channels. FIGS. 23D and 24D are top views of intermediate stages of fabricating the integrated circuit structure 100 in accordance with some embodiments of the present disclosure. It is understood that additional operations can be provided before, during, and after the processes shown by FIGS. 1-25, and some of the operations described below can be replaced or eliminated, for additional embodiments of the method. The order of the operations/processes may be interchangeable.

As with the other method embodiments and exemplary devices discussed herein, it is understood that parts of the integrated circuit structure 100 may be fabricated by a CMOS technology process flow, and thus some processes are only briefly described herein. Further, the exemplary integrated circuit structure may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the concepts of the present disclosure. In some embodiments, the exemplary integrated circuit structure includes a plurality of semiconductor devices (e.g., transistors), including PFETs, NFETs etc., which may be interconnected. Moreover, it is noted that the process steps of fabricating the integrated circuit structure 100, including any descriptions given with reference to FIGS. 1-25, as with the remainder of the method and exemplary figures provided in this disclosure, are merely exemplary and are not intended to be limiting beyond what is specifically recited in the claims that follow.

FIG. 1 illustrates a perspective view of an initial structure. The initial structure includes an epitaxial stack 120 formed over the substrate 110. In some embodiments, the substrate 110 may include silicon (Si). Alternatively, the substrate 110 may include germanium (Ge), silicon germanium (SiGe), a III-V material (e.g., GaAs, GaP, GaAsP, AlInAs, AlGaAs, GaInAs, InAs, GaInP, InP, InSb, and/or GaInAsP; or a combination thereof) or other appropriate semiconductor materials. In some embodiments, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or another appropriate method.

The epitaxial stack 120 includes epitaxial layers 122 of a first composition interposed by epitaxial layers 124 of a second composition. The first and second compositions can be different. In some embodiments, the epitaxial layers 122 are SiGe and the epitaxial layers 124 are silicon (Si). However, other embodiments are possible including those that provide for a first composition and a second composition having different oxidation rates and/or etch selectivity. In some embodiments, the epitaxial layers 122 include SiGe and where the epitaxial layers 124 include Si, the Si oxidation rate of the epitaxial layers 124 is less than the SiGe oxidation rate of the epitaxial layers 122.

The epitaxial layers 124 or portions thereof may form nanostructure channel(s) of the multi-gate transistor. The term nanostructure is used herein to designate any material portion with nanoscale, or even microscale dimensions, and having an elongate shape, regardless of the cross-sectional shape of this portion. Thus, this term designates both circular and substantially circular cross-section elongate material portions (e.g., nanowires), and beam or bar-shaped material portions (e.g., nanosheets, nanobars) including for example a cylindrical in shape or substantially rectangular cross-section. The use of the epitaxial layers 124 to define a channel or channels of a device is further discussed below.

It is noted that three layers of the epitaxial layers 122 and three layers of the epitaxial layers 124 are alternately arranged as illustrated in FIG. 1, which is for illustrative purposes only and not intended to be limiting beyond what is specifically recited in the claims. It can be appreciated that any number of epitaxial layers can be formed in the epitaxial stack 120; the number of layers depending on the desired number of channels regions for the transistor. In some embodiments, the number of epitaxial layers 124 is between 2 and 10.

In some embodiments, each epitaxial layer 122 has a thickness ranging from about 1 nanometers (nm) to about 10 nm, but other ranges are within the scope of various embodiments of the present disclosure. The epitaxial layers 122 may be substantially uniform in thickness. In some embodiments, each epitaxial layer 124 has a thickness ranging from about 1 nm to about 10 nm, but other ranges are within the scope of various embodiments of the present disclosure. In some embodiments, the epitaxial layers 124 of the stack are substantially uniform in thickness. As described in more detail below, the epitaxial layers 124 may serve as channel region(s) for a subsequently-formed multi-gate device and the thickness is chosen based on device performance considerations. The epitaxial layers 122 in channel regions(s) may eventually be removed and serve to define a vertical distance between adjacent channel region(s) for a subsequently-formed multi-gate device and the thickness is chosen based on device performance considerations. Accordingly, the epitaxial layers 122 may also be referred to as sacrificial layers, and epitaxial layers 124 may also be referred to as channel layers.

By way of example, epitaxial growth of the layers of the stack 120 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 124 include the same material as the substrate 110. In some embodiments, the epitaxially grown layers 122 and 124 include a different material than the substrate 110. As stated above, in at least some examples, the epitaxial layers 122 include an epitaxially grown silicon germanium (SiGe) layer and the epitaxial layers 124 include an epitaxially grown silicon (Si) layer. Alternatively, in some embodiments, either of the epitaxial layers 122 and 124 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 122 and 124 may be chosen based on providing differing oxidation and/or etching selectivity properties. In some embodiments, the epitaxial layers 122 and 124 are substantially dopant-free (e.g., having an extrinsic dopant concentration from about 0 $cm^{-3}$ to about $1 \times 10^{18}$ $cm^{-3}$), where for example, no intentional doping is performed during the epitaxial growth process.

Figure 2:
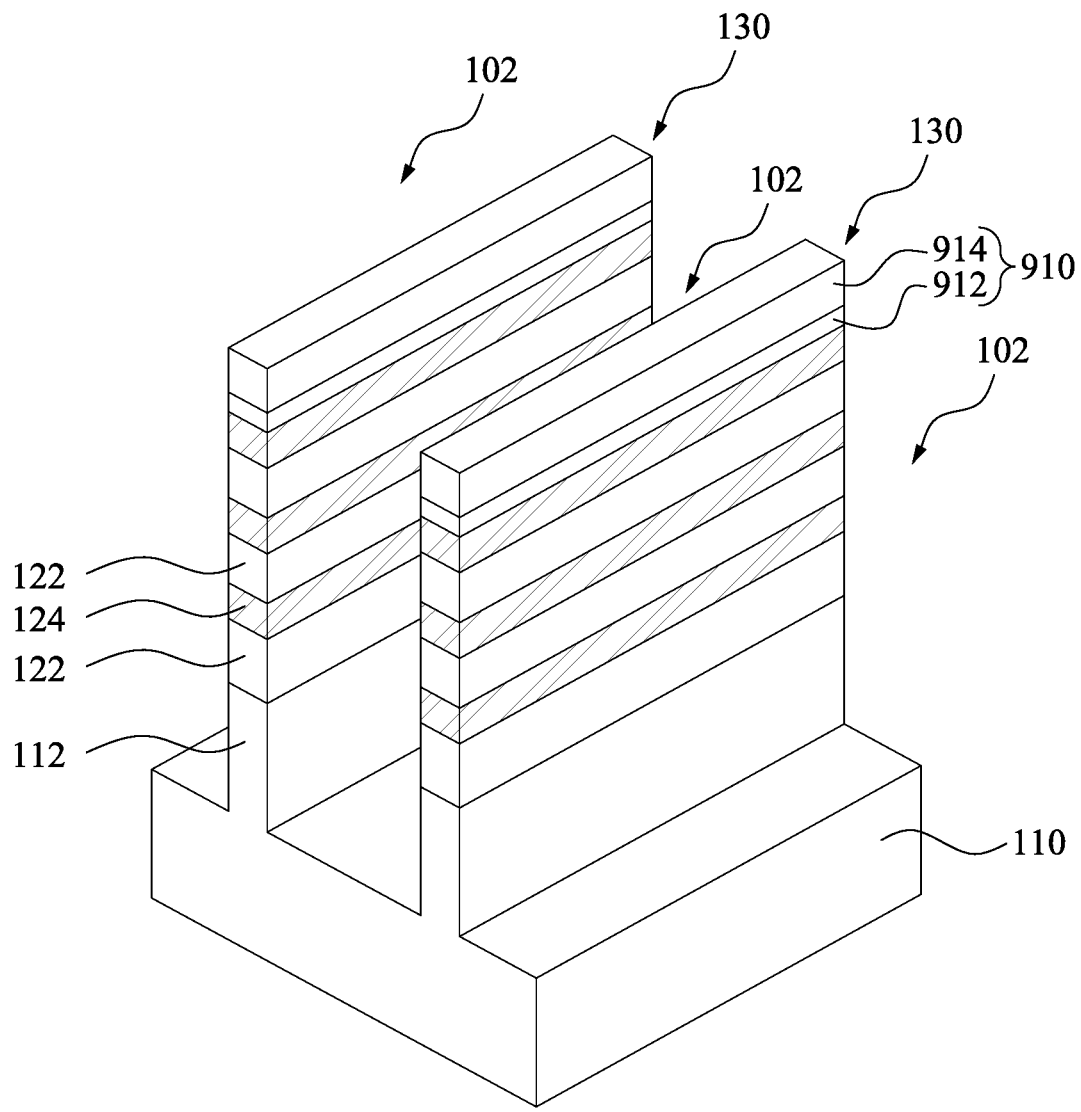

FIG. 2 illustrates a perspective view of formation of a plurality of semiconductor fins 130 extending from the substrate 110. In various embodiments, each of the fins 130 includes a substrate portion 112 formed from the substrate 110 and portions of each of the epitaxial layers of the epitaxial stack including epitaxial layers 122 and 124.

In the embodiment as illustrated in FIGS. 1 and 2, a hard mask (HM) layer 910 is formed over the epitaxial stack 120 prior to patterning the fins 130. In some embodiments, the HM layer includes an oxide layer 912 (e.g., a pad oxide layer that may include $SiO_2$) and a nitride layer 914 (e.g., a pad nitride layer that may include $Si_3N_4$) formed over the oxide layer. The oxide layer 912 may act as an adhesion layer between the epitaxial stack 120 and the nitride layer 914 and may act as an etch stop layer for etching the nitride layer 914. In some examples, the HM oxide layer 912 includes thermally grown oxide, chemical vapor deposition (CVD)-deposited oxide, and/or atomic layer deposition (ALD)-deposited oxide. In some embodiments, the HM nitride layer 914 is deposited on the HM oxide layer 912 by CVD and/or other suitable techniques.

The fins 130 may subsequently be fabricated using suitable processes including photolithography and etch processes. The photolithography process may include forming a photoresist layer (not shown) over the HM layer 910, exposing the photoresist to a pattern, performing post-exposure bake processes, and developing the resist to form a patterned mask including the resist. In some embodiments, patterning the resist to form the patterned mask element may be performed using an electron beam (e-beam) lithography process or an extreme ultraviolet (EUV) lithography process using light in EUV region, having a wavelength of, for example, about 1-100 nm. The patterned mask may then be used to protect regions of the substrate 110, and layers formed thereupon, while an etch process forms trenches 102 in unprotected regions through the HM layer 910, through the epitaxial stack 120, and into the substrate 110, thereby leaving the plurality of extending fins 130. The trenches 102 may be etched using a dry etch (e.g., reactive ion etching), a wet etch, and/or combination thereof. Numerous other embodiments of methods to form the fins on the substrate may also be used including, for example, defining the fin region (e.g., by mask or isolation regions) and epitaxially growing the epitaxial stack 120 in the form of the fins 130. The fins 130 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 130 by etching initial epitaxial stack 120. The etching process can include dry etching, wet etching, reactive ion etching (RIE), and/or other suitable processes.

Figure 3:
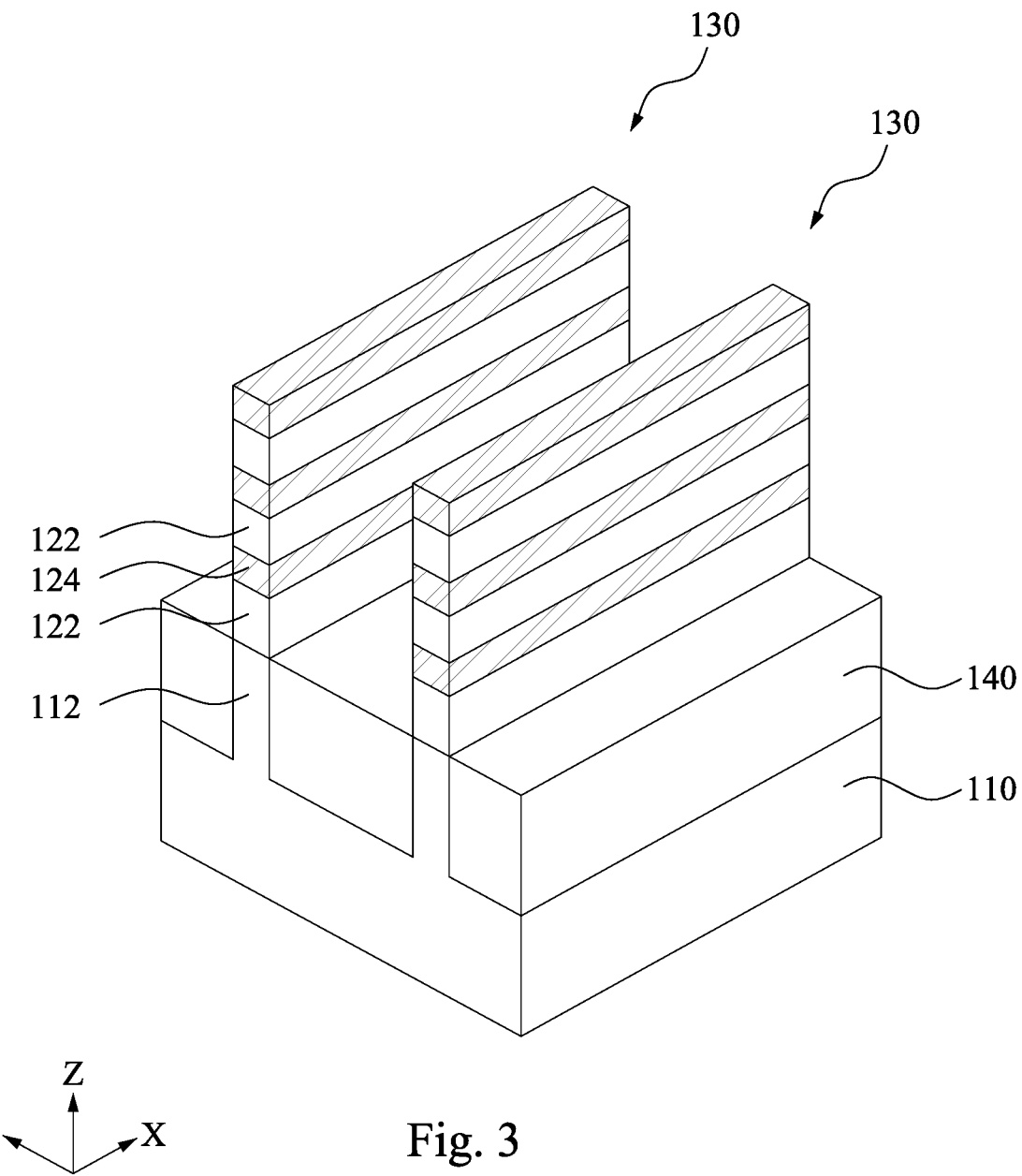

FIG. 3 illustrates a perspective view of formation of a shallow trench isolation (STI) structure 140 laterally surrounding lower portions of the fins 130. By way of example and not limitation, a dielectric layer is first deposited over the substrate 110, filling the trenches 102 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the integrated circuit structure 100 may be annealed, for example, to improve the quality of the dielectric layer. In some embodiments, the dielectric layer (and subsequently formed STI structure 140) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 910 (as illustrated FIG. 2) functions as a CMP stop layer. The STI structure 140 around the fins 130 is recessed. Referring to the example of FIG. 3, the STI structure 140 is recessed providing the fins 130 extending above the STI structure 140. In some embodiments, the recessing process may include a dry etching process, a wet etching process, and/or a combination thereof. The HM layer 910 may also be removed before, during, and/or after the recessing of the STI structure 140. The nitride layer 914 of the HM layer 910 may be removed, for example, by a wet etching process using $H_3PO_4$ or other suitable etchants. In some embodiments, the oxide layer 912 of the HM layer 910 is removed by the same etchant used to recess the STI structure 140. In some embodiments, a recessing depth is controlled (e.g., by controlling an etching time) so as to result in a desired height of the exposed upper portion of the fins 130. In the illustrated embodiment, the desired height exposes each of the layers of the epitaxial stack 120 in the fins 130.

Figure 4A:
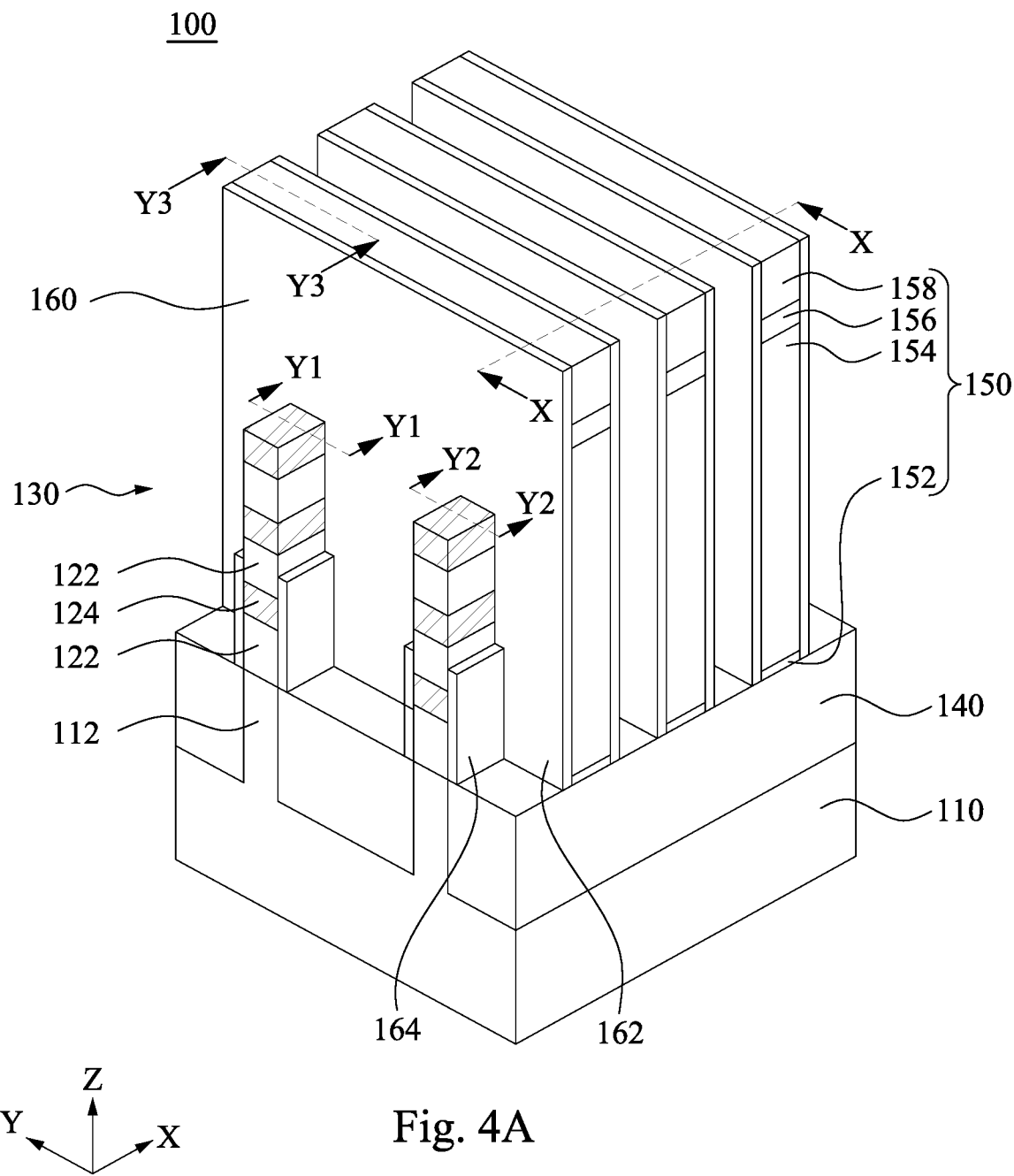
Figure 4B:
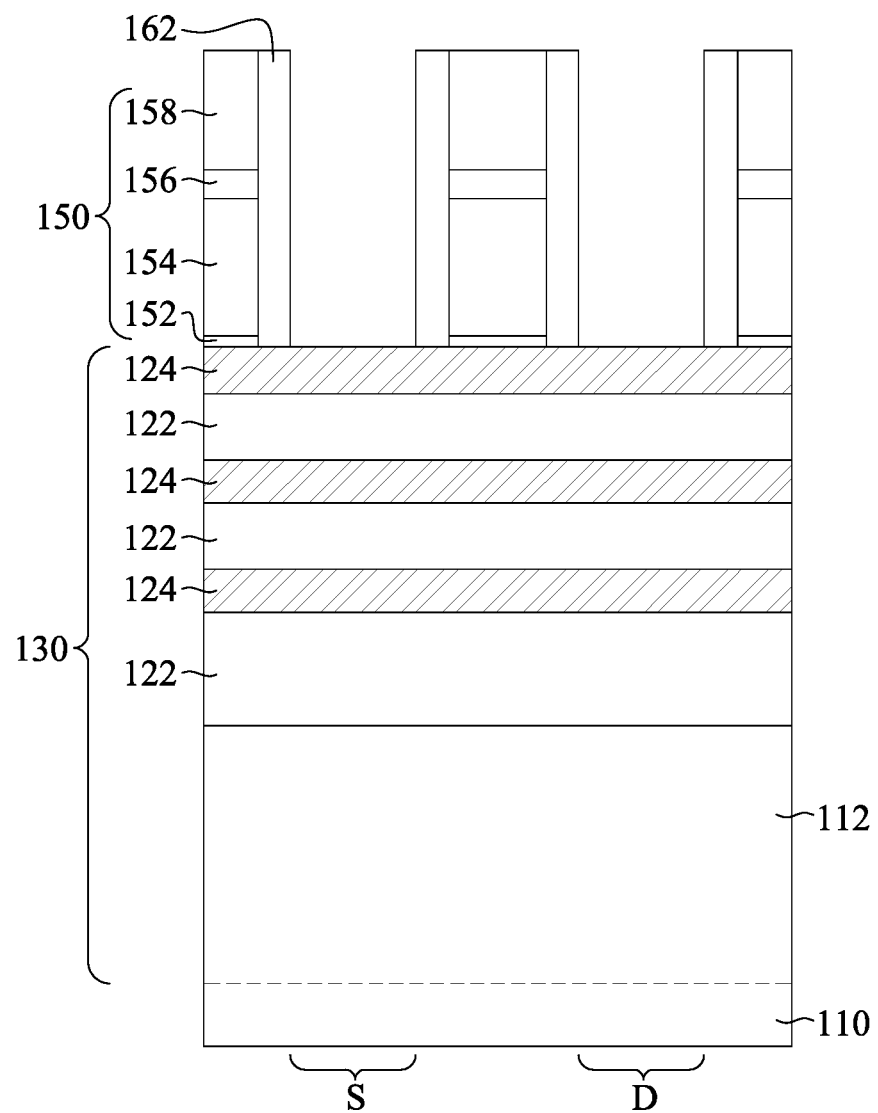

With reference to FIGS. 4A and 4B, a gate structure 150 is formed. In some embodiments, the gate structure 150 is a dummy (sacrificial) gate structure that is subsequently removed. Thus, in some embodiments using a gate-last process, the gate structure 150 is a dummy gate structure and will be replaced by the final gate structure at a subsequent processing stage of the integrated circuit structure 100. In particular, the dummy gate structure 150 may be replaced at a later processing stage by a high-k dielectric layer (HK) and metal gate electrode (MG) as discussed below. In some embodiments, the dummy gate structure 150 is formed over the substrate 110 and is at least partially disposed over the fins 130. The portion of the fins 130 underlying the dummy gate structure 150 may be referred to as the channel region. The dummy gate structure 150 may also define a source/drain (S/D) region of the fins 130, for example, the regions of the fin 130 adjacent and on opposing sides of the channel region.

In the illustrated embodiment, dummy gate fabrication first forms a dummy gate dielectric layer 152 over the fins 130. In some embodiments, the dummy gate dielectric layer 152 may include $SiO_2$, silicon nitride, a high-k dielectric material and/or other suitable material. In various examples, the dummy gate dielectric layer 152 may be deposited by a CVD process, a subatmospheric CVD (SACVD) process, a flowable CVD process, an ALD process, a PVD process, or other suitable process. By way of example, the dummy gate dielectric layer 152 may be used to prevent damages to the fins 130 by subsequent processes (e.g., subsequent formation of the dummy gate structure). Subsequently, other portions of the dummy gate structure 150 are formed, including a dummy gate electrode layer 154 and a hard mask that may include multiple layers 156 and 158 (e.g., an oxide layer 156 and a nitride layer 158). In some embodiments, the dummy gate structure 150 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate electrode layer 154 may include polycrystalline silicon (polysilicon). In some embodiments, the hard mask includes an oxide layer 156 such as a pad oxide layer that may include $SiO_2$, and a nitride layer 158 such as a pad nitride layer that may include $Si_3N_4$ and/or silicon oxynitride. In some embodiments, after patterning the dummy gate electrode layer 154, the dummy gate dielectric layer 152 is removed from the S/D regions of the fins 130. The etch process may include a wet etch, a dry etch, and/or a combination thereof. The etch process is chosen to selectively etch the dummy gate dielectric layer 152 without substantially etching the fins 130, the dummy gate electrode layer 154, the oxide layer 156 and the nitride layer 158.

FIGS. 4A and 4B also illustrate formation of gate spacers 162 on sidewalls of the dummy gate structures 150 and fin spacers 164 on sidewalls of the semiconductor fins 130. In some embodiments of formation of these spacers 162, 164, a spacer material layer 160 is first deposited on the substrate 110. The spacer material layer 160 may be a conformal layer that is subsequently etched to form gate sidewall spacers 162 and fin sidewall spacers 164. In the illustrated embodiment, a spacer material layer 160 is disposed conformally on top and sidewalls of the dummy gate structures 150 and the fins 130. In some embodiments, the spacer material layer 160 includes multiple layers, such as a first spacer layer and a second spacer layer formed over the first spacer layer. The spacer material layer 160 may include one or more dielectric materials such as silicon oxide, silicon nitride, silicon carbide, silicon oxynitride, SiCN films, silicon oxycarbide, SiOCN films, and/or combinations thereof. By way of example, the spacer material layer 160 may be formed by depositing a dielectric material over the gate structure 150 using processes such as, CVD process, a subatmospheric CVD (SACVD) process, a flowable CVD process, an ALD process, a PVD process, or other suitable process. An anisotropic etching process is then performed on the deposited spacer material layer 160 to expose portions of the fins 130 not covered by the dummy gate structure 150 (e.g., in source/drain regions of the fins 130). Portions of the spacer material layer 160 directly above the dummy gate structure 150 may be completely removed by this anisotropic etching process. Portions of the spacer material layer 160 on sidewalls of the dummy gate structure 150 remain to serve as gate spacers 162, and portions of the spacer material layer 160 on lower portions of sidewalls of the semiconductor fins 130 remain to serve as fin spacers 164.

Figure 5A:
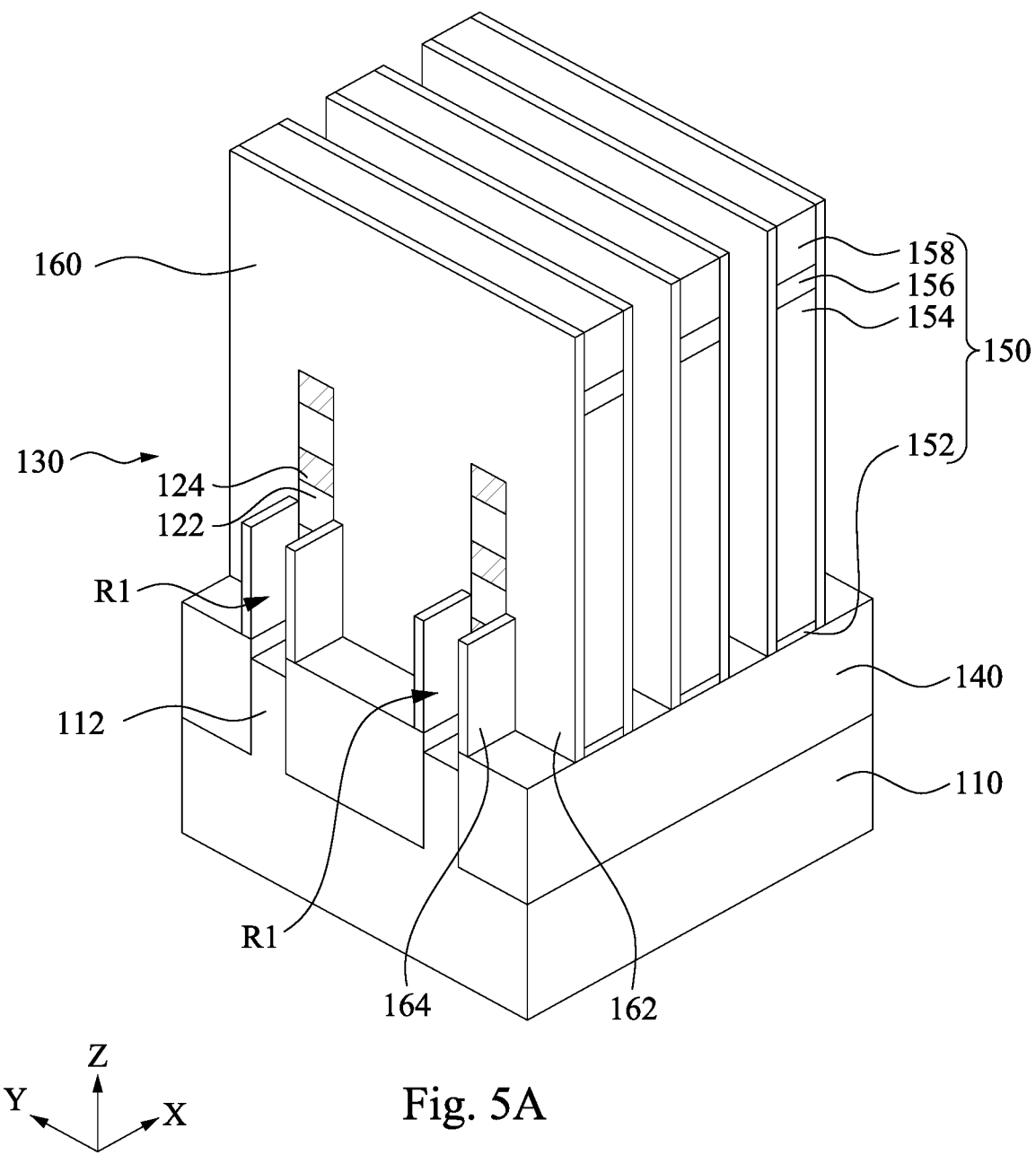
Figure 5B:
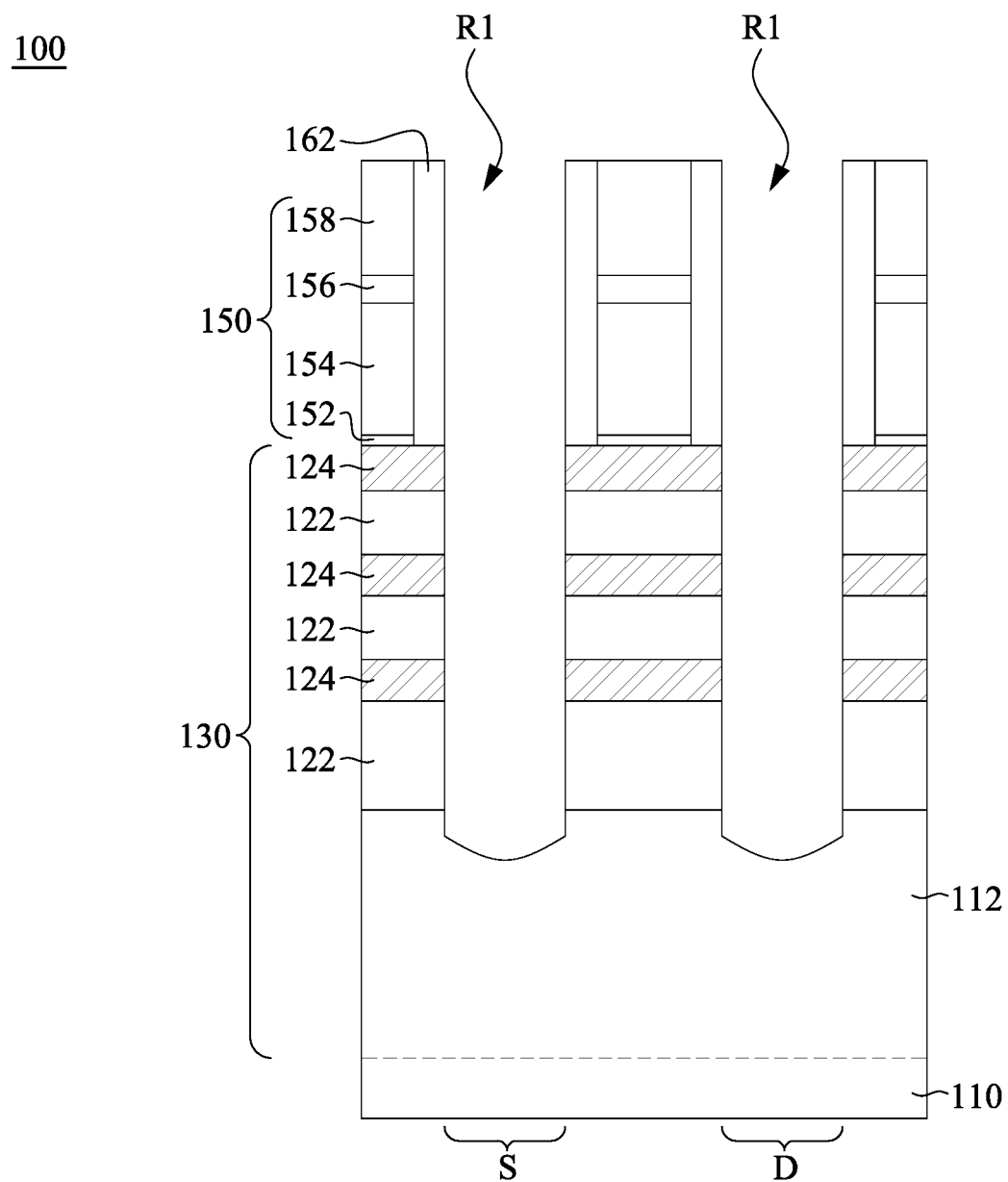

With reference to FIGS. 5A and 5B, exposed portions of the semiconductor fins 130 that extend laterally beyond the gate spacers 162 (e.g., in source/drain regions of the fins 130) are etched by using, for example, an anisotropic etching process that uses the dummy gate structure 150 and the gate spacers 162 as an etch mask, resulting in recesses R1 into the semiconductor fins 130 and between corresponding dummy gate structures 150. After the anisotropic etching, end surfaces of the sacrificial layers 122 and channel layers 124 are aligned with respective outermost sidewalls of the gate spacers 162, due to the anisotropic etching. In some embodiments, the anisotropic etching may be performed by a dry chemical etch with a plasma source and a reaction gas. The plasma source may be an inductively coupled plasma (ICR) source, a transformer coupled plasma (TCP) source, an electron cyclotron resonance (ECR) source or the like, and the reaction gas may be, for example, a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 6A:
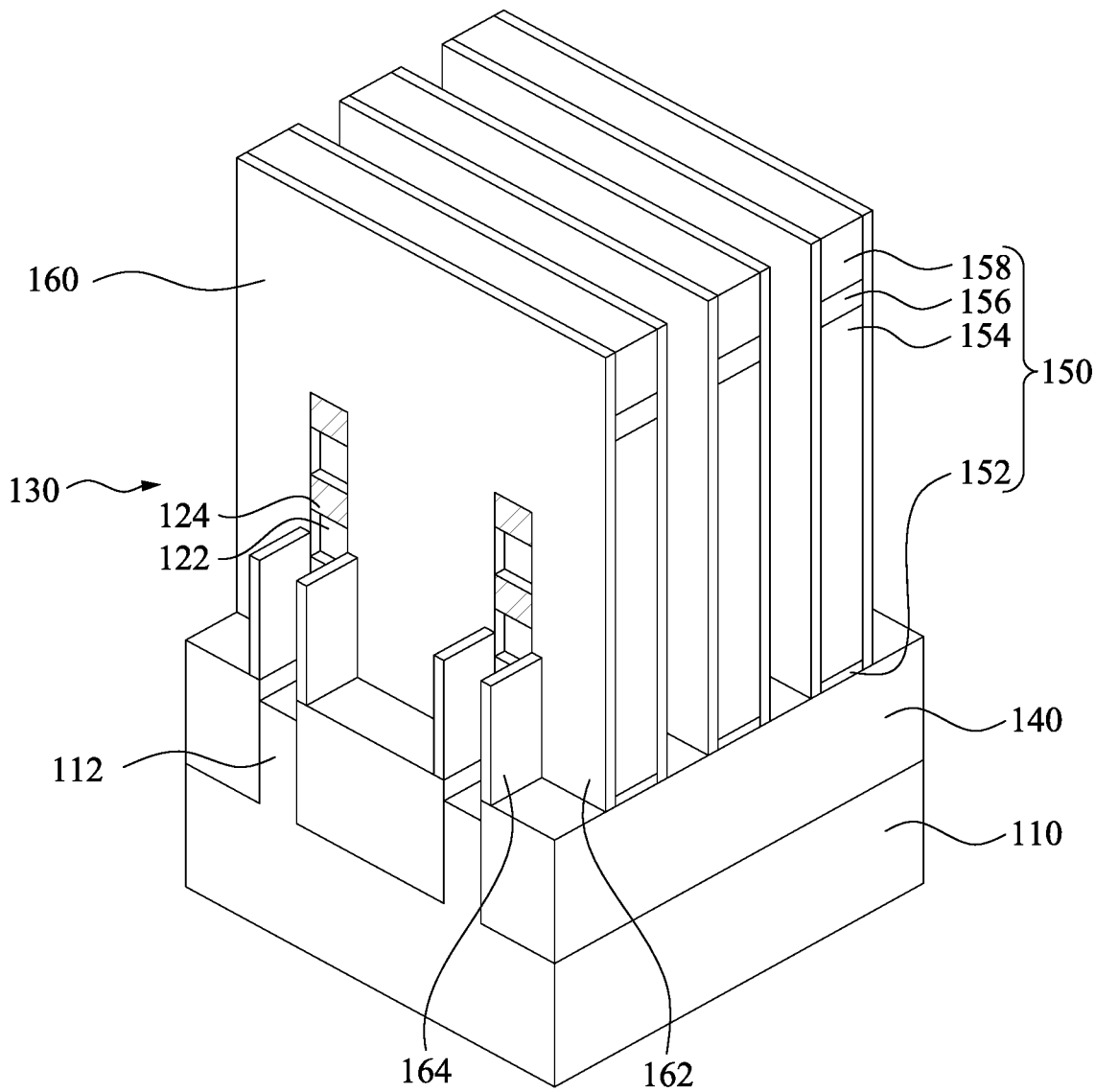
Figure 6B:
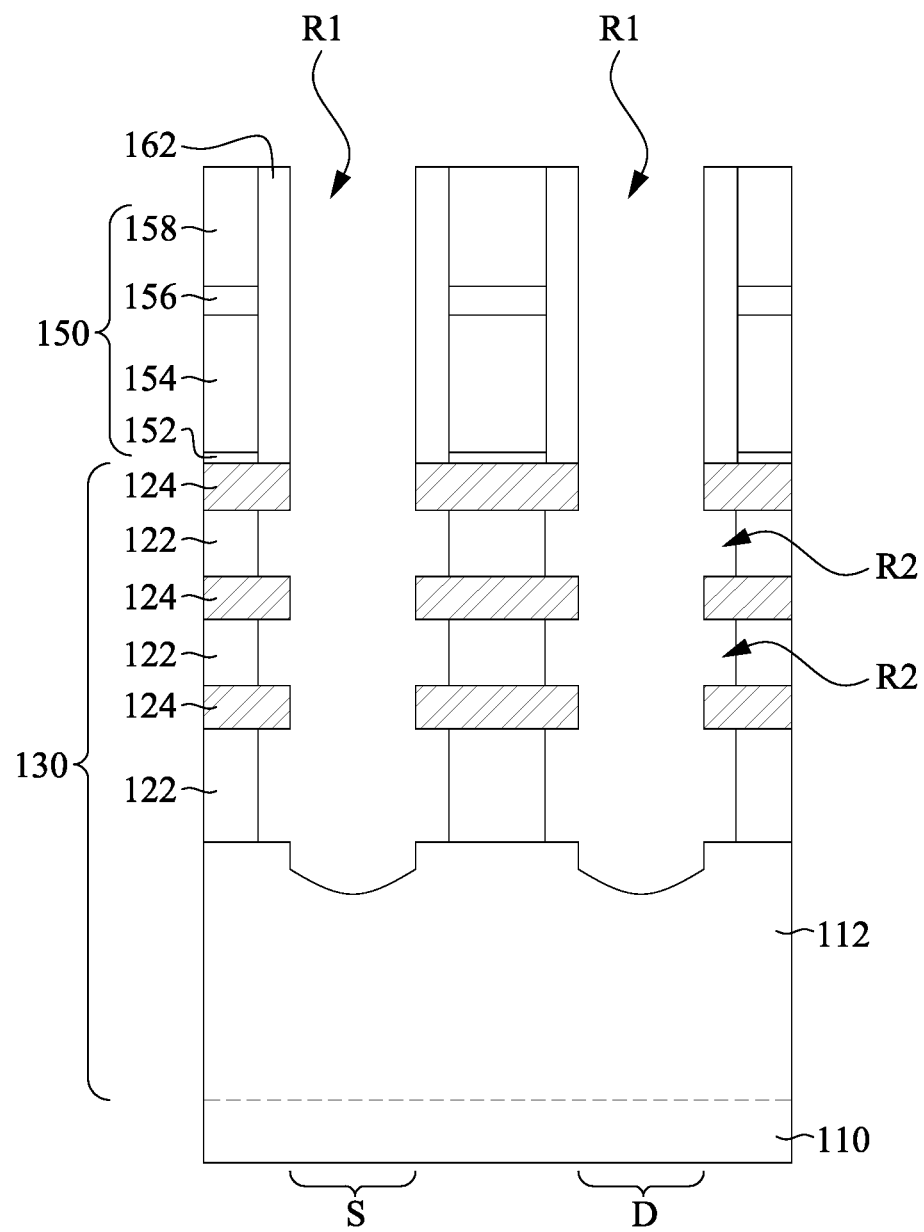

Next, referring to FIGS. 6A and 6B, the sacrificial layers 122 are laterally or horizontally recessed by using suitable etch techniques, resulting in lateral recesses R2 each vertically between corresponding channel layers 124. This step may be performed by using a selective etching process. By way of example and not limitation, the sacrificial layers 122 are SiGe and the channel layers 124 are silicon allowing for the selective etching of the sacrificial layers 122. In some embodiments, the selective wet etching includes an APM etch (e.g., ammonia hydroxide-hydrogen peroxide-water mixture) that etches SiGe at a faster etch rate than it etches Si. In some embodiments, the selective etching includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 remain substantially intact during laterally recessing the sacrificial layers 122. As a result, the channel layers 124 laterally extend past opposite end surfaces of the sacrificial layers 122.

Figure 7A:
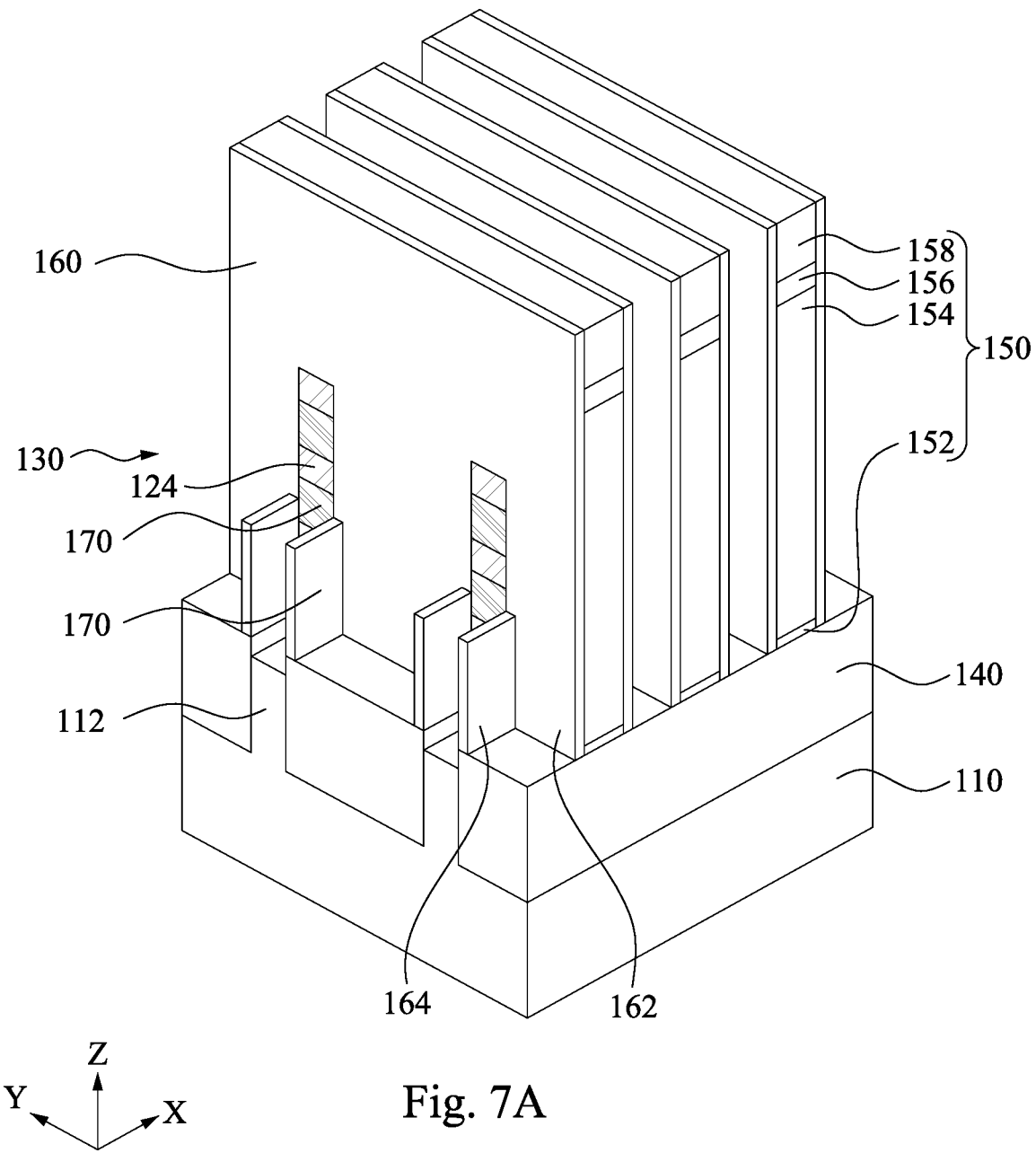
Figure 7B:
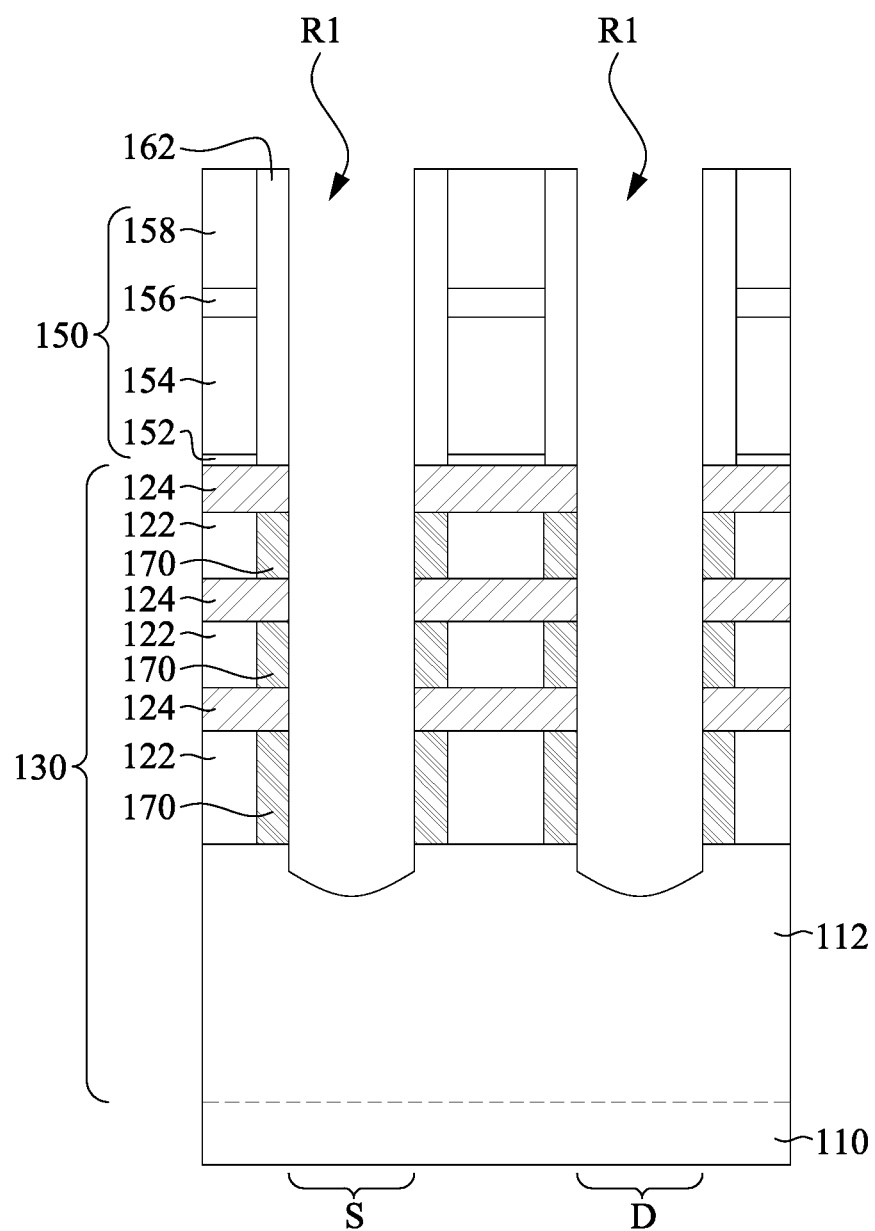

Next, as illustrated in FIGS. 7A and 7B, an inner spacer material layer 170 is formed to fill the recesses R2 left by the lateral etching of the sacrificial layers 122 discussed above with reference to FIGS. 6A and 6B. The inner spacer material layer 170 may be a low-K dielectric material, such as $SiO_2$, SiN, SiCN, or SiOCN, and may be formed by a suitable deposition method, such as ALD. After the deposition of the inner spacer material layer 170, an anisotropic etching process may be performed to trim the deposited inner spacer material 170, such that only portions of the deposited inner spacer material 170 that fill the recesses R2 left by the lateral etching of the sacrificial layers 122 are left. After the trimming process, the remaining portions of the deposited inner spacer material are denoted as inner spacers 170, for the sake of simplicity. The inner spacers 170 serve to isolate metal gates from source/drain epitaxial structures formed in subsequent processing. In the example of FIGS. 7A and 7B, sidewalls of the inner spacers 170 are aligned with sidewalls of the channel layers 124.

Figure 8:
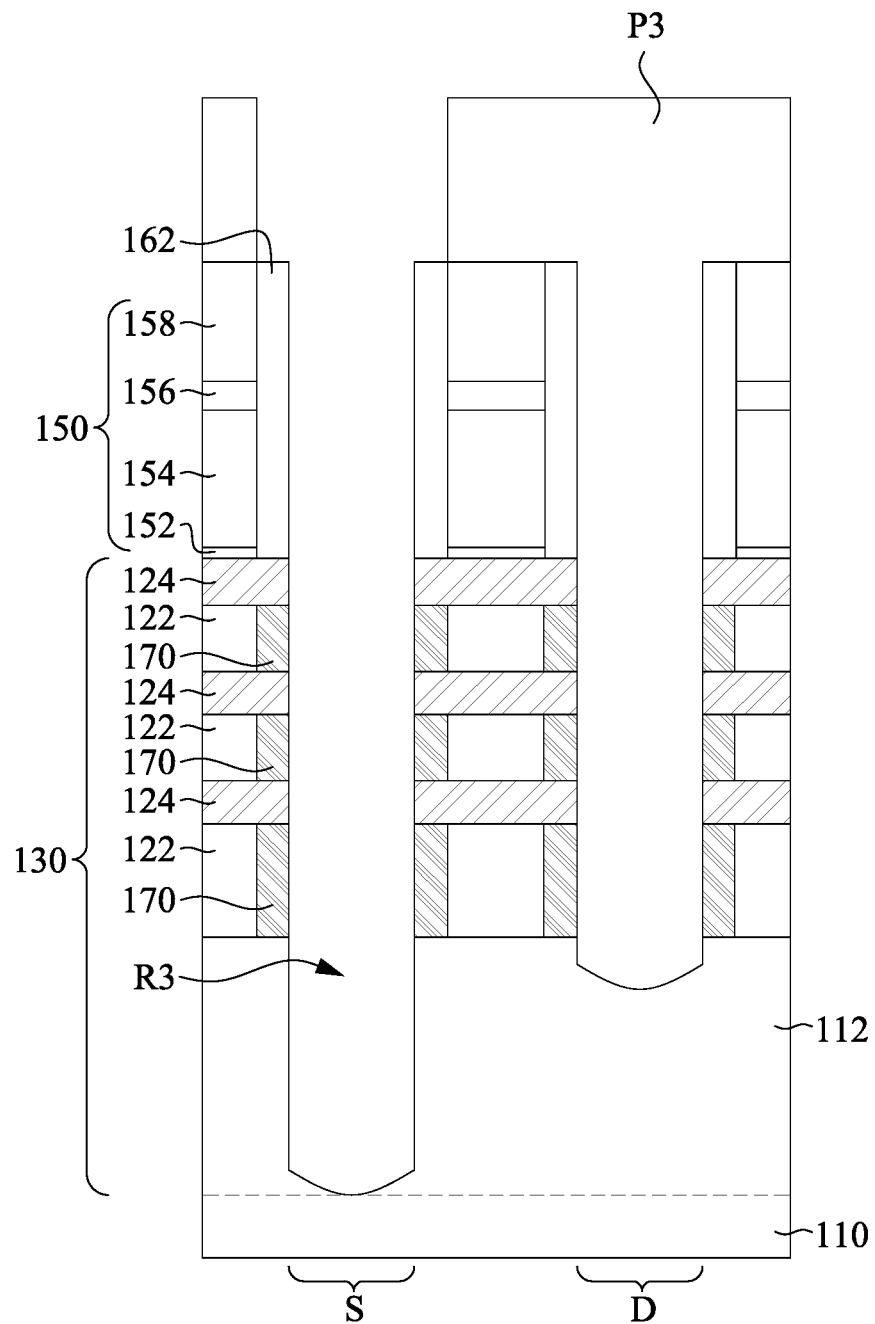

In some embodiments, with reference to FIG. 8, source regions S of fins 130 are further recessed, so that sacrificial epitaxial plugs can be subsequently formed in the recessed source regions S and then replaced with backside vias in subsequent processing. In some embodiments of source region recessing step, a patterned mask P3 is first formed to cover drain regions D of fins 130 but not cover the source regions S of fins 130, and then the source regions S of the fins 130 are recessed, resulting in source-region recesses R3 in the fins 130. In some embodiments, the patterned mask P3 may be a photoresist mask formed by suitable photolithography process. For example, the photolithography process may include spin-on coating a photoresist layer over the structure as illustrated in FIGS. 7A and 7B, performing post-exposure bake processes, and developing the photoresist layer to form the patterned mask P3. In some embodiments, patterning the resist to form the patterned mask element may be performed using an electron beam (e-beam) lithography process or an extreme ultraviolet (EUV) lithography process.

Once the patterned mask P3 is formed, the source-region recesses R3 can be formed in the source regions S using, for example, an anisotropic etching process. In some embodiments, the anisotropic etching may be performed by a dry chemical etch with a plasma source and a reaction gas. By way of example and not limitation, the plasma source may be an inductively coupled plasma (ICR) source, a transformer coupled plasma (TCP) source, an electron cyclotron resonance (ECR) source or the like, and the reaction gas may be a fluorine-based gas (such as $SF_6$, $CH_2F_2$, $CH_3F$, $CHF_3$, or the like), chloride-based gas (e.g., $Cl_2$), hydrogen bromide gas (HBr), oxygen gas ($O_2$), the like, or combinations thereof.

Figure 9:
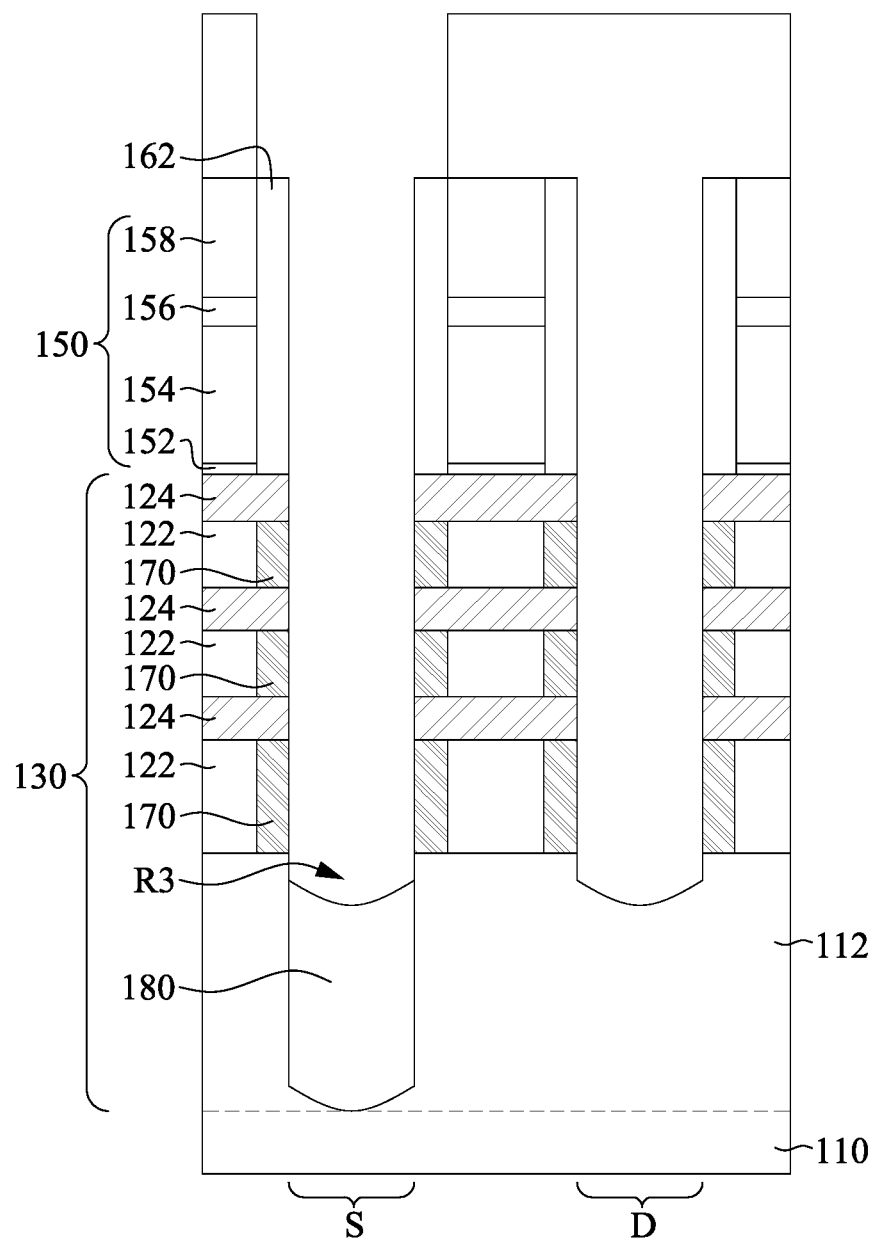

FIG. 9 illustrates formation of a sacrificial epitaxial plug 180 in a source-region recess R3. In some embodiments of this step, with the patterned mask P3 in place, an epitaxial growth process is performed to grow an epitaxial material in the source-region recess R3 until the epitaxial material builds up a sacrificial epitaxial plug 180 filling the source-region recess R3. The epitaxial material has a different composition than the substrate 110, thus resulting in different etch selectivity between the sacrificial epitaxial plug 180 and the substrate 110. For example, the substrate 110 is Si and the sacrificial epitaxial plug 180 is SiGe. In some embodiments, the sacrificial epitaxial plug 180 is SiGe free from p-type dopants (e.g., boron) and n-type dopants (e.g., phosphorous), because the sacrificial epitaxial plug 180 will be removed in subsequent processing and not serve as a source terminal of a transistor in a final IC product. Once formation of the sacrificial epitaxial plug 180 is complete, the patterned mask P3 is removed by, for example, ashing.

In order to prevent SiGe from being inadvertently formed on end surfaces of the Si channel layers 124, the SiGe plug 180 can be grown in a bottom-up fashion, in accordance with some embodiments of the present disclosure. By way of example and not limitation, the SiGe plug 180 can be grown by an epitaxial deposition/partial etch process, which repeats the epitaxial deposition/partial etch process at least once. Such repeated deposition/partial etch process is also called a cyclic deposition-etch (CDE) process. In some embodiments, the SiGe plug 180 is grown by selective epitaxial growth (SEG), where an etching gas is added to promote the selective growth of silicon germanium from the bottom surface of the source-region recess R3 that has a first crystal plane, but not from the vertical end surfaces of the channel layers 124 that have a second crystal plane different from the first crystal plane. For example, the SiGe plug 180 is epitaxially grown using reaction gases such as HCl as an etching gas, $GeH_4$ as a Ge precursor gas, DCS and/or $SiH_4$ as a Si precursor gas, $H_2$ and/or $N_2$ as a carrier gas. In some embodiments, the etching gas may be other chlorine-containing gases or bromine-containing gases such as $Cl_2$, $BCl_3$, $BiCl_3$, $BiBr_3$ or the like.

SiGe deposition conditions are controlled (e.g., by tuning flow rate ratio among Ge precursor gas, Si precursor gas and carrier gas) in such a way that SiGe growth rate on the bottom surface of the source-region recess R3 is faster than SiGe growth rate on the vertical end surfaces of the channel layers 124, because the bottom surface of the source-region recess R3 and the vertical end surfaces of the channel layers 124 have different crystal orientation planes. Accordingly, the SiGe deposition step incorporating the etching step promotes bottom-up SiGe growth. For example, SiGe is grown from the bottom surface of the source-region recess R3 at a faster rate than that from the end surfaces of the channel layers 124. The etching gas etches SiGe grown from the end surfaces of the channel layers 124 as well as SiGe grown from the bottom surface of the source-region recess R3 at comparable etch rates. However, since the SiGe growth rate from the bottom surface of the source-region recess R3 is faster than from the end surfaces of the channel layers 124, the net effect is that SiGe will substantially grow from the bottom surface of source-region recess R3 in the bottom-up fashion. By way of example and not limitation, in each deposition-etch cycle of the CDE process, the etching step stops once the end surfaces of the channel layers 124 are exposed, and the SiGe grown from the bottom surface of the source-region recess R3 remains in the source-region recess R3 because it is thicker than the SiGe grown from the end surfaces of the channel layers 124. In this way, the bottom-up growth can be realized. The CDE process as discussed above is merely one example to explain how to form SiGe plug 180 in source-region recess R3 but absent from end surfaces of Si channel layers 124, and other suitable techniques may also be used to form the SiGe plug 180.

Figure 10A:
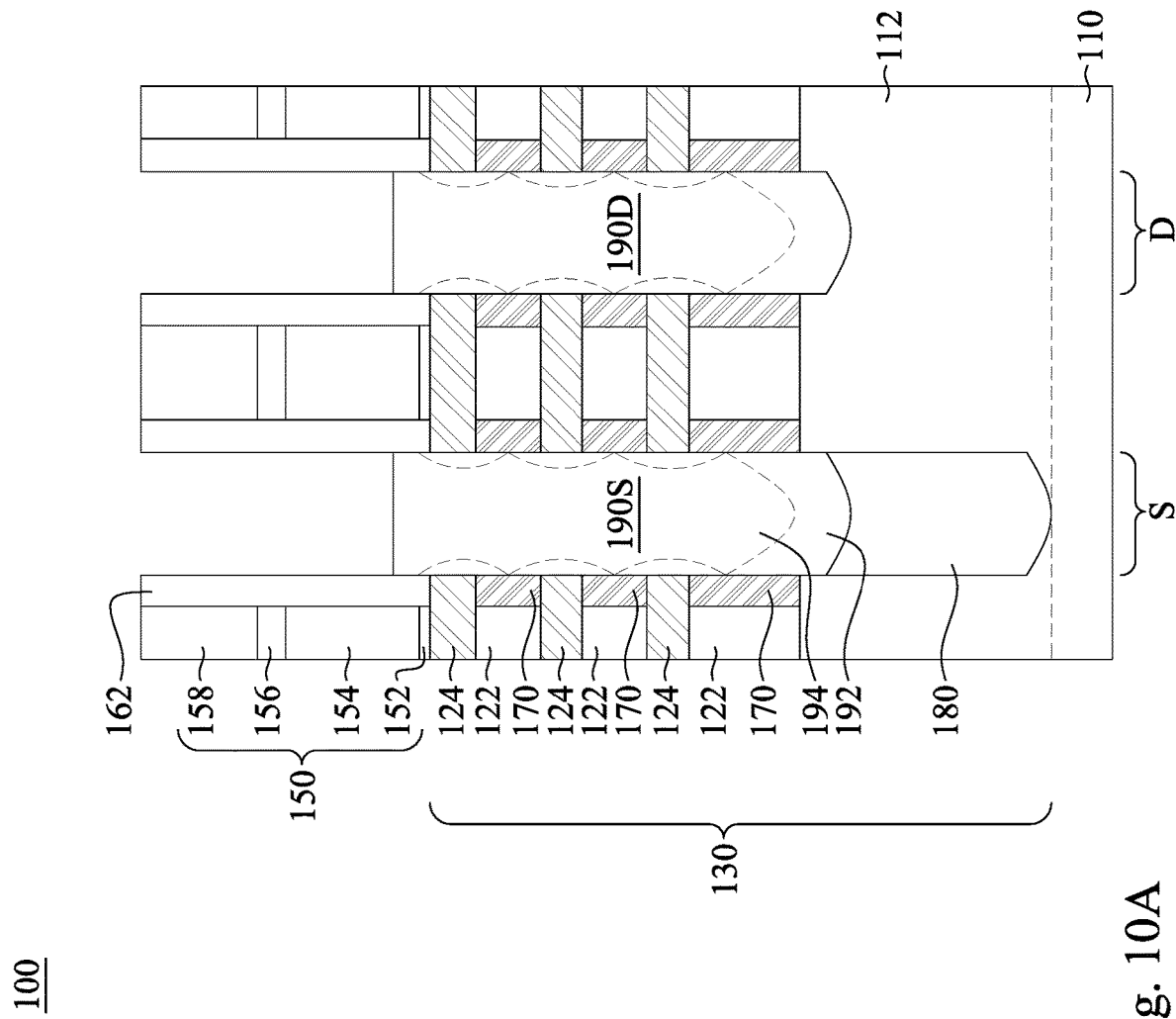
Figure 10C:
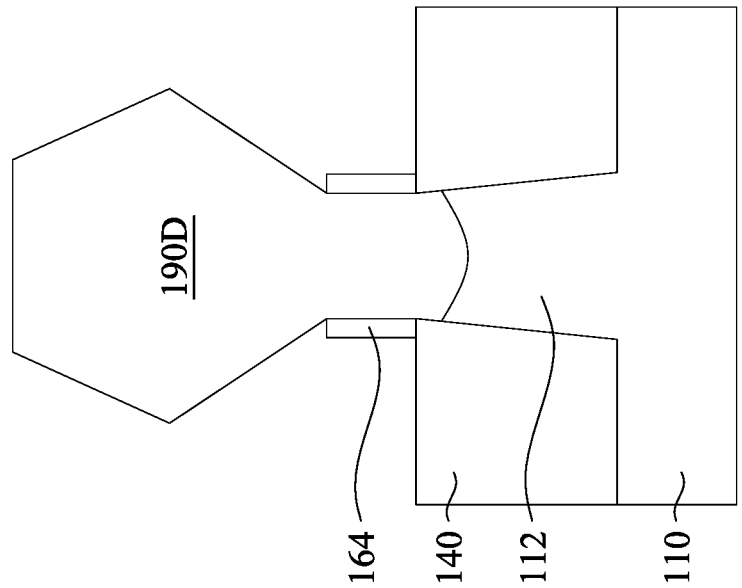
Figure 10B:
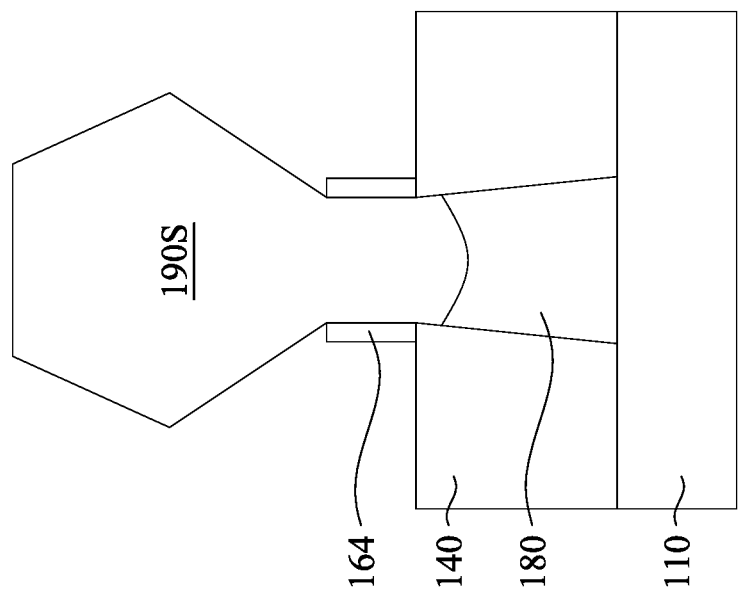

FIGS. 10A-10C illustrate formation of source/drain epitaxial structures 190S/190D. In greater detail, the source epitaxial structure 190S is formed over the sacrificial epitaxial plug 180 in the recessed source region S of the fin 130, and drain epitaxial structure 190D is formed over the drain region D of the fin 130. The source/drain epitaxial structures 190S/190D may be formed by performing an epitaxial growth process that provides an epitaxial material on the sacrificial epitaxial plug 180 and the fin 130. During the epitaxial growth process, the dummy gate structures 150 and gate sidewall spacers 162 limit the source/drain epitaxial structures 190S/190D to the source/drain regions S/D. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the fins 130, the sacrificial epitaxial plug 180 and the channel layers 124.

In some embodiments, the source/drain epitaxial structures 190S/190D may include Ge, Si, GaAs, AlGaAs, SiGe, GaAsP, SiP, or other suitable material. The source/drain epitaxial structures 190S/190D may be in-situ doped during the epitaxial process by introducing doping species including: p-type dopants, such as boron or $BF_2$; n-type dopants, such as phosphorus or arsenic; and/or other suitable dopants including combinations thereof. If the source/drain epitaxial structures 190S/190D are not in-situ doped, an implantation process (i.e., a junction implant process) is performed to dope the source/drain epitaxial structures 190S/190D. In some exemplary embodiments, the source/drain epitaxial structures 190S/190D in an NFET device include SiP, while those in a PFET device include GeSnB and/or SiGeSnB.

In some embodiments, the source/drain epitaxial structures 190S/190D each include a first epitaxial layer 192 and a second epitaxial layer 194 over the first epitaxial layer 192. The first and second epitaxial layers 192 and 194 may be different at least in germanium atomic percentage (Ge %) or phosphorus concentration (P %). In the depicted embodiment, the first epitaxial layer 192 may be not only grown from top surfaces of the sacrificial epitaxial plugs 180 and the fins 130, but also grown from end surfaces of the channel layers 124. This is because formation of the source/drain epitaxial structures 190S/190D does not require the bottom-up approach as discussed previously with respect to sacrificial epitaxial plug 180.

In some embodiments where the source/drain epitaxial structures 190S/190D include GeSnB and/or SiGeSnB for forming PFETs, the first and second epitaxial layers 192 and 194 are different at least in germanium atomic percentage (Ge %). In certain embodiments, the first SiGe layer 192 has a lower germanium atomic percentage than the second SiGe layer 194. Low germanium atomic percentage in the first SiGe layer 192 may help in reducing Schottky barrier with the un-doped Si in the fins 130. High germanium atomic percentage in the second SiGe layer 194 may help in reducing source/drain contact resistance. By way of example and not limitation, the germanium atomic percentage in the first SiGe layer 192 is in a range from about 10% to about 20%, and the germanium atomic percentage in the second SiGe layer 194 is in a range from about 20% to about 60%, but other ranges are within the scope of various embodiments of the present disclosure. In some embodiments, the second SiGe layer 194 may have a gradient germanium atomic percentage. For example, the germanium atomic percentage in the second SiGe layer 194 increases as a distance from the first SiGe layer 192 increases.

In some embodiments where the source/drain epitaxial structures 190S/190D include SiP for forming NFETs, the first and second SiP layers 192 and 194 are different at least in phosphorous concentration (P %). In certain embodiments, the first SiP layer 192 has a lower phosphorous concentration than the second SiP layer 194. Low phosphorous concentration in the first SiP layer 192 may help in reducing Schottky barrier with the un-doped Si in the fins 130. High phosphorous concentration in the second SiP layer 194 may help in reducing source/drain contact resistance. By way of example and not limitation, the phosphorous concentration in the first SiP layer 192 is in a range from about 5 E19 $cm^{-3}$ to about 1 E21 $cm^{-3}$, and the phosphorous concentration in the second SiP layer 194 is in a range from about 1 E21 $cm^{-3}$ to about 3 E21 $cm^{-3}$, but other ranges are within the scope of various embodiments of the present disclosure. In some embodiments, the second SiP layer 194 may have a gradient phosphorous concentration. For example, the phosphorous concentration in the second SiP layer 194 increases as a distance from the first SiP layer 192 increases.

Once the source/drain epitaxial structures 190S/190D are formed, an annealing process can be performed to activate the p-type dopants or n-type dopants in the source/drain epitaxial structures 190S/190D. The annealing process may be, for example, a rapid thermal anneal (RTA), a laser anneal, a millisecond thermal annealing (MSA) process or the like.

Figure 11A:
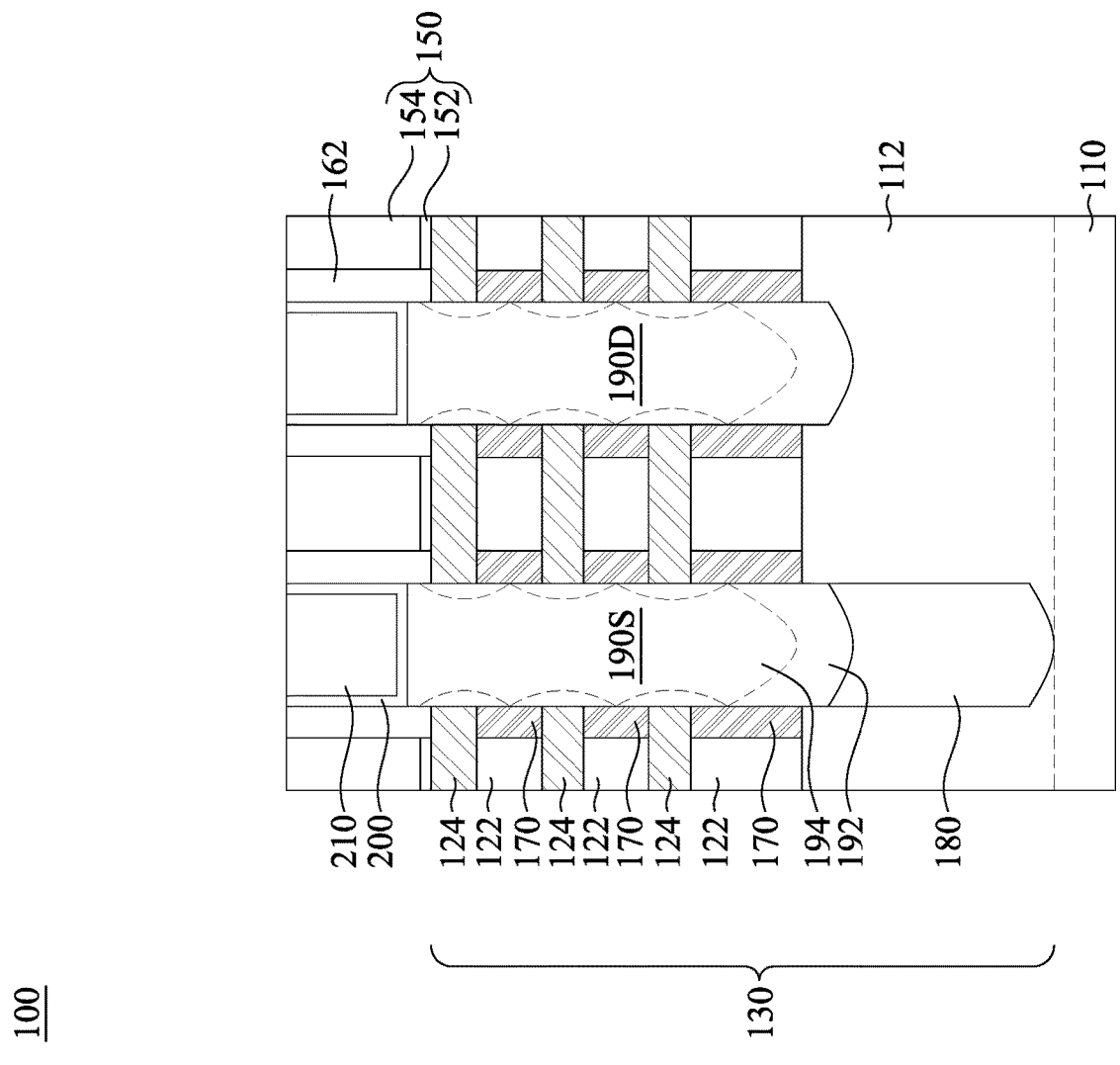
Figure 11C:
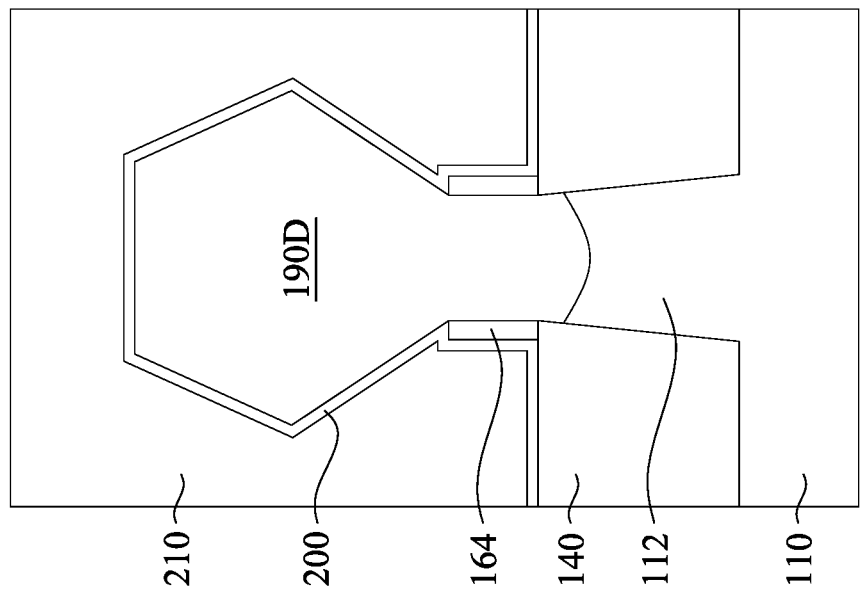
Figure 11B:
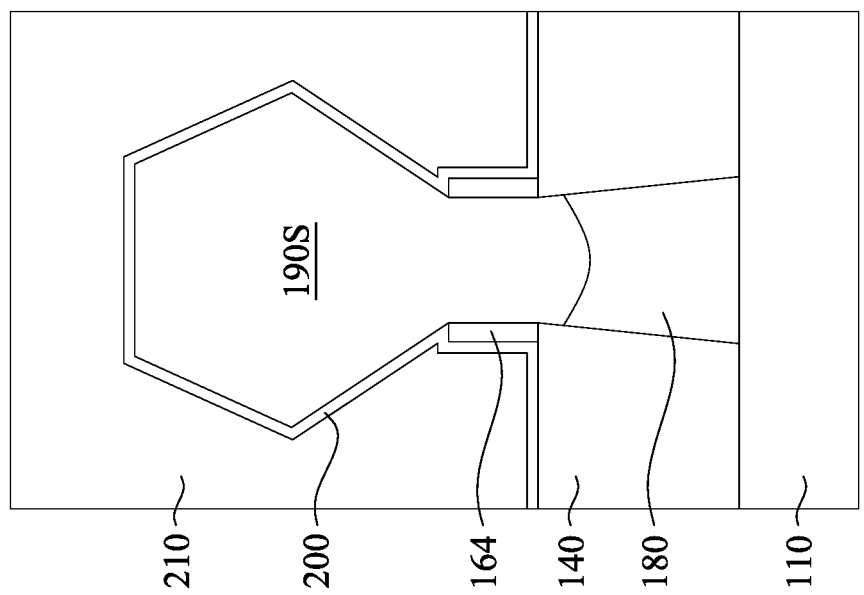

FIGS. 11A-11C illustrate formation of a front-side interlayer dielectric (ILD) layer 210 over the substrate 110. The ILD layer 210 is referred to a "front-side" ILD layer in this context because it is formed on a front-side of the multi-gate transistors (e.g., a side of the multi-gate transistors where gates protrude from source/drain regions 190S/190D). In some embodiments, a contact etch stop layer (CESL) 200 is also formed prior to forming the ILD layer 210. In some examples, the CESL includes a silicon nitride layer, silicon oxide layer, a silicon oxynitride layer, and/or other suitable materials having a different etch selectivity than the front-side ILD layer 210. The CESL may be formed by plasma-enhanced chemical vapor deposition (PECVD) process and/or other suitable deposition or oxidation processes. In some embodiments, the front-side ILD layer 210 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials having a different etch selectivity than the CESL 200. The front-side ILD layer 210 may be deposited by a PECVD process or other suitable deposition technique. In some embodiments, after formation of the front-side ILD layer 210, the integrated circuit structure 100 may be subject to a high thermal budget process to anneal the front-side ILD layer 210.

In some examples, after depositing the front-side ILD layer 210, a planarization process may be performed to remove excessive materials of the front-side ILD layer 210. For example, a planarization process includes a chemical mechanical planarization (CMP) process which removes portions of the front-side ILD layer 210 (and CESL layer, if present) overlying the dummy gate structures 150 and planarizes a top surface of the integrated circuit structure 100. In some embodiments, the CMP process also removes hard mask layers 156, 158 (as shown in FIG. 11A) and exposes the dummy gate electrode layer 154.

Next, the dummy gate structures 150 are removed, followed by removing the sacrificial layers 122. The resulting structure is illustrated in FIG. 12. In the illustrated embodiments, the dummy gate structures 150 are removed by using a selective etching process (e.g., selective dry etching, selective wet etching, or a combination thereof) that etches the materials in dummy gate structures 150 at a faster etch rate than it etches other materials (e.g., gate sidewall spacers 162, CESL 200 and/or front-side ILD layer 210), thus resulting in gate trenches GT1 between corresponding gate sidewall spacers 162, with the sacrificial layers 122 exposed in the gate trenches GT1. Subsequently, the sacrificial layers 122 in the gate trenches GT1 are exposed by using another selective etching process that etches the sacrificial layers 122 at a faster etch rate than it etches the channel layers 124, thus forming openings O1 between neighboring channel layers 124. In this way, the channel layers 124 become nanostructures suspended over the substrate 110 and between the source/drain epitaxial structures 190S/190D. This step is also called a channel release process. At this interim processing step, the openings 119 between nanostructures 124 may be filled with ambient environment conditions (e.g., air, nitrogen, etc). In some embodiments, the nanostructures 124 can be interchangeably referred to as nanowires, nanosheets, nanoslabs and nanorings, depending on their geometry. For example, in some other embodiments the channel layers 124 may be trimmed to have a substantial rounded shape (e.g., cylindrical) due to the selective etching process for completely removing the sacrificial layers 122. In that case, the resultant channel layers 124 can be called nanowires.

In some embodiments, the sacrificial layers 122 are removed by using a selective wet etching process. In some embodiments, the sacrificial layers 122 are SiGe and the channel layers 124 are silicon allowing for the selective removal of the sacrificial layers 122. In some embodiments, the selective wet etching includes an APM etch (e.g., ammonia hydroxide-hydrogen peroxide-water mixture). In some embodiments, the selective removal includes SiGe oxidation followed by a $SiGeO_x$ removal. For example, the oxidation may be provided by $O_3$ clean and then $SiGeO_x$ removed by an etchant such as $NH_4OH$ that selectively etches $SiGeO_x$ at a faster etch rate than it etches Si. Moreover, because oxidation rate of Si is much lower (sometimes 30 times lower) than oxidation rate of SiGe, the channel layers 124 may remain substantially intact during the channel release process. In some embodiments, both the channel release step and the previous step of laterally recessing sacrificial layers (i.e., the step as illustrated in FIGS. 6A and 6B) use a selective etching process that etches SiGe at a faster etch rate than etching Si, and therefore these two steps may use the same etchant chemistry in some embodiments. In this case, the etching time/duration of channel release step is longer than the etching time/duration of the previous step of laterally recessing sacrificial layers, so as to completely remove the sacrificial SiGe layers.

Figure 13A:
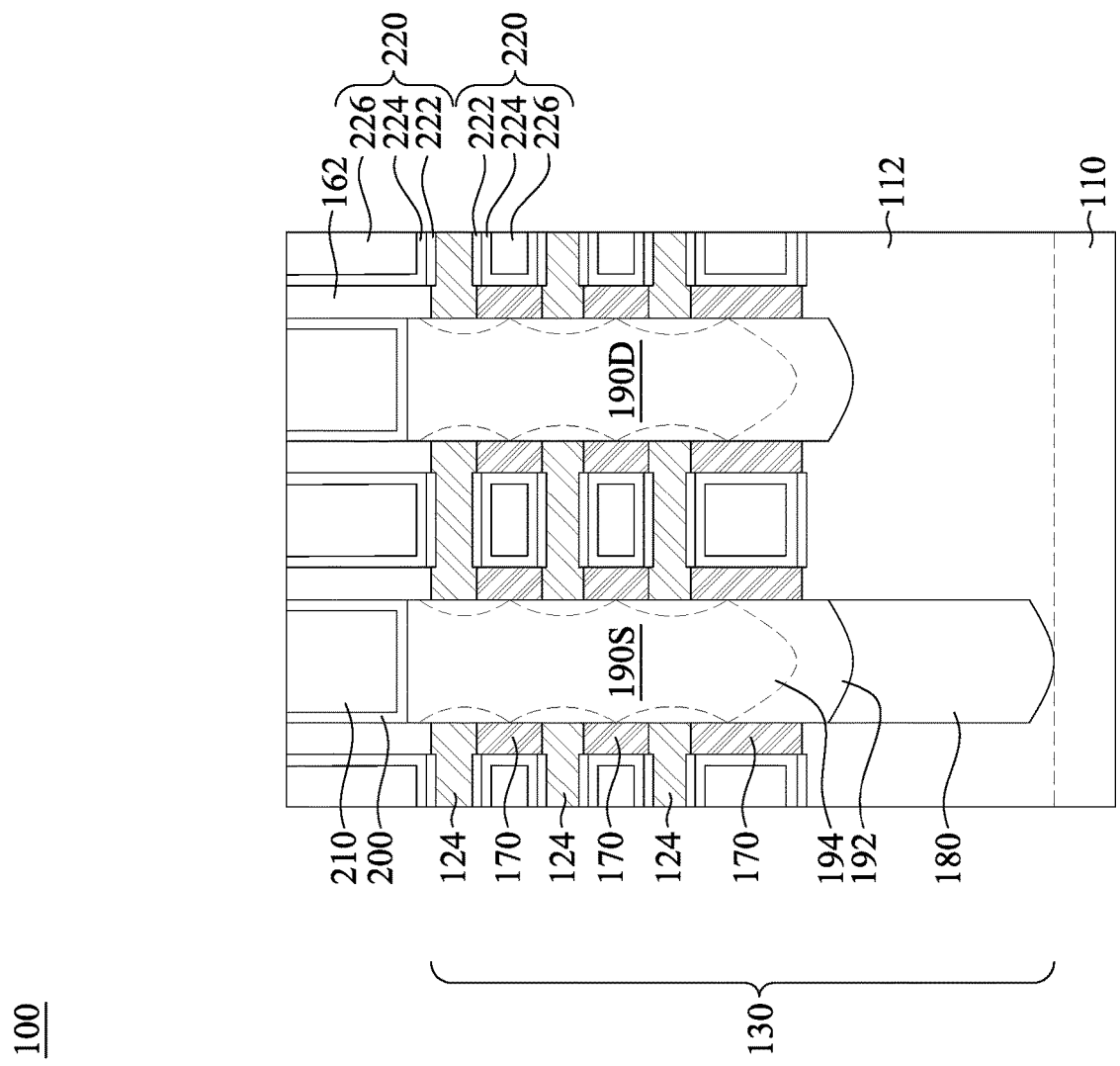
Figure 13B:
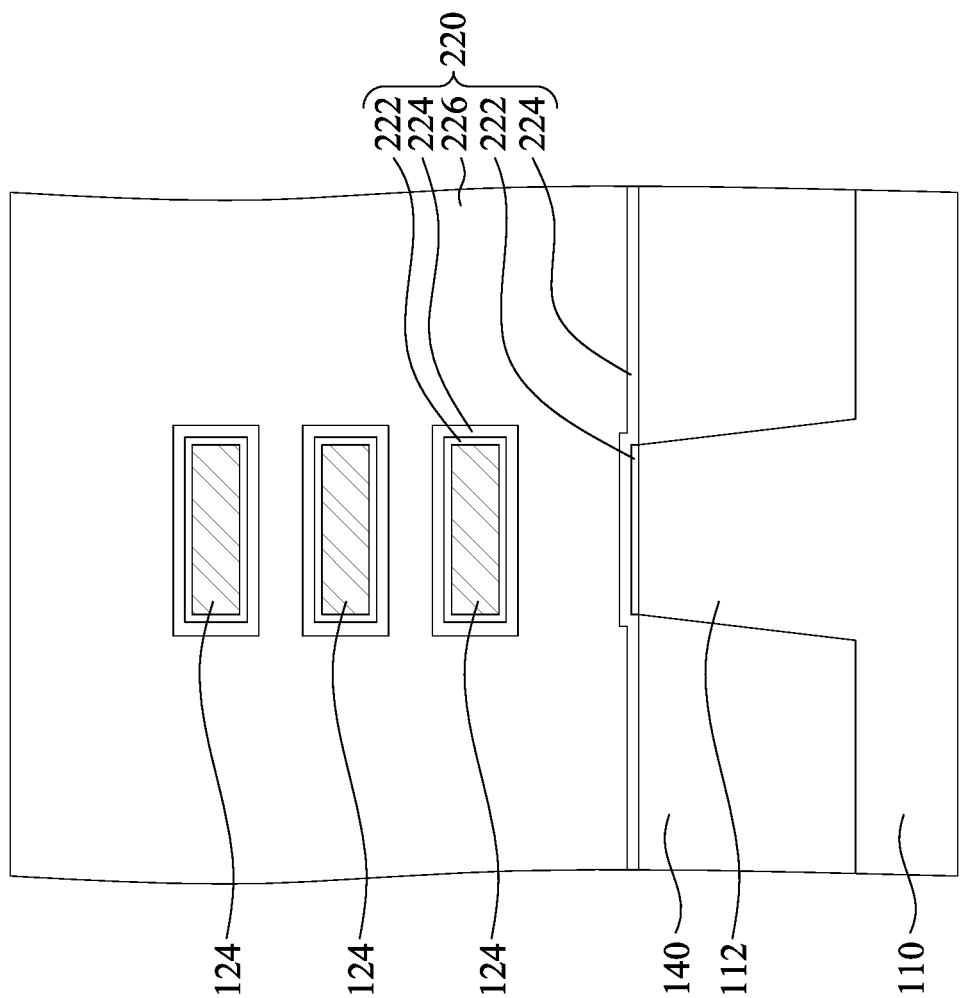
FIG. 13B is a cross-sectional view of an intermediate stage of fabricating the integrated circuit structure along a fourth cut, which is in the gate region and perpendicular to the lengthwise direction of channels.

FIGS. 13A and 13B illustrate formation of replacement gate structures 220. The replacement gate structures 220 are respectively formed in the gate trenches GT1 to surround each of the nanostructures 124 suspended in the gate trenches GT1. The gate structure 220 may be the final gate of a GAA FET. The final gate structure may be a high-k/metal gate stack, however other compositions are possible. In some embodiments, each of the gate structures 220 forms the gate associated with the multi-channels provided by the plurality of nanostructures 124. For example, high-k/metal gate structures 220 are formed within the openings O1 (as illustrated in FIG. 12) provided by the release of nanostructures 124. In various embodiments, the high-k/metal gate structure 220 includes a interfacial layer 222 formed around the nanostructures 124, a high-k gate dielectric layer 224 formed around the interfacial layer 222, and a gate metal layer 226 formed around the high-k gate dielectric layer 224 and filling a remainder of gate trenches GT1. Formation of the high-k/metal gate structures 220 may include one or more deposition processes to form various gate materials, followed by a CMP processes to remove excessive gate materials, resulting in the high-k/metal gate structures 220 having top surfaces level with a top surface of the front-side ILD layer 210. As illustrated in a cross-sectional view of FIG. 13B that is taken along a longitudinal axis of a high-k/metal gate structure 220, the high-k/metal gate structure 220 surrounds each of the nanostructures 124, and thus is referred to as a gate of a GAA FET.

In some embodiments, the interfacial layer 222 is silicon oxide formed on exposed surfaces of semiconductor materials in the gate trenches GT1 by using, for example, thermal oxidation, chemical oxidation, wet oxidation or the like. As a result, surface portions of the nanostructures 124 and the substrate portion 112 exposed in the gate trenches GT1 are oxidized into silicon oxide to form interfacial layer 222. Therefore, remaining portions of the nanostructures 124 in the gate trenches GT1 are thinner than other portions of the nanostructures 124 not in the gate trenches GT1, as illustrated in FIG. 13A.

In some embodiments, the high-k gate dielectric layer 224 includes dielectric materials having a high dielectric constant, for example, greater than that of thermal silicon oxide (~3.9). For example, the high-k gate dielectric layer 224 may include hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), lanthanum oxide (LaO), zirconium oxide (ZrO), titanium oxide (TiO), tantalum oxide ($Ta_2O_5$), yttrium oxide ($Y_2O_3$), strontium titanium oxide ($SrTiO_3$, STO), barium titanium oxide ($BaTiO_3$, BTO), barium zirconium oxide (BaZrO), hafnium lanthanum oxide (HfLaO), lanthanum silicon oxide (LaSiO), aluminum silicon oxide (AlSiO), aluminum oxide ($Al_2O_3$), silicon nitride ($Si_3N_4$), oxynitrides (SiON), the like, or combinations thereof.

In some embodiments, the gate metal layer 226 includes one or more metal layers. For example, the gate metal layer 226 may include one or more work function metal layers stacked one over another and a fill metal filling up a remainder of gate trenches GT1. The one or more work function metal layers in the gate metal layer 226 provide a suitable work function for the high-k/metal gate structures 220. For an n-type GAA FET, the gate metal layer 226 may include one or more n-type work function metal (N-metal) layers. The n-type work function metal may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials. On the other hand, for a p-type GAA FET, the gate metal layer 226 may include one or more p-type work function metal (P-metal) layers. The p-type work function metal may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials. In some embodiments, the fill metal in the gate metal layer 226 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials.

Figure 14A:
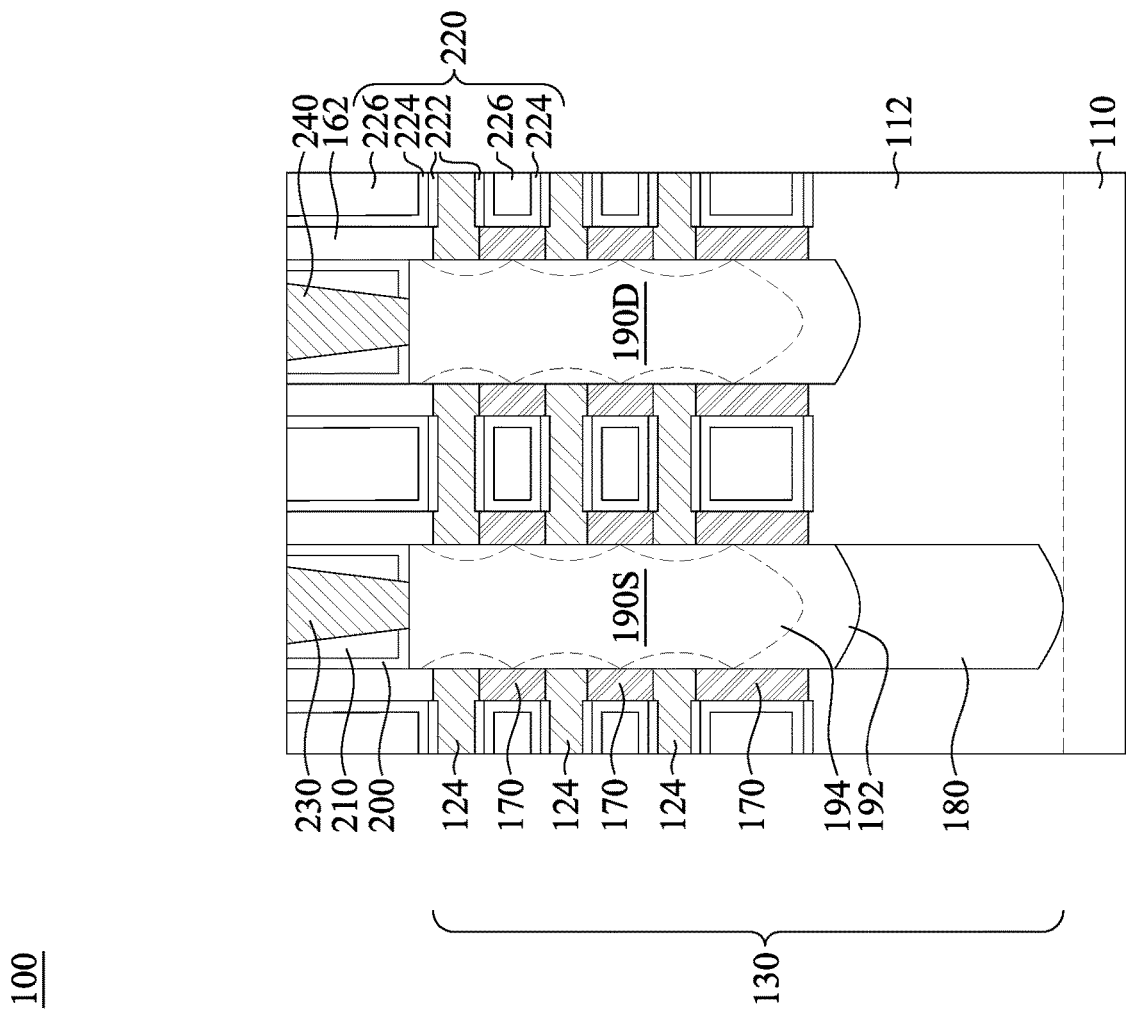
Figure 14C:
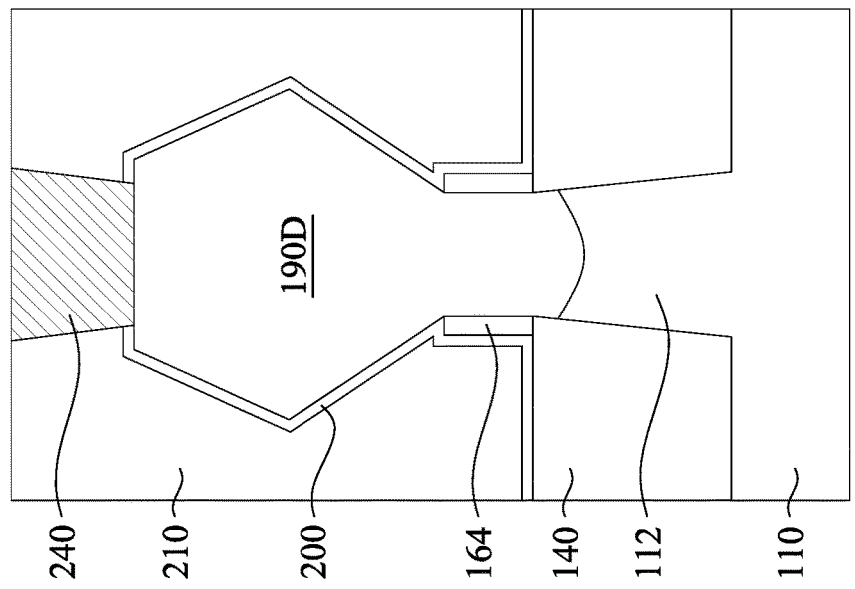
Figure 14B:
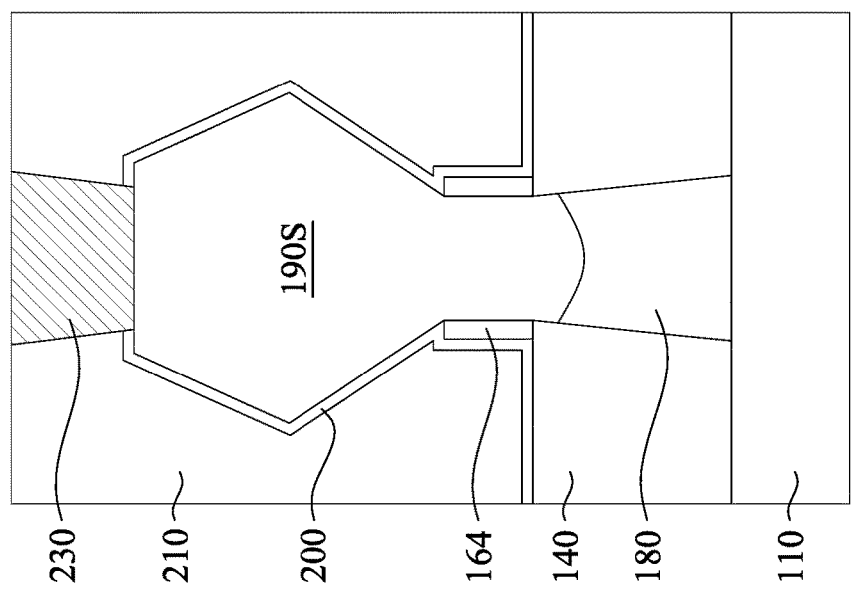

FIGS. 14A-14C illustrate formation of a source contact 230 over the source epitaxial structure 190S and a drain contact 240 over the drain epitaxial structure 190D. In some embodiments, this step first forms source/drain contact openings through the front-side ILD layer 210 and the CESL 200 to expose the source/drain epitaxial structures 190S/190D by using suitable photolithography and etching techniques. Subsequently, source/drain contact formation step deposits one or more metal materials (e.g., tungsten, cobalt, copper, the like or combinations thereof) to fill the source/drain contact openings by using suitable deposition techniques (e.g., CVD, PVD, ALD, the like or combinations thereof), followed by a CMP process to remove excess metal materials outside the source/drain contact openings, while leaving metal materials in the source/drain contact openings to serve as the source/drain contacts 230 and 240.

Figure 15A:
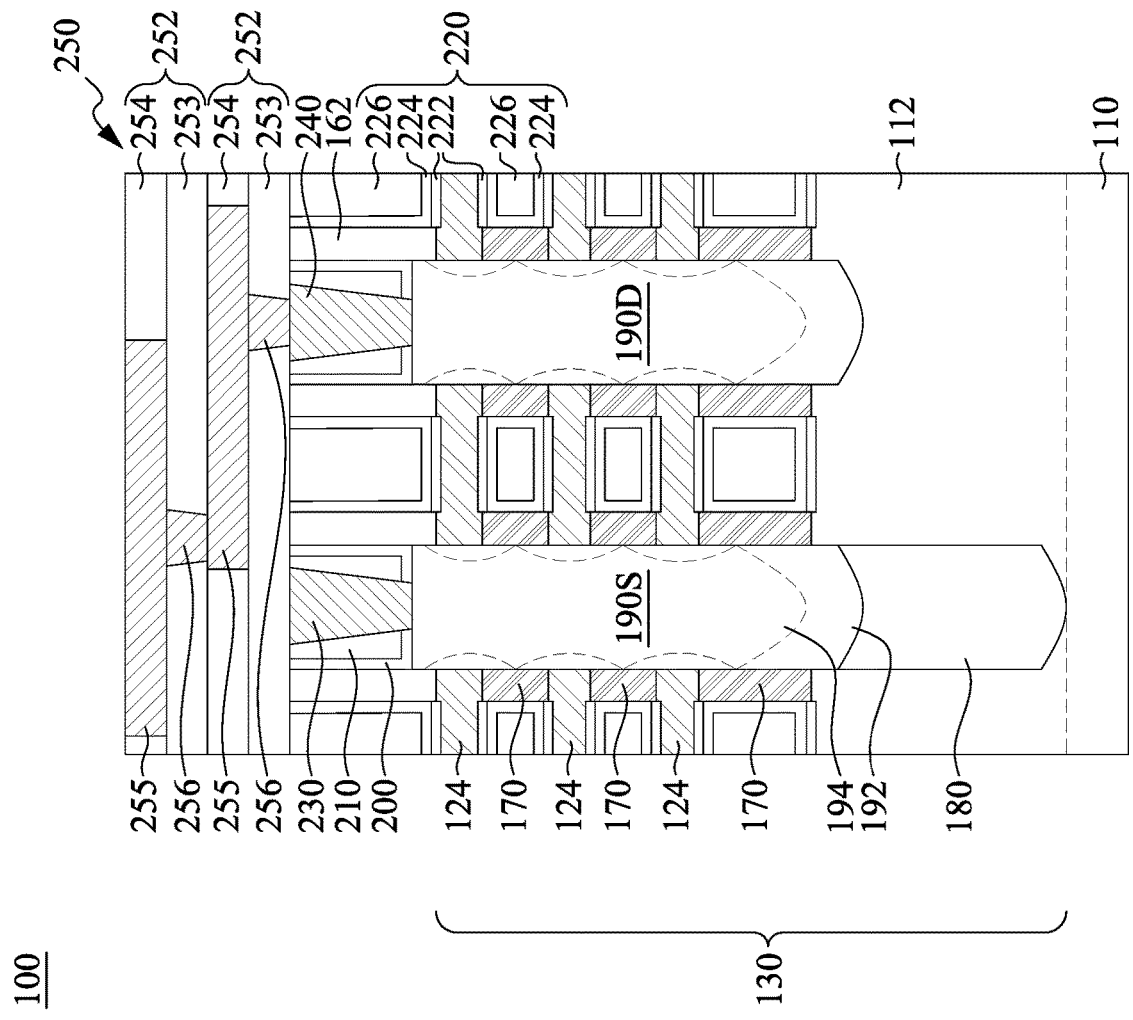
Figure 15C:
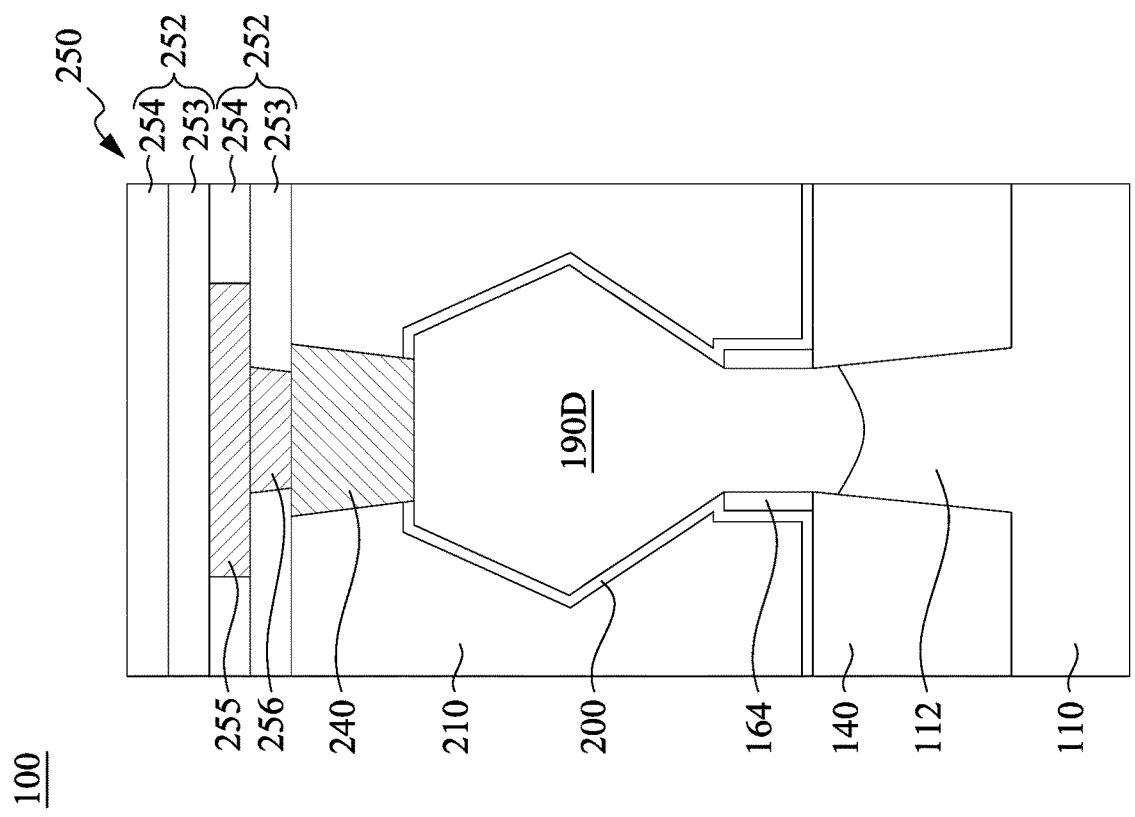
Figure 15B:
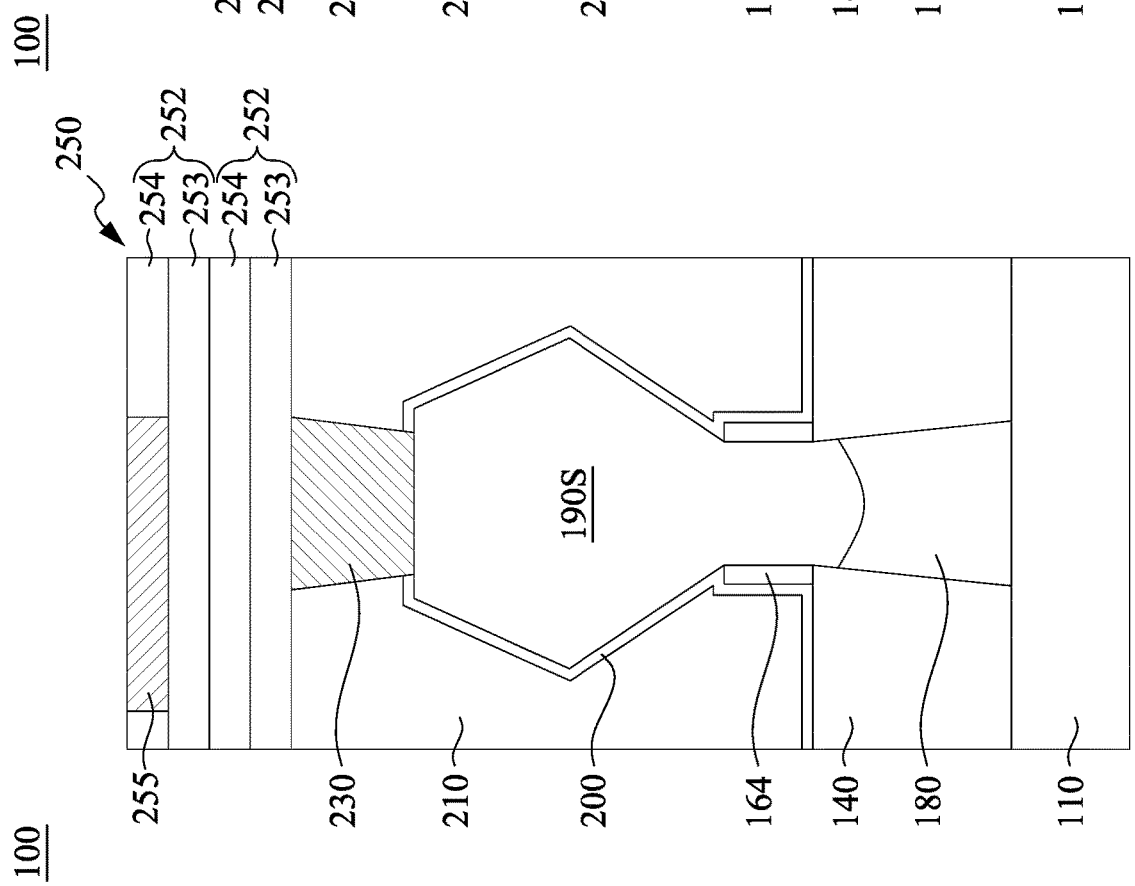

FIGS. 15A-15C illustrate formation of a front-side multilayer interconnection (MLI) structure 250 over the substrate 110. The front-side MLI structure 250 may include a plurality of front-side metallization layers 252. The number of front-side metallization layers 252 may vary according to design specifications of the integrated circuit structure 100. Only two front-side metallization layers 252 are illustrated in FIGS. 15A-15C for the sake of simplicity. The front-side metallization layers 252 each comprise a first front-side inter-metal dielectric (IMD) layer 253 and a second front-side IMD layer 254. The second front-side IMD layers 254 are formed over the corresponding first front-side IMD layers 253. The front-side metallization layers 252 comprise one or more horizontal interconnects, such as front-side metal lines 255, respectively extending horizontally or laterally in the second front-side IMD layers 254 and vertical interconnects, such as front-side metal vias 256, respectively extending vertically in the first front-side IMD layers 253.

In some embodiments, a front-side metal via 256 in a bottommost front-side metallization layer 252 is in contact with the drain contact 240 to make electrical connection to the drain epitaxial structure 190D. In some embodiments, no metal via in the bottommost front-side metallization layer 252 is in contact with the source contact 230. Instead, the source epitaxial structure 190S will be electrically connected to a subsequently formed backside via.

The front-side metal lines 255 and front-side metal vias 256 can be formed using, for example, a single damascene process, a dual damascene process, the like, or combinations thereof. In some embodiments, the front-side IMD layers 253-254 may include low-k dielectric materials having k values, for example, lower than about 4.0 or even 2.0 disposed between such conductive features. In some embodiments, the front-side IMD layers 253-254 may be made of, for example, phosphosilicate glass (PSG), borophosphosilicate glass (BPSG), fluorosilicate glass (FSG), $SiO_xC_y$, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The front-side metal lines and vias 255 and 256 may comprise metal materials such as copper, aluminum, tungsten, combinations thereof, or the like. In some embodiments, the front-side metal lines and vias 255 and 256 may further comprise one or more barrier/adhesion layers (not shown) to protect the respective front-side IMD layers 253-254 from metal diffusion (e.g., copper diffusion) and metallic poisoning. The one or more barrier/adhesion layers may comprise titanium, titanium nitride, tantalum, tantalum nitride, or the like, and may be formed using physical vapor deposition (PVD), CVD, ALD, or the like.

Figure 16A:
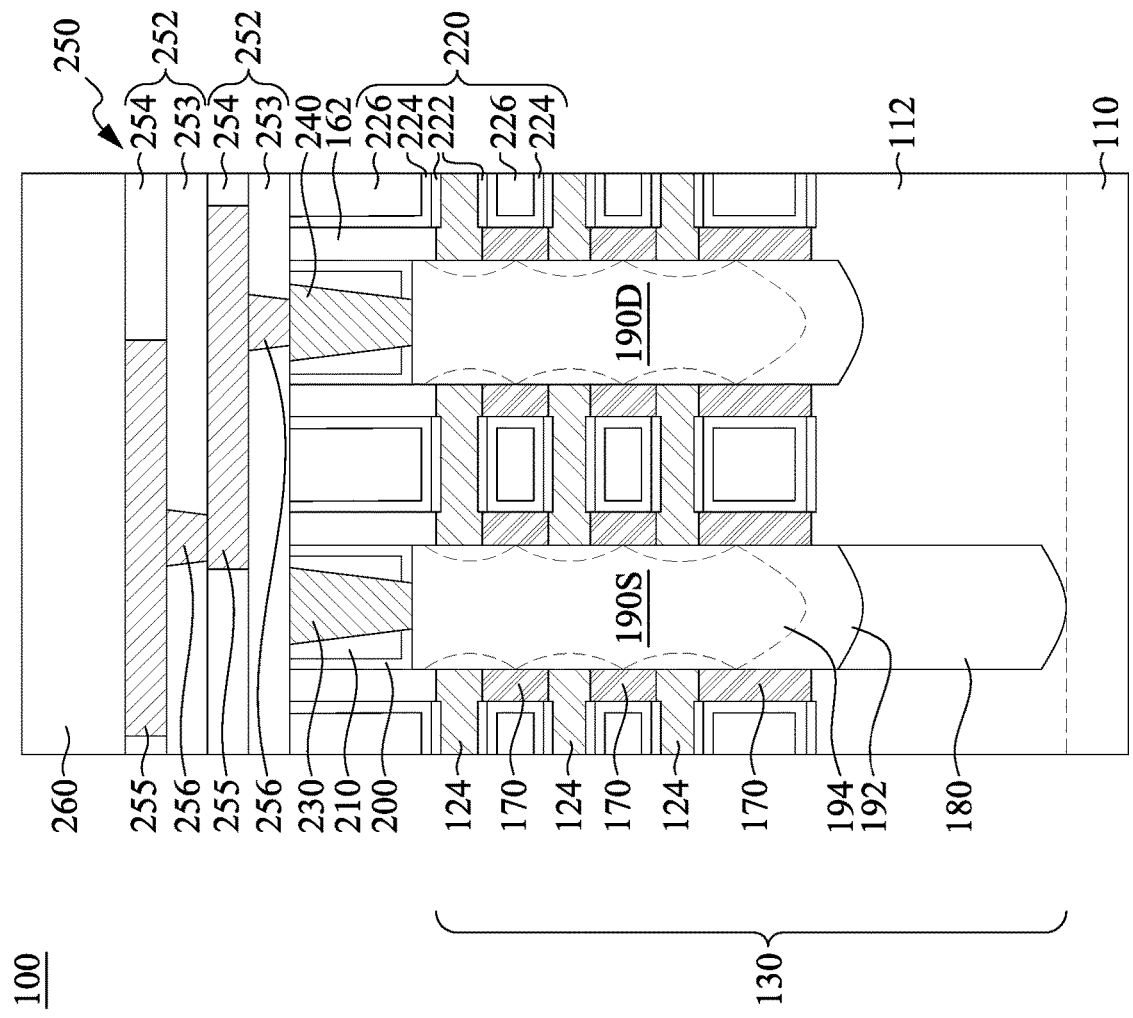
Figure 16C:
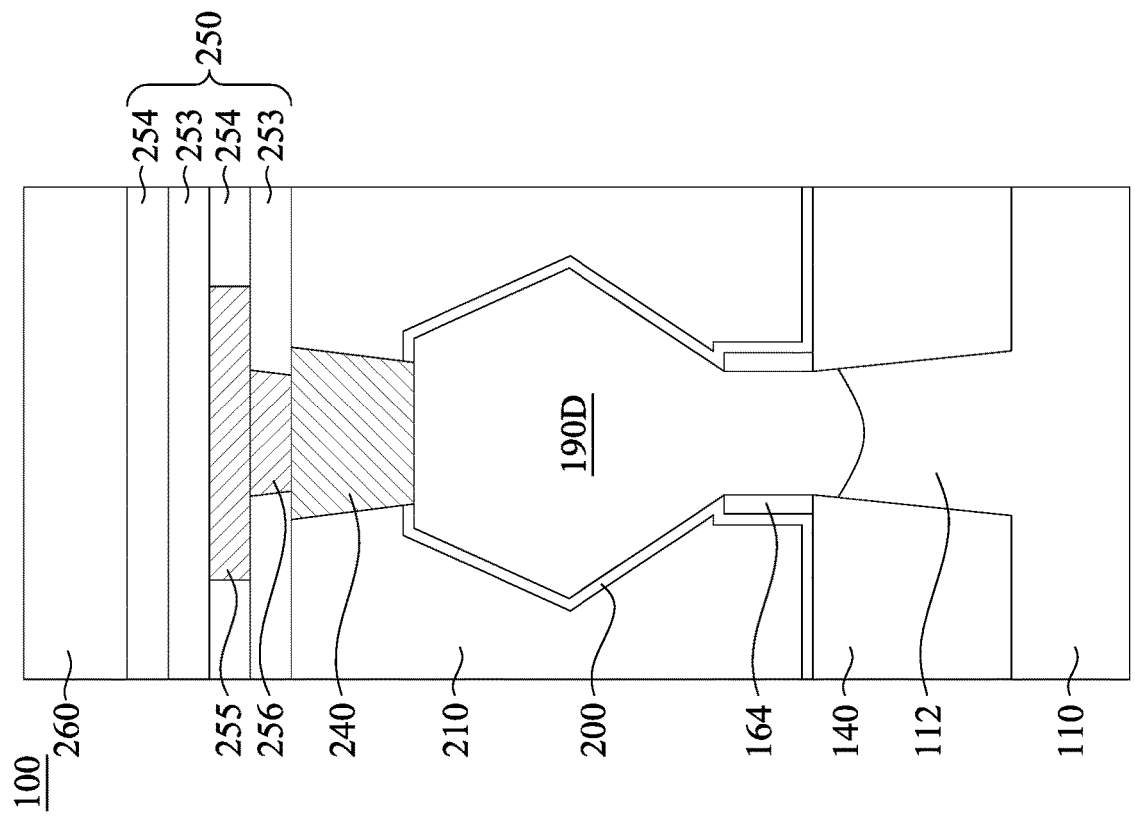
Figure 16B:
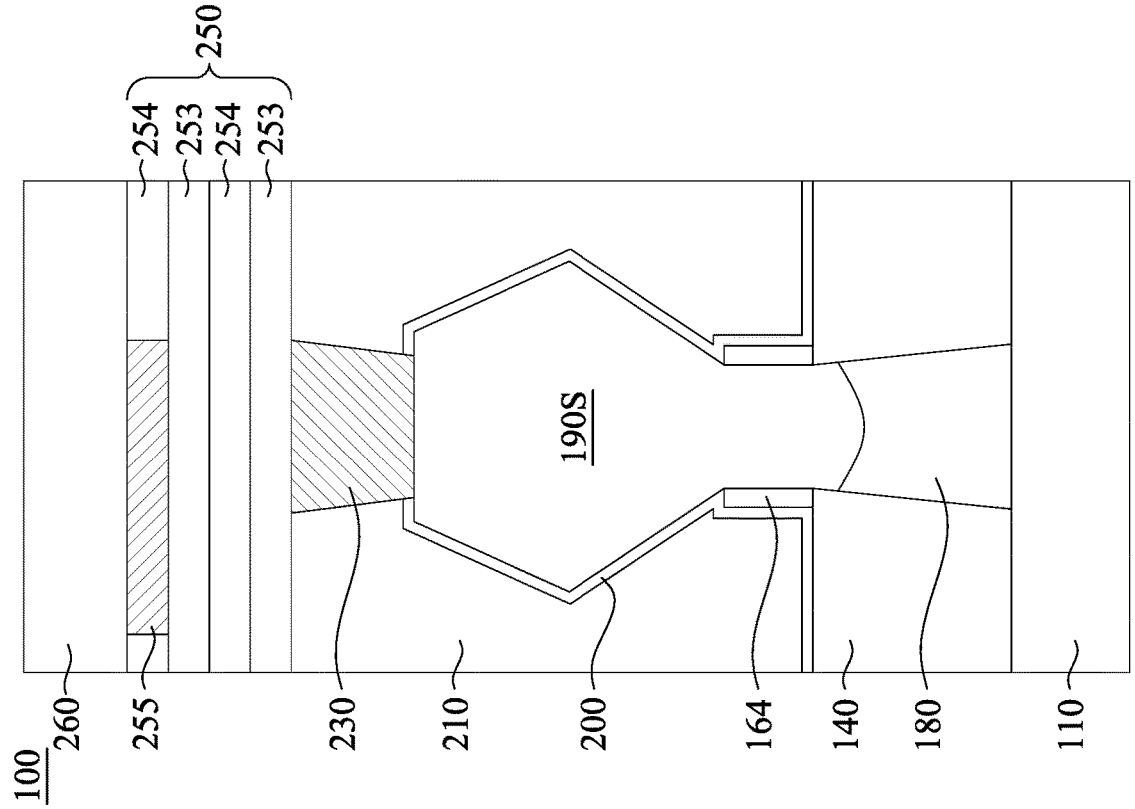
Figure 17A:
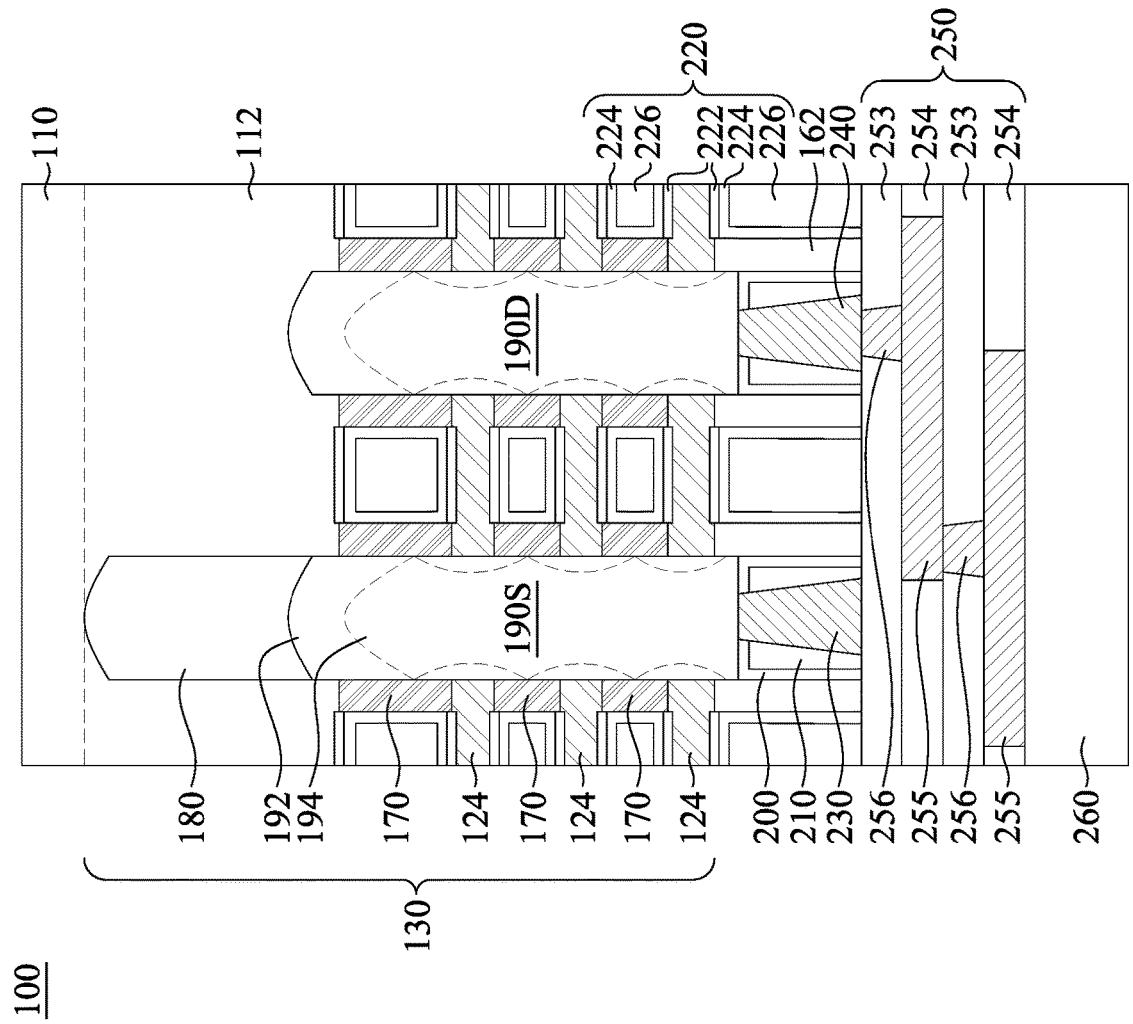
Figure 17C:
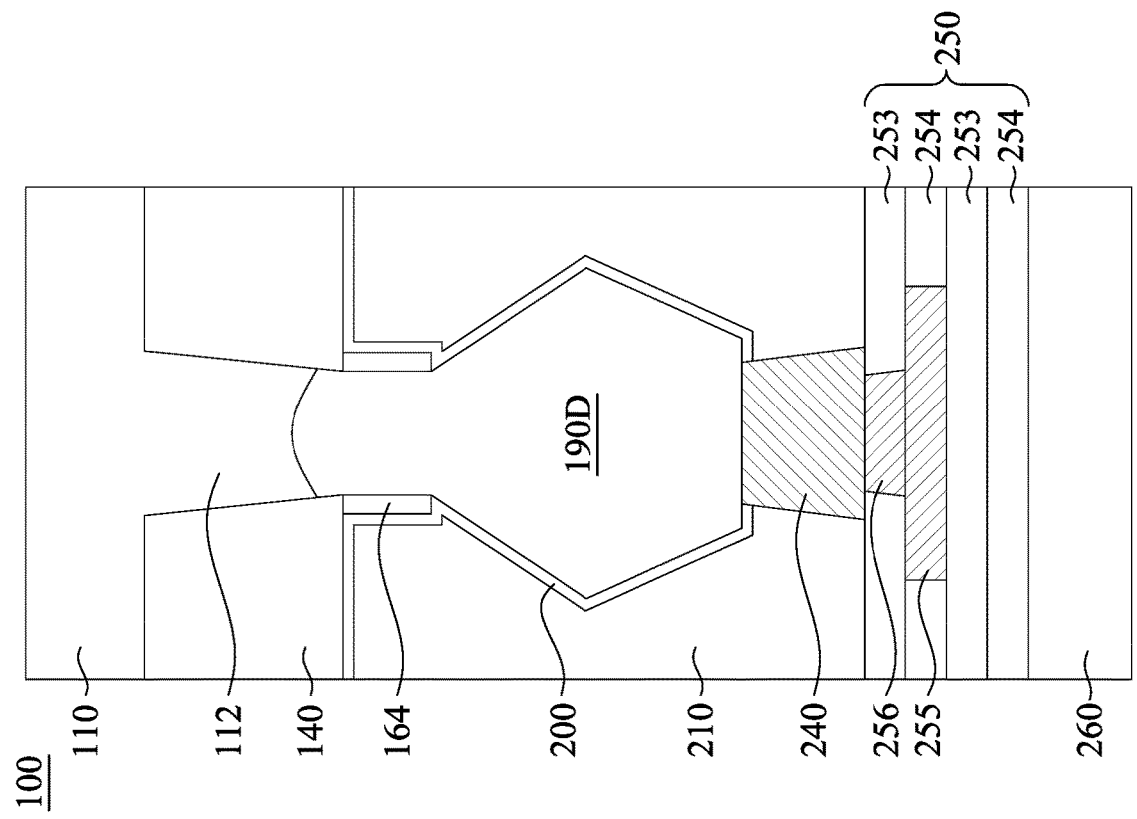
Figure 17B:
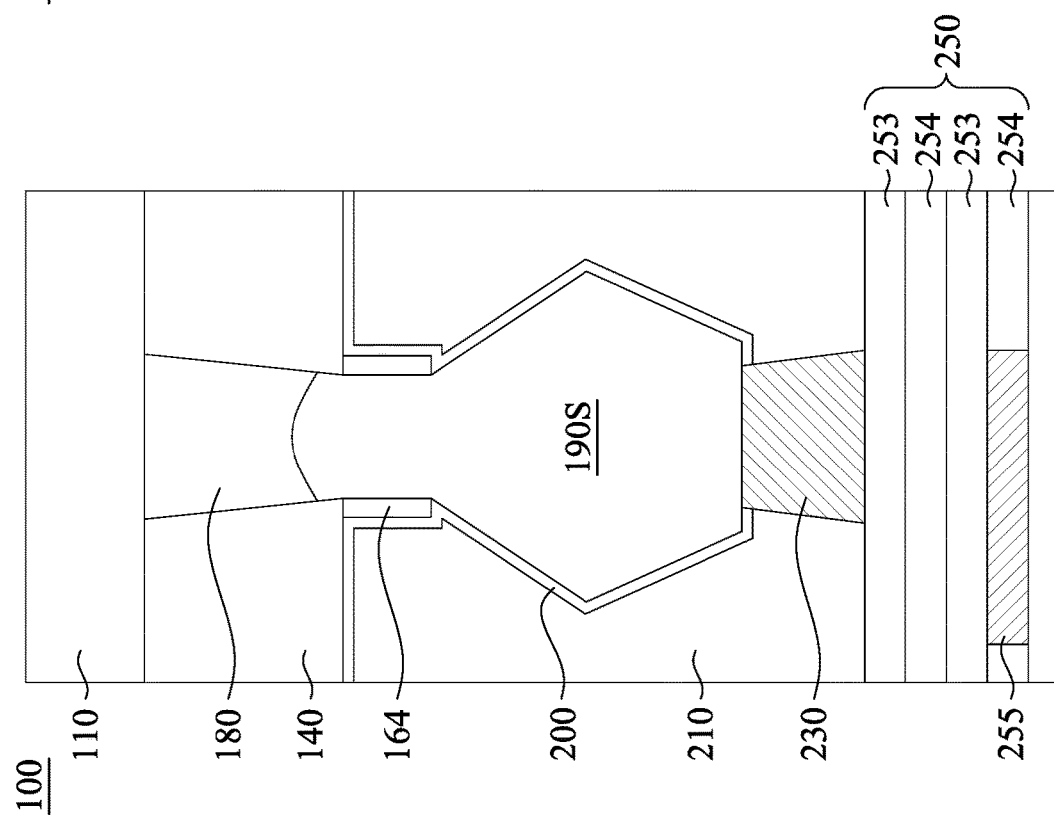

Referring to FIGS. 16A-16C, a carrier substrate 260 is bonded to the front-side MLI structure 250 in accordance with some embodiments of the present disclosure. The carrier substrate 260 may be silicon, doped or undoped, or may include other semiconductor materials, such as germanium; a compound semiconductor; or combinations thereof. The carrier substrate 260 may provide a structural support during subsequent processing on backside of the integrated circuit structure 100 and may remain in the final product in some embodiments. In some other embodiments, the carrier substrate 260 may be removed after the subsequent processing on backside of integrated circuit structure 100 is complete. In some embodiments, the carrier substrate 260 is bonded to a topmost dielectric layer of the MLI structure 250 by, for example, fusion bonding. Once the carrier substrate 260 is bonded to the front-side MLI structure 250, the integrated circuit structure 100 is flipped upside down, such that a backside surface of the substrate 110 faces upwards, as illustrated in FIGS. 17A-17C.

Figure 18A:
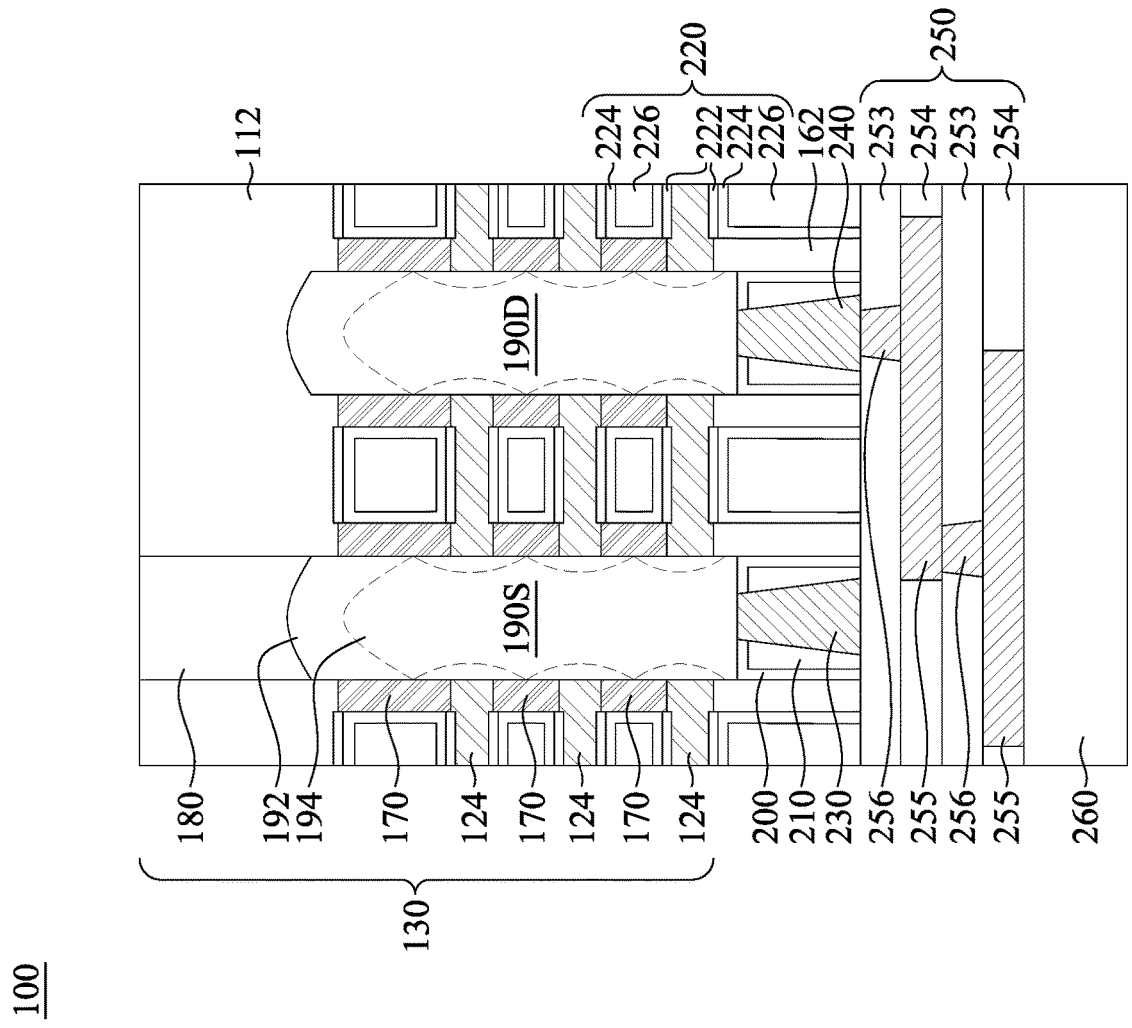
Figure 18C:
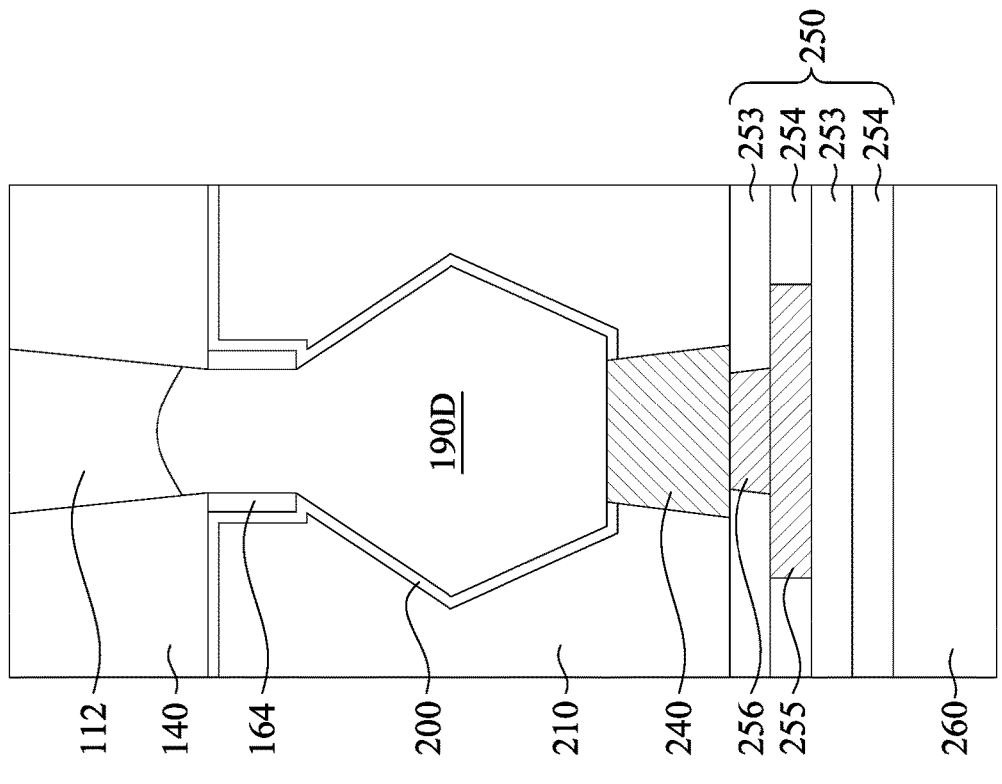
Figure 18B:
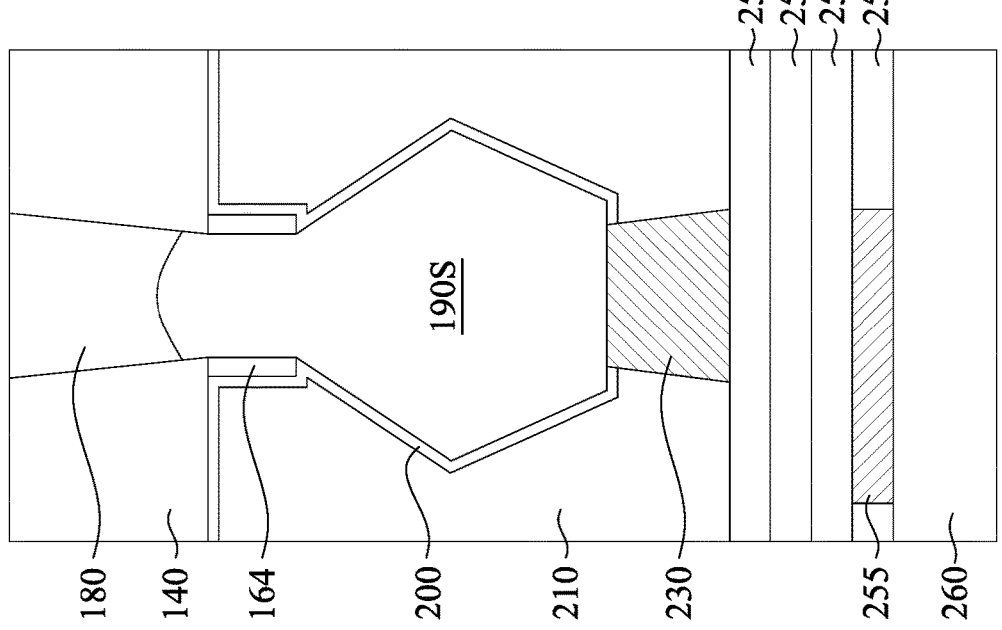

Next, as illustrated in FIGS. 18A-18C, the substrate 110 is thinned down to expose the sacrificial epitaxial plugs 180. In some embodiments, the thinning step is accomplished by a CMP process, a grinding process, or the like. After the thinning step is complete, the substrate portion 112 remains covering a backside of the drain epitaxial structure 190D.

Figure 19A:
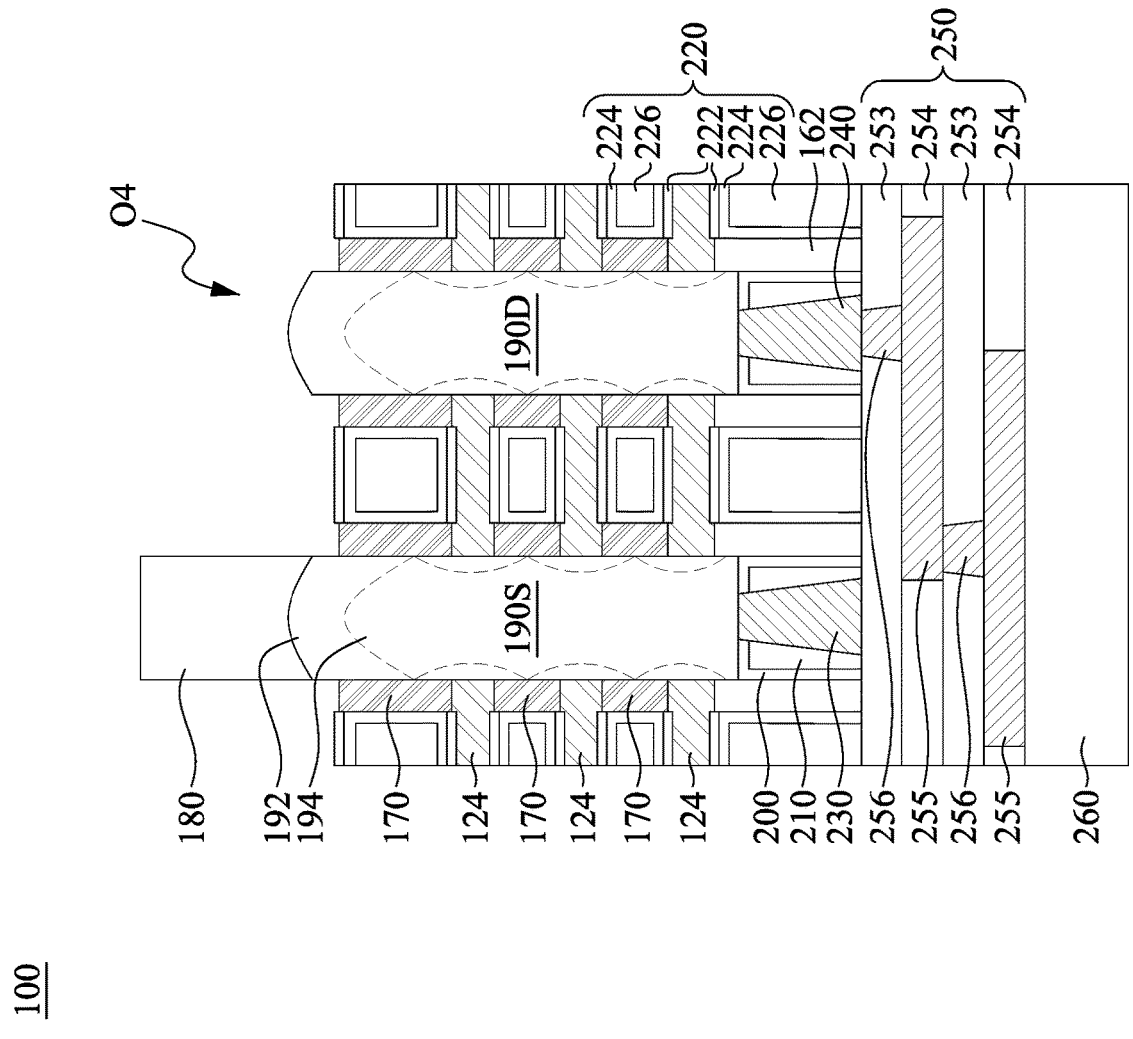
Figure 19C:
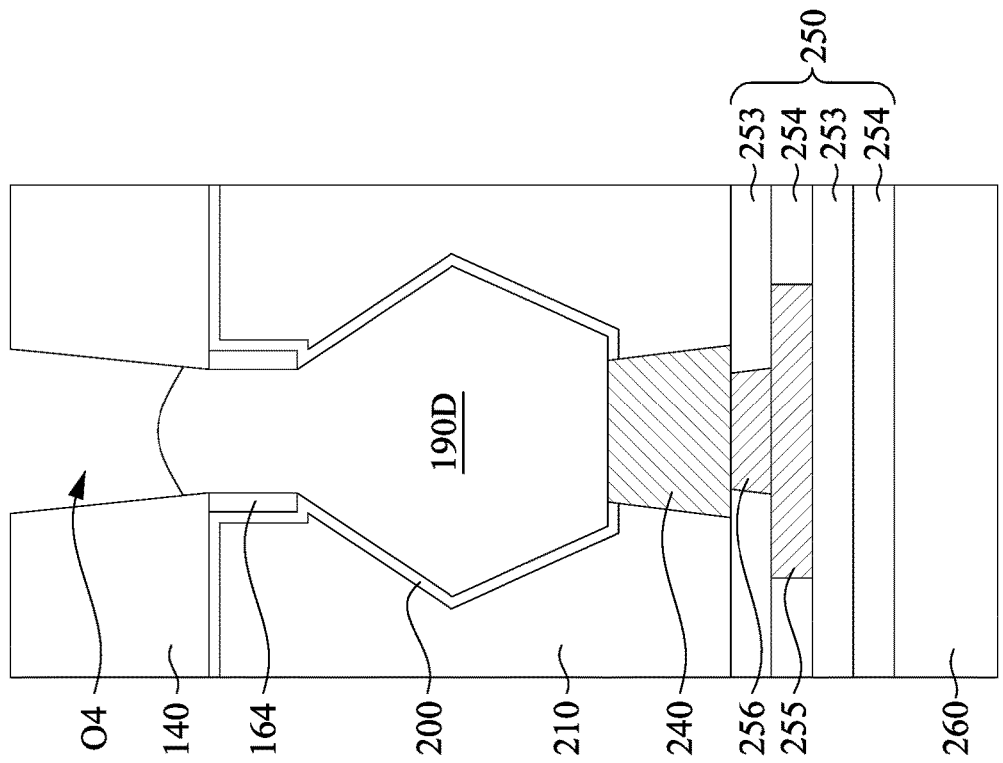
Figure 19B:
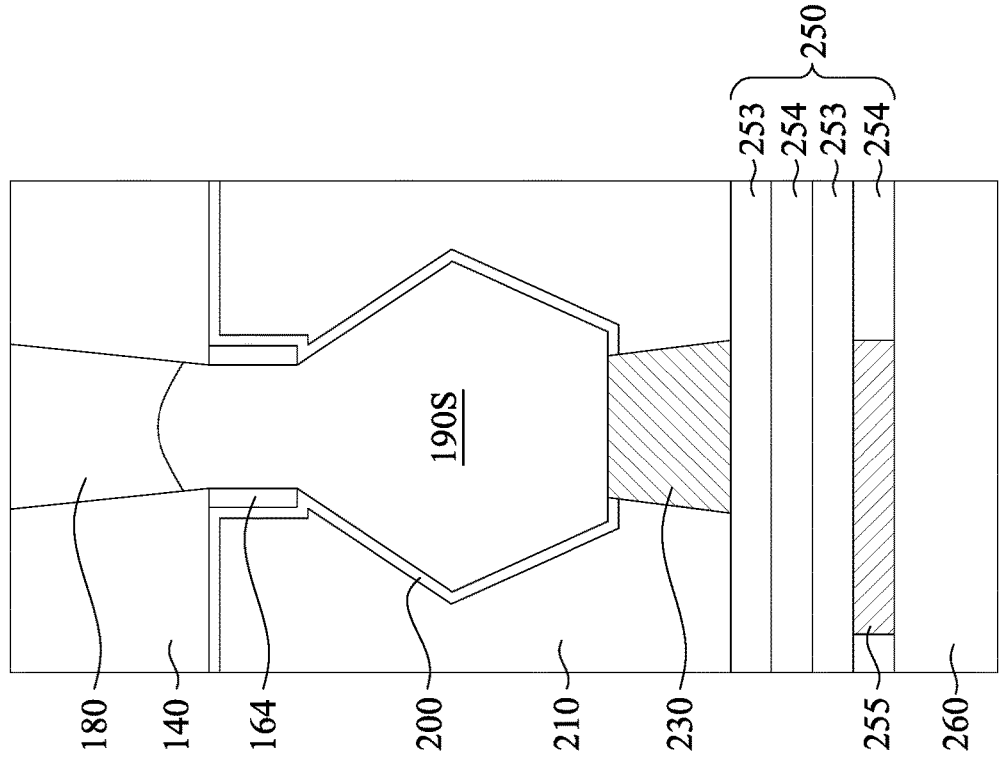

Next, as illustrated in FIGS. 19A-19C, the substrate portion 112 is removed. In some embodiments, the Si substrate portion 112 is removed by using a selective etching process that etches Si at a faster etch rate that it etches the SiGe plug 180. In some embodiments, the selective etching process for selectively removing the Si substrate may be a wet etching process using an wet etching solution such as tetramethylammonium hydroxide (TMAH), potassium hydroxide (KOH), NH$_4$OH, the like or combinations thereof. As a result of the selective etching process, an opening O4 is formed in the STI structure 140 and exposes the backside of the drain epitaxial structure 190D, while the sacrificial epitaxial plug 180 is left in the STI structure 140 and protrudes from a backside of the source epitaxial structure 190S.

Figure 20A:
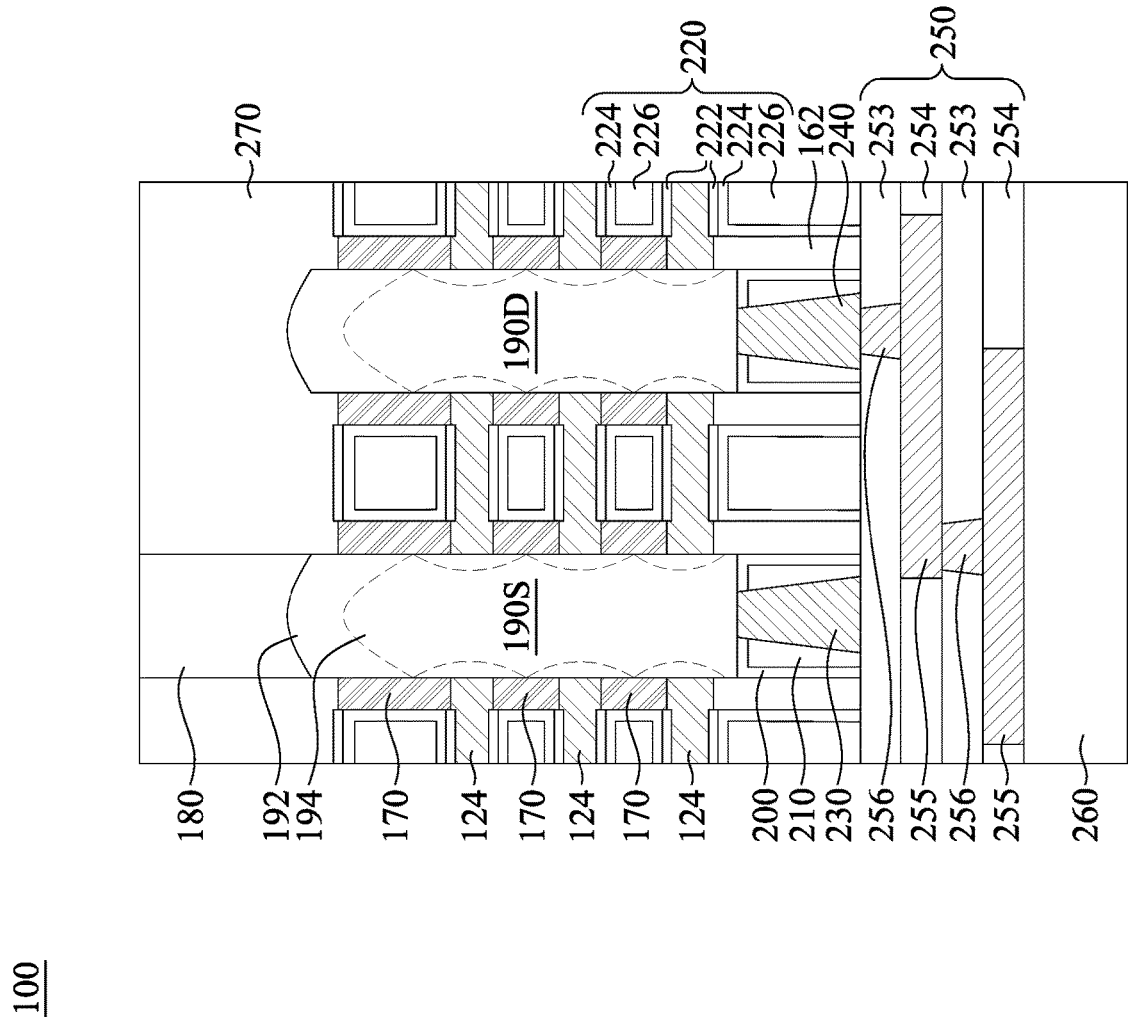
Figure 20C:
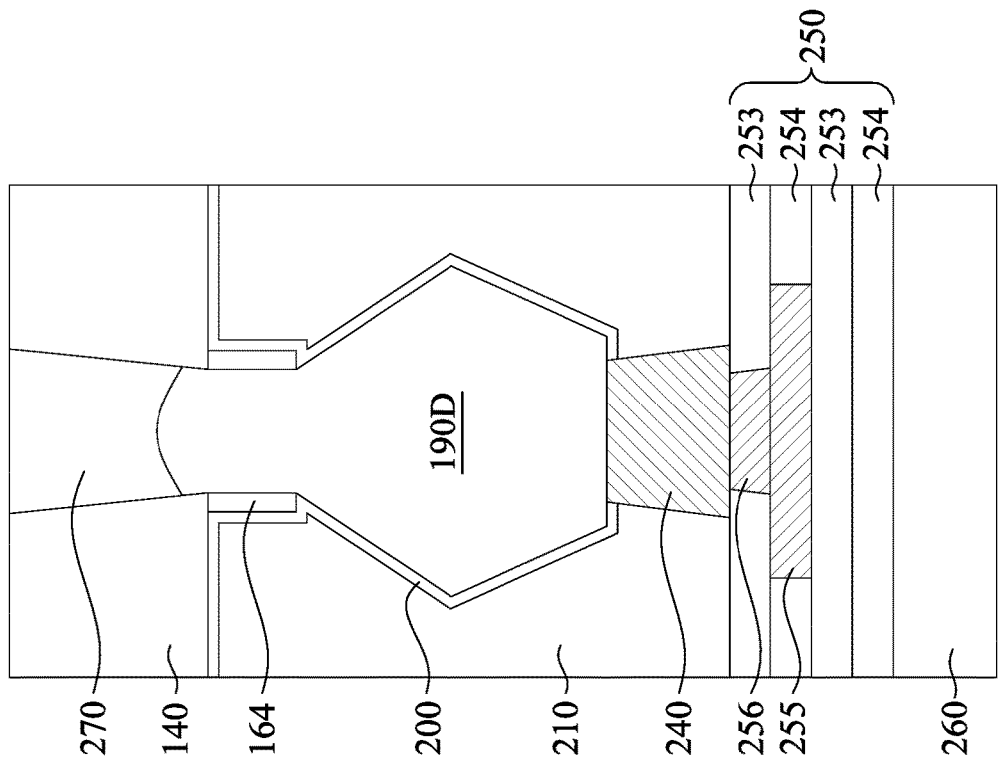
Figure 20B:
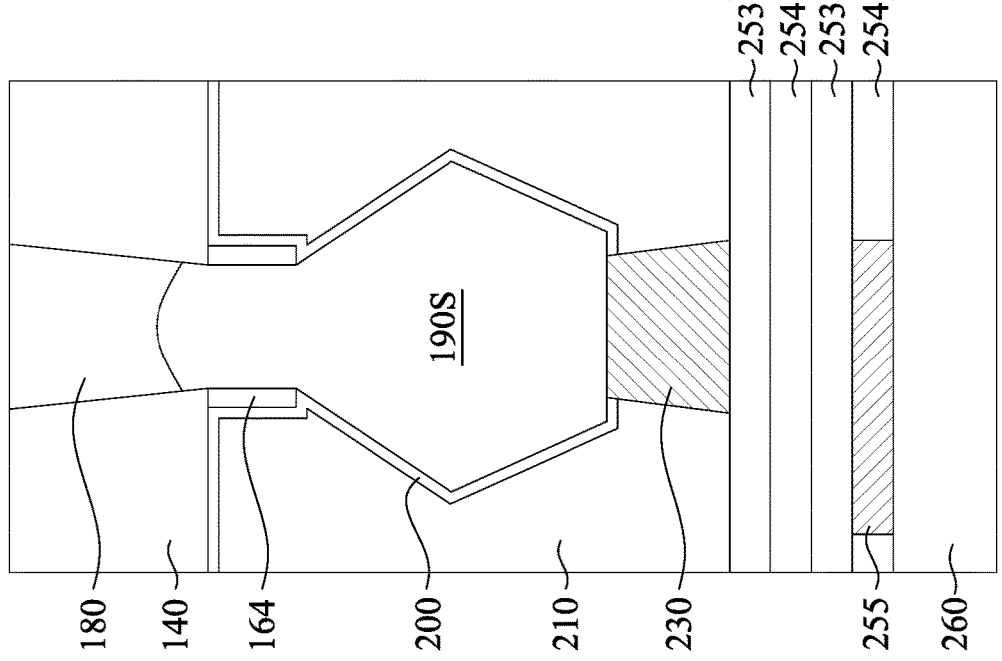

FIGS. 20A-20C illustrate formation of a backside dielectric layer 270 in the opening O4 in the STI structure 140 and laterally surrounding the sacrificial epitaxial plug 180. In some embodiments, the step of FIGS. 20A-20C first deposits a dielectric material of the backside dielectric layer 270 overfilling the opening O4 in the STI structure 140 by using suitable deposition techniques such as CVD. Subsequently, the deposited dielectric material is thinned down by using, for example, an etch back process, a CMP process or the like, until the sacrificial epitaxial plug 180 is exposed. The dielectric layer 270 is referred to as a "backside" dielectric layer in this context because it is formed on a backside of the multi-gate transistors opposite to the front-side of the multi-gate transistors where replacement gates 220 protrude from source/drain regions 190S/190D.

In some embodiments, the backside dielectric layer 270 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, the backside dielectric layer 270 has a same material as the front-side ILD layer 210.

Figure 21A:
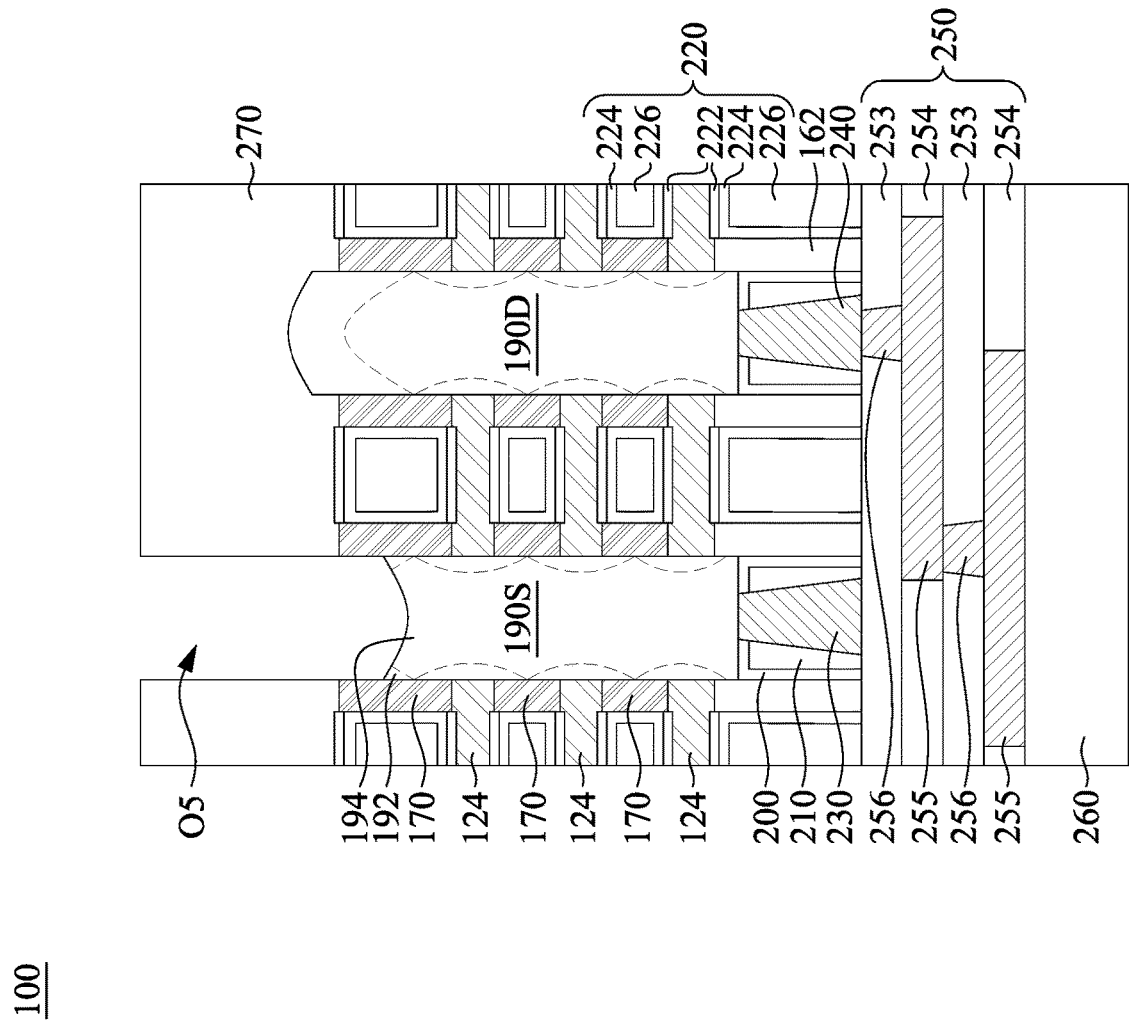
Figure 21C:
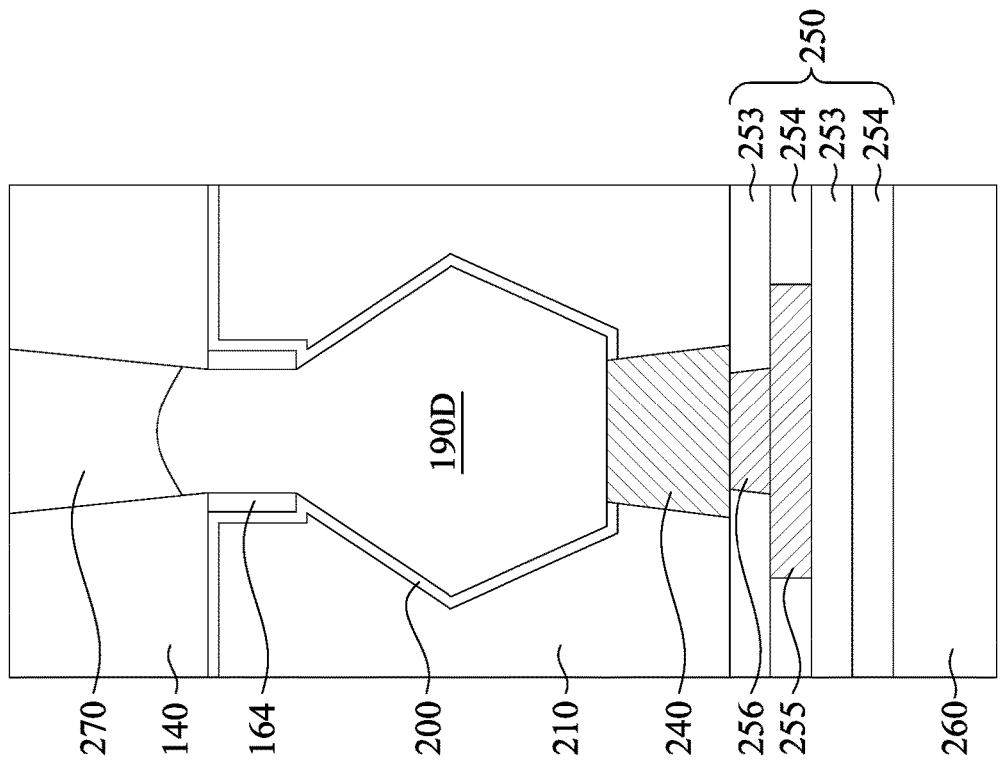
Figure 21B:
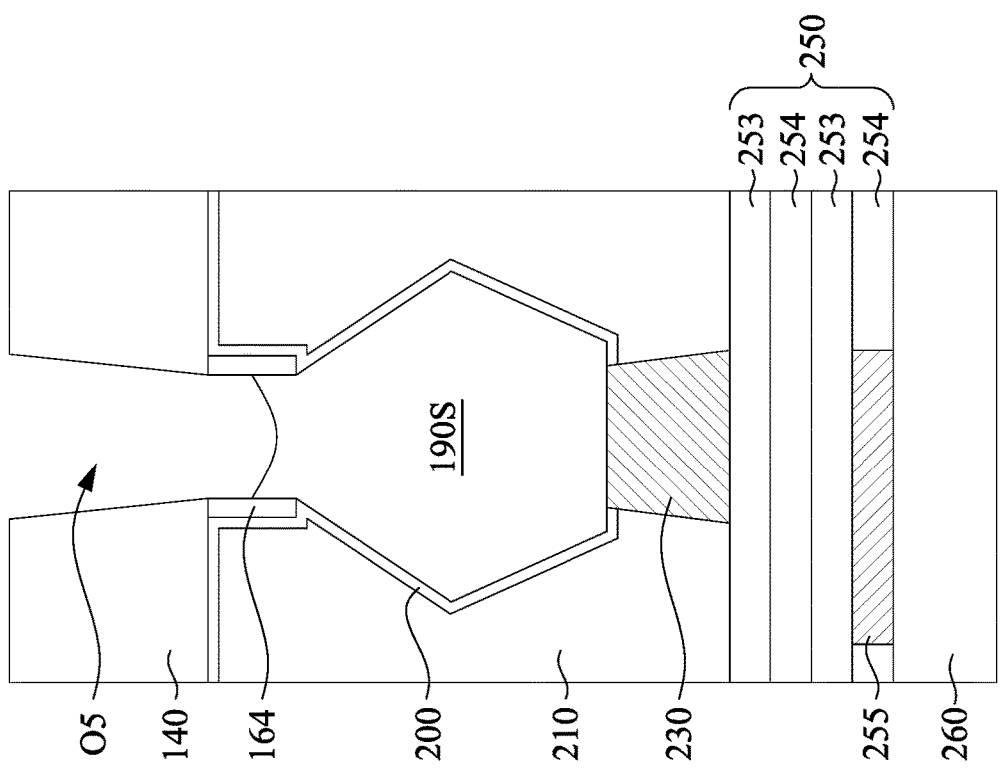

Next, as illustrated in FIGS. 21A-21C, the sacrificial epitaxial plug 18o is removed to form a backside via opening O5 extending through the backside dielectric layer 270 to expose the backside of the source epitaxial structure 190S. In some embodiments, the sacrificial epitaxial plug 180 is removed by using a selective etching process that etches SiGe of the sacrificial epitaxial plug 180 at a faster etch rate than it etches the dielectric material of the backside dielectric layer 270. Stated another way, the selective etching process uses an etchant that attacks SiGe, and hardly attacks the backside dielectric layer 270. Therefore, after the selective etching process is complete, the backside of the drain epitaxial structure 190D remains covered by the backside dielectric layer 270. By way of example and not limitation, the sacrificial epitaxial plug 180 is removed by a selective wet etching such as an APM etch (e.g., ammonia hydroxide-hydrogen peroxide-water mixture) that selectively etches SiGe at a faster etch rate than it etches dielectric materials.

In the depicted embodiment, the backside of the source epitaxial structure 190S is recessed due to the SiGe selective etching process. In that case, the first epitaxial layer 192 of the source epitaxial structure 190S at the bottom of the backside via opening O5 may be etched through, such that the second epitaxial layer 194 (which have higher Ge % or P % than the first epitaxial layer 192) may be exposed at the bottom of the backside via opening O5.

Figure 22A:
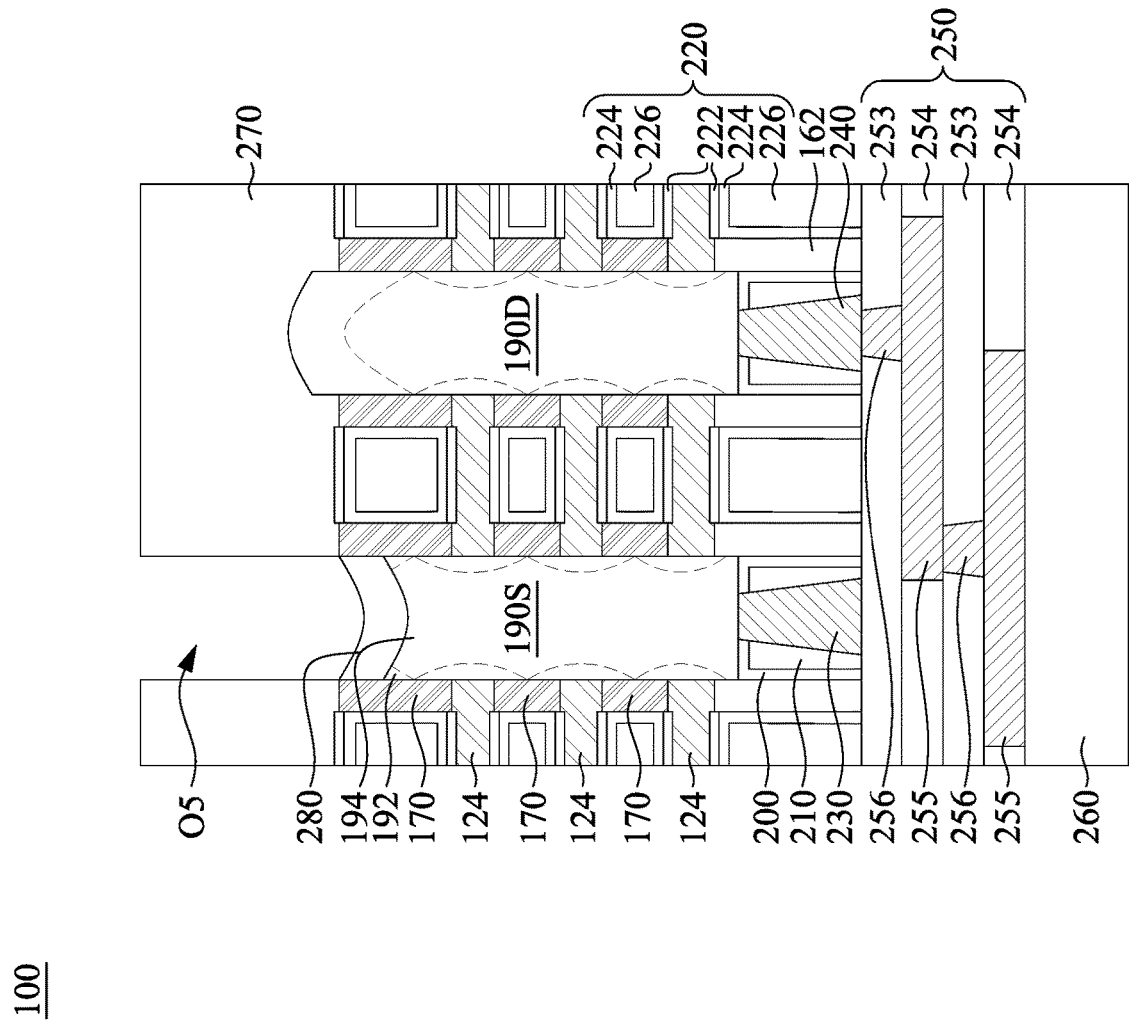
Figure 22C:
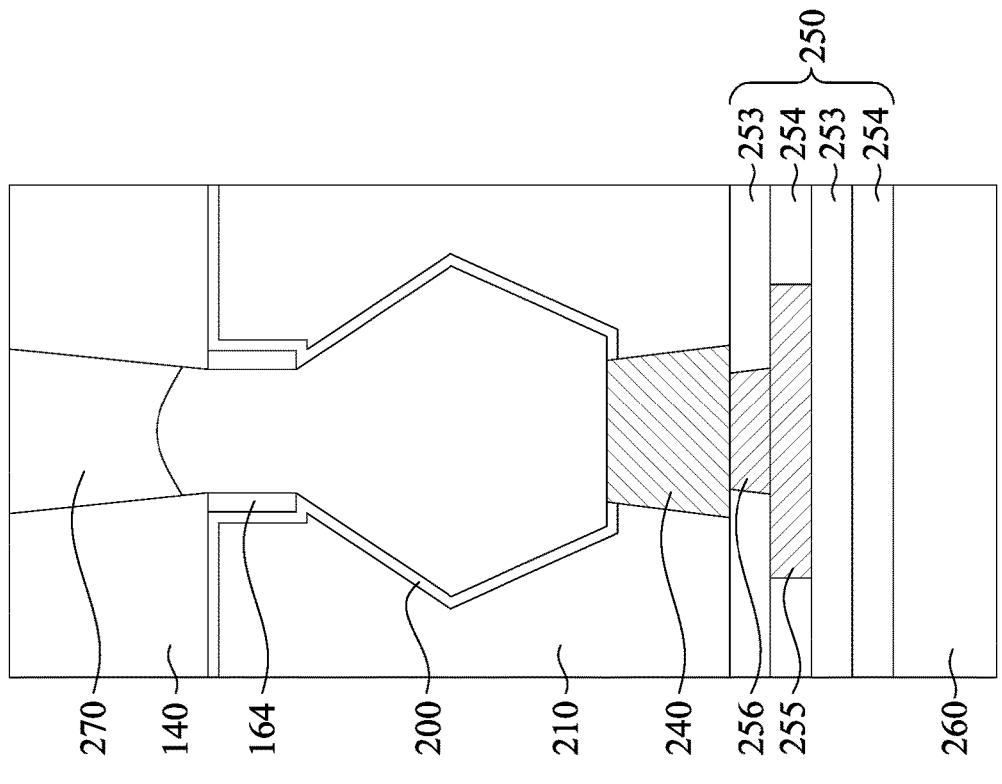
Figure 22B:
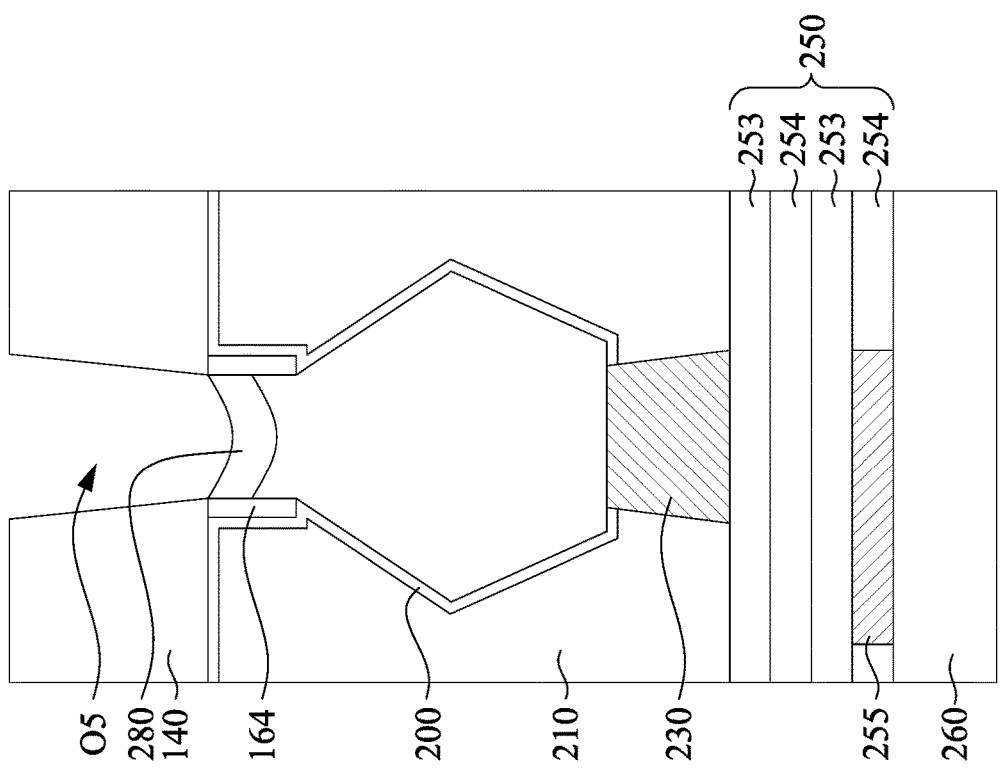

FIGS. 22A-22C illustrate formation of an epitaxial regrowth layer 280 on the backside of the source epitaxial structure 190S. The epitaxial regrowth layer 280 may be formed by performing an epitaxial growth process that provides an epitaxial material on the backside of the source epitaxial structure 190S. During the epitaxial growth process, the inner spacers 170, fin spacers 164, the backside dielectric layer 270 and/or the STI structure 140 limit the epitaxial regrowth layer 280 to the backside via opening O5. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of semiconductor materials of the source epitaxial structure 190S. The backside of the drain epitaxial structure 190D is free of any epitaxial regrowth layer because it is covered by the backside dielectric layer 270 during the epitaxial growth process.

In some embodiments, the epitaxial regrowth layer 280 may include Ge, Si, GaAs, AlGaAs, SiGe, GaAsP, SiP, or other suitable material. The epitaxial regrowth layer 280 may be in-situ doped during the epitaxial process by introducing doping species including: p-type dopants, such as boron or BF$_2$; n-type dopants, such as phosphorus or arsenic; and/or other suitable dopants including combinations thereof. If the epitaxial regrowth layer 280 is not in-situ doped, an implantation process (i.e., a junction implant process) is performed to dope the epitaxial regrowth layer 280. In some exemplary embodiments, the epitaxial regrowth layer 280 in an NFET device includes SiP, while that in a PFET device includes GeSnB and/or SiGeSnB.

In some embodiments, the epitaxial regrowth layer 280 is formed of a same material as the source epitaxial structure 190S. For example, the epitaxial regrowth layer 280 and the source epitaxial structure 190S in a PFET device include GeSnB and/or SiGeSnB, while the epitaxial regrowth layer 280 and the source epitaxial structure 190S include SiP. In some embodiments, the epitaxial regrowth layer 280 may be different from the first and second epitaxial layers 192, 194 at least in germanium atomic percentage (Ge %) or phosphorus concentration (P %).

Take PFET device for example, the epitaxial regrowth layer 280 has a higher germanium atomic percentage than the first epitaxial layer 192, which in turn will help in reducing source contact resistance between the epitaxial regrowth layer 280 and the subsequently formed backside via. By way of example and not limitation, a ratio of the germanium atomic percentage in the epitaxial regrowth layer 280 to the germanium atomic percentage in the first epitaxial layer 192 is greater than 1:1. In some embodiments, the germanium atomic percentage of the epitaxial regrowth layer 280 may be also higher than the second epitaxial layer 194. By way of example and not limitation, the germanium atomic percentage in the epitaxial regrowth layer 280 is in a range from about 20% to about 70%. In some embodiments, the epitaxial regrowth layer 280 has a gradient germanium atomic percentage. For example, the germanium atomic percentage in the epitaxial regrowth layer 280 increases as a distance from the source epitaxial structure 190S increases, and a maximal germanium atomic percentage in the epitaxial regrowth layer 280 is higher than that in the first epitaxial layer 192 and/or the second epitaxial layer 194.

On the other hand, in some embodiments of NFET devices, the epitaxial regrowth layer 280 has a higher phosphorous concentration than the first epitaxial layer 192, which in turn will help in reducing source contact resistance between the epitaxial regrowth layer 280 and the subsequently formed backside via. By way of example and not limitation, a ratio of the phosphorous concentration in the epitaxial regrowth layer 280 to the phosphorous concentration in the first epitaxial layer 192 is greater than 1:1. In some embodiments, the phosphorous concentration of the epitaxial regrowth layer 280 may be also higher than the second epitaxial layer 194. By way of example and not limitation, the phosphorous concentration in the epitaxial regrowth layer 280 is in a range from about 1 E21 $cm^{-3}$ to about 5 E21 $cm^{-3}$. In some embodiments, the epitaxial regrowth layer 280 has a gradient phosphorous concentration. For example, the phosphorous concentration in the epitaxial regrowth layer 280 increases as a distance from the source epitaxial structure 190S increases, and a maximal phosphorous concentration in the epitaxial regrowth layer 280 is higher than that in the first epitaxial layer 192 and/or the second epitaxial layer 194.

In some embodiments, the growth temperature of the epitaxial regrowth layer 280 is different from that of the source/drain epitaxial structures 190S/190D. For example, the growth temperature of the epitaxial regrowth layer 280 can be lower than that of the source/drain epitaxial structures 190S/190D, so as to reduce negative impacts on the source/drain epitaxial structures 190S/190D due to a high temperature growth. By way of example and not limitation, the growth temperature of the epitaxial regrowth layer 280 is lower than the growth temperature of the source/drain epitaxial structures 190S/190D by a non-zero temperature difference from about 100° C. to about 300° C.

In some embodiments, after the epitaxial growth is complete, an annealing process can be performed to activate the p-type dopants or n-type dopants in the epitaxial regrowth layer 280. The annealing process may be, for example, a rapid thermal anneal (RTA), a laser anneal, a millisecond thermal annealing (MSA) process or the like.

FIGS. 23A-23D illustrate formation of via spacers 290 lining sidewalls of the backside via opening O5. In some embodiments of this step, a via spacer material layer is first deposited over the carrier substrate 260. The via spacer material layer may be a conformal layer that is subsequently etched to form the via spacer 290. In the illustrated embodiment, the via spacer material layer is deposited conformally to line the sidewalls and the bottom of the via opening O5. By way of example, the via spacer material layer may be formed by depositing a dielectric material over the carrier substrate 260 using processes such as, CVD process, a subatmospheric CVD (SACVD) process, a flowable CVD process, an ALD process, a PVD process, or other suitable process. An anisotropic etching process is then performed on the deposited via spacer material layer to remove horizontal portions of the via spacer material layer from the backside surface of the epitaxial regrowth layer 280 and the backside surface of the backside dielectric layer 270, while leaving vertical and slant portions on vertical sidewalls and slant sidewalls of the backside via opening O5. These remaining portions of via spacer material layer in the backside via opening O5 are in combination referred to as a via spacer 290. Because the via spacer 290 is formed after forming the epitaxial regrowth layer 280, the via spacer 290 is spaced apart from the source epitaxial structure 190S by the epitaxial regrowth layer 280.

Figure 23A:
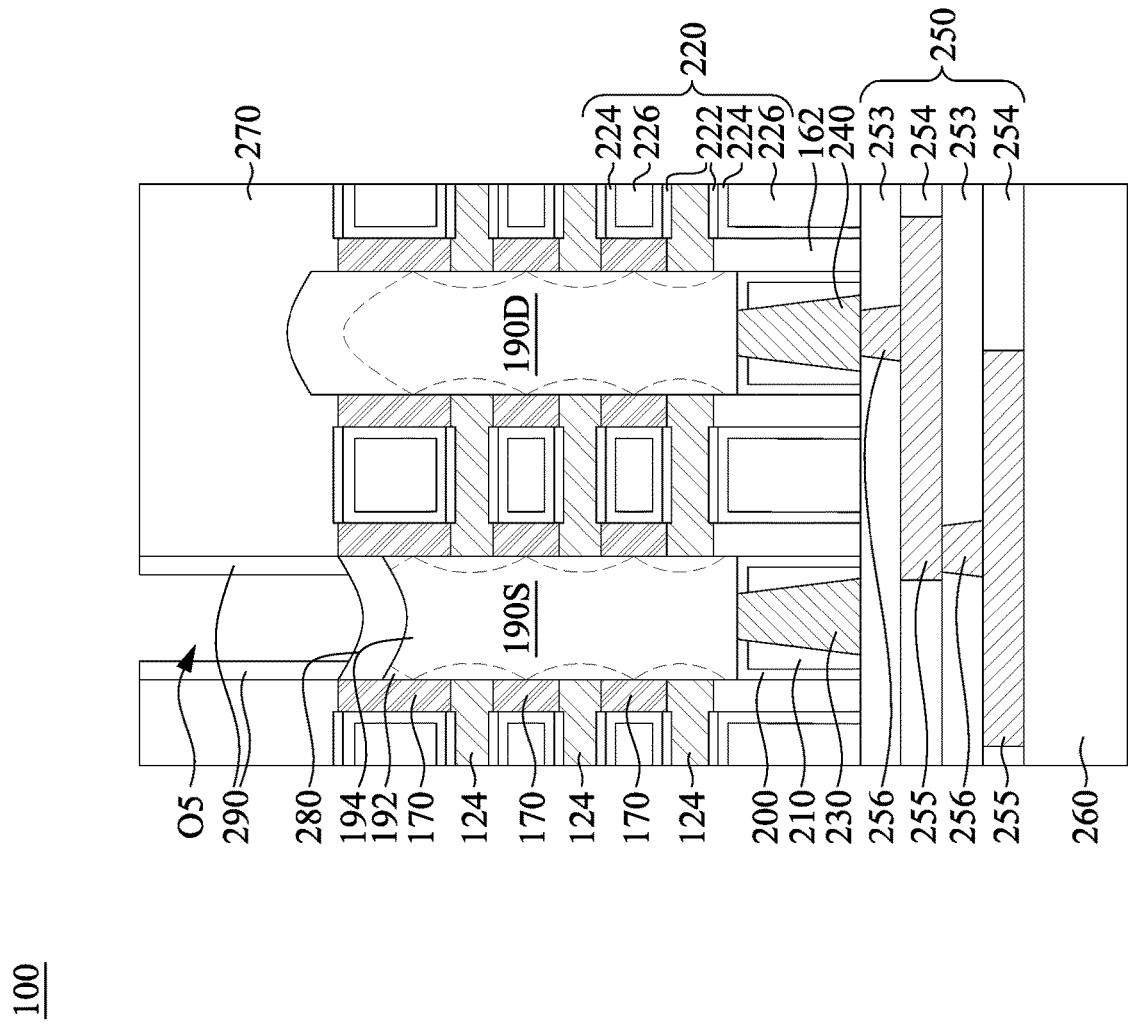
Figure 23C:
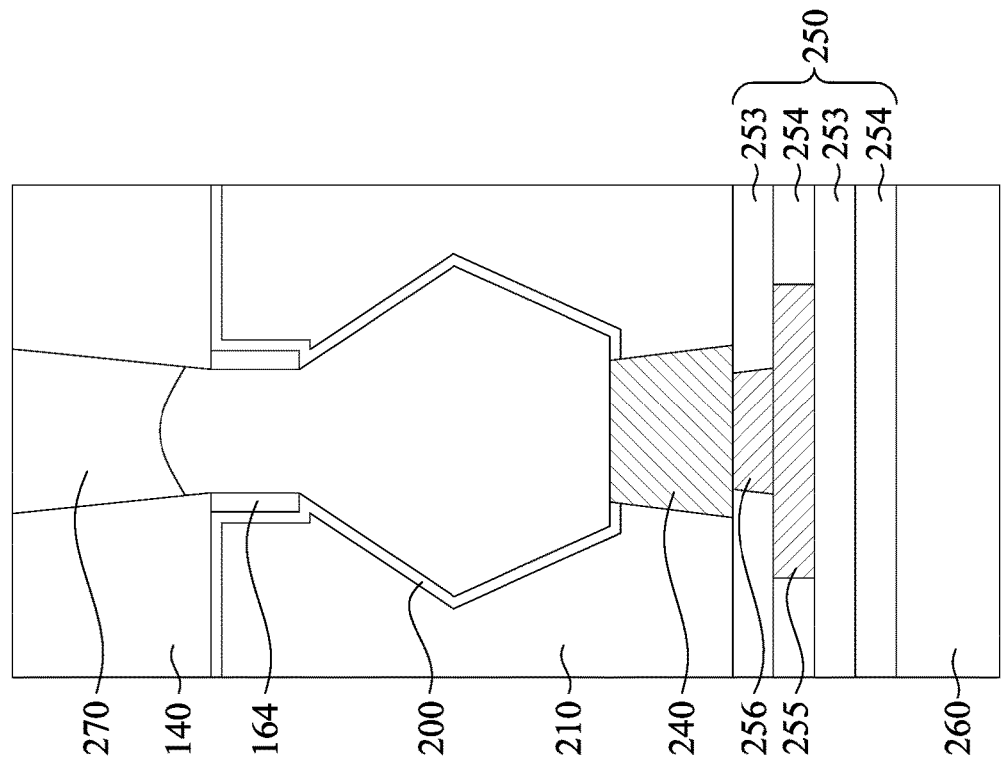
Figure 23B:
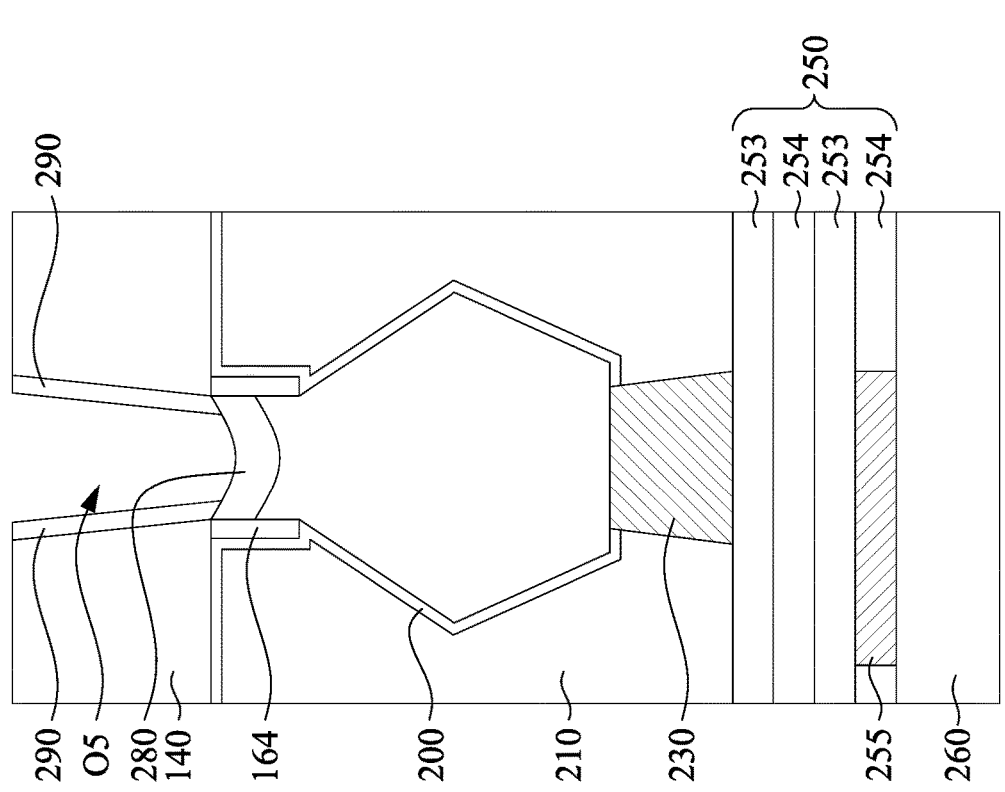
Figure 23D:
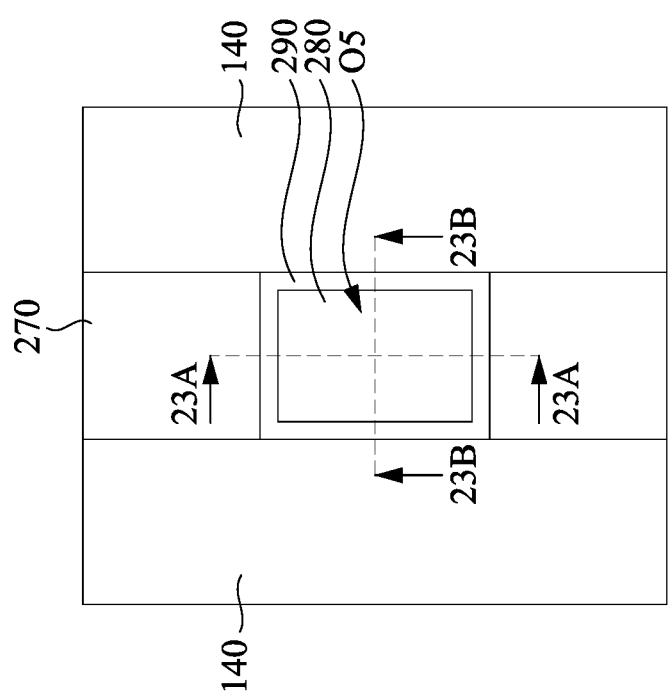
FIGS. 23D and 24D are top views of intermediate stages of fabricating the integrated circuit structure in accordance with some embodiments of the present disclosure.

Separate vertical portions of the via spacer 290 are defined from the cross-sectional view of FIG. 23A, and separate slant portions of the via spacer 290 are defined from the cross-sectional view of FIG. 23B. For example, if when viewed from above the backside via opening O5 is square/rectangular (see e.g., FIG. 23D), then the vertical portions and slant portions of the via spacer 290 refer to the nature of this single continuous via spacer 290 when depicted in cross-sectional views.

The via spacer 290 may include one or more dielectric materials different from the backside dielectric layer 270. For example, in some embodiments where the backside dielectric layer 270 is a silicon oxide layer, the via spacer 290 includes silicon nitride, silicon carbide, silicon oxynitride, SiCN, silicon oxycarbide, SiOCN, and/or combinations thereof. The material difference results in different etch selectivity between the via spacer 290 and the backside dielectric layer 270, and thus the via spacer 290 can protect the backside via opening O5 from unintentionally expanded due to, for example, an etching process used in subsequent silicidation process, which will be described in greater detail below.

FIGS. 24A-24D illustrate formation of a backside via 300 in the backside via opening O5. In some embodiments of backside via formation, one or more metal layers are first deposited to overfill the backside via opening O5 by using suitable deposition techniques, such as e.g., CVD, PVD, ALD, the like or combinations thereof. Subsequently, a CMP process is carried out to thin down the one or more metal layers until the backside dielectric layer 270 gets exposed, while leaving portions of the one or more metal layers in the backside via opening O5, serving as a backside via 300. In some embodiments, the one or more metal layers include, for example, tungsten, cobalt, copper, titanium nitride, tantalum nitride, the like or combinations thereof.

Figure 25:
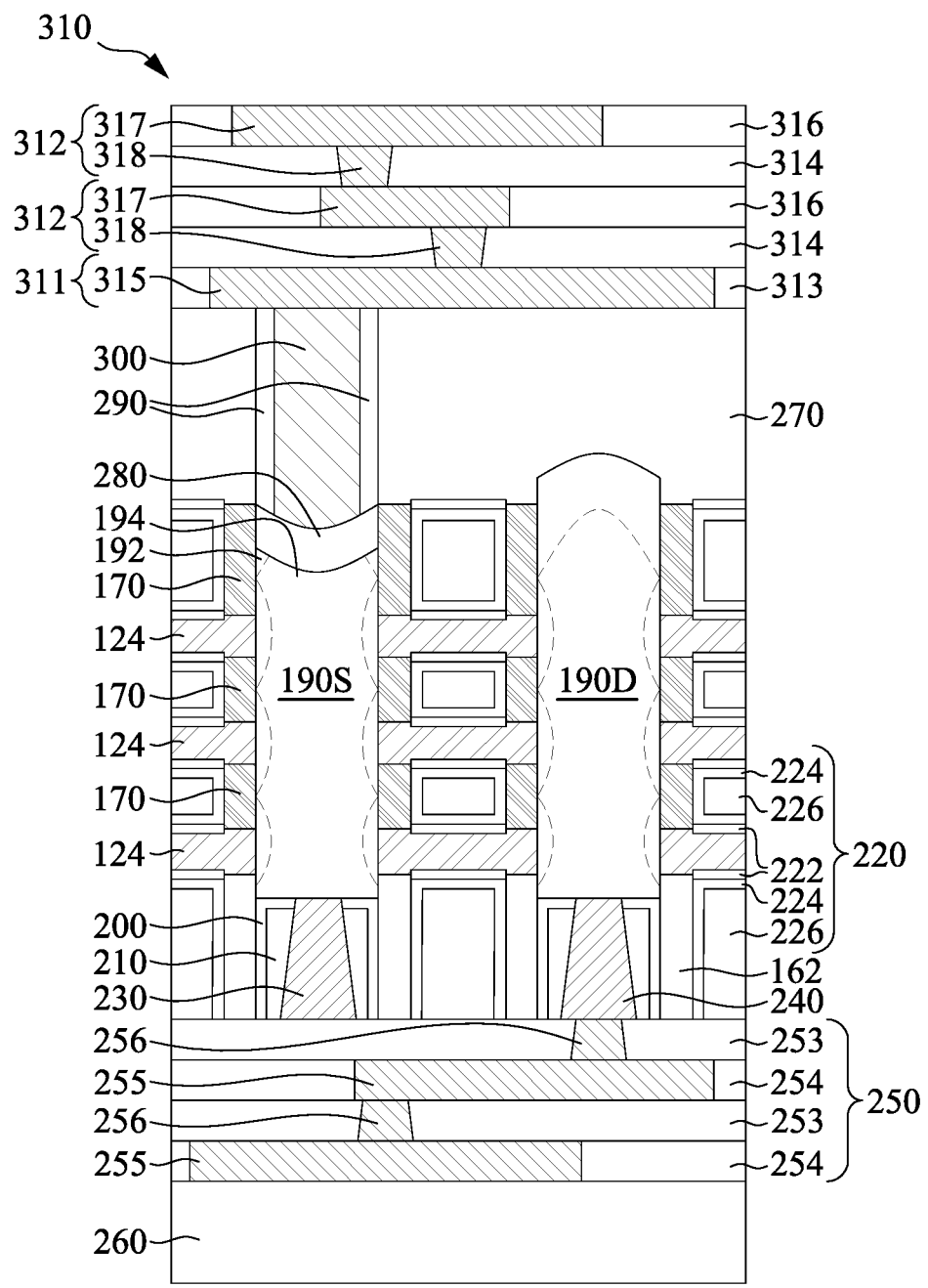

FIG. 25 illustrates a backside multilayer interconnect MLI structure 310 formed over the backside via 600 and the backside dielectric layer 270. The backside MLI structure 310 may comprise a bottommost backside metallization layer 311 (also called backside M0 layer) and a plurality of upper backside metallization layers 312 over the bottommost backside metallization layer 311. The number of upper backside metallization layers 312 may vary according to design specifications of the integrated circuit structure 100. Only two backside metallization layers 312 (also called backside M1 layer and backside M2 layer) are illustrated in FIG. 25 for the sake of simplicity.

The bottommost backside metallization layer 311 comprises a backside IMD layer 313 over the backside dielectric layer 270 and one or more horizontal interconnects, such as backside metal lines 315, respectively extending horizontally or laterally in the backside IMD layer 313. A metal line 315 in the bottommost backside metallization layer 311 is a power rail that extends across and is in contact with one or more backside vias 300, so as to make electrical connection to one or more source epitaxial structures 190S. Because the power rail is formed in the backside MLI structure 310, more routing space can be provided for the integrated circuit structure 100.

The upper backside metallization layers (e.g., backside M1 layer and M2 layer) 312 each comprise a first backside inter-metal dielectric (IMD) layer 314 and a second backside IMD layer 316. The second backside IMD layers 316 are formed over the corresponding first backside IMD layers 314. The upper backside metallization layers 312 comprise one or more horizontal interconnects, such as backside metal lines 317, respectively extending horizontally or laterally in the second backside IMD layers 316 and vertical interconnects, such as backside metal vias 318, respectively extending vertically in the first backside IMD layers 314. In some embodiments, the backside metal vias 318 have tapered profile with a width decreasing as a distance from the backside dielectric layer 270 decreases, due to the nature of etching via openings in the backside IMD layers 314 after the IC structure 100 is flipped upside down.

Figure 26:
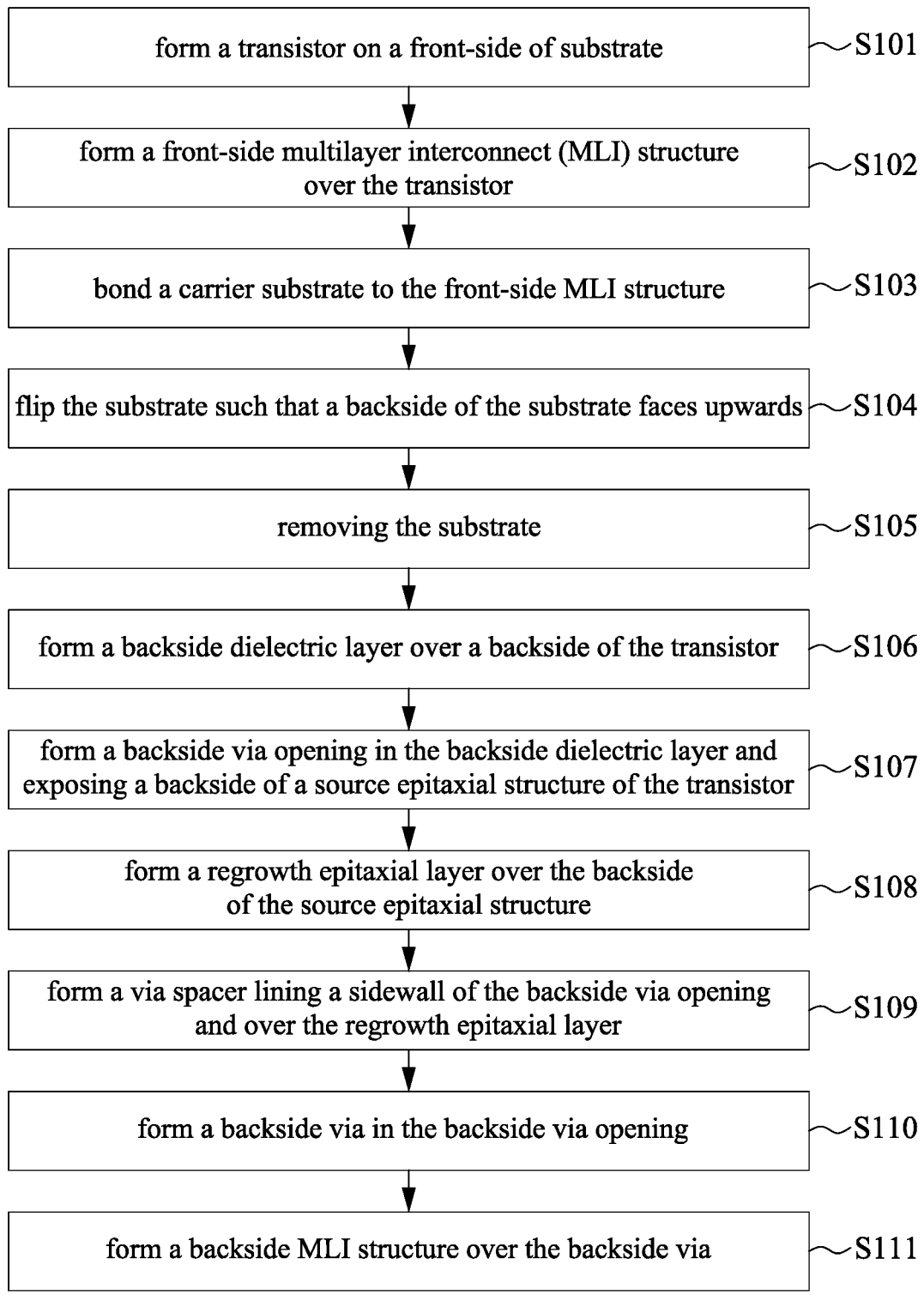
FIG. 26 is a flow chart illustrating a method of forming an integrated circuit structure in accordance with some embodiments of the present disclosure.

FIG. 26 is a flow chart illustrating a method M1 of forming an integrated circuit structure in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, transistors are formed on a front-side of a substrate. FIGS. 1-14C illustrate perspective views and cross-sectional views of formation of GAA transistors according to some embodiments of block S101.

At block S102, a front-side MLI structure is formed over the transistors. FIGS. 15A-15C illustrate cross-sectional views according to some embodiments of block S102.

At block S103, a carrier substrate is bonded to the front-side MLI structure. FIGS. 16A-16C illustrate cross-sectional views according to some embodiments of block S103.

At block S104, the substrate is flipped such that a backside of the substrate faces upwards. FIGS. 17A-17C illustrate cross-sectional views according to some embodiments of block S104.

At block S105, the substrate is removed. FIGS. 18A-18C and 19A-19C illustrate cross-sectional views according to some embodiments of block S105.

At block S106, a backside dielectric layer is formed over a backside of the transistors. FIGS. 20A-20C illustrate cross-sectional views according to some embodiments of block S106.

At block S107, a backside via opening is formed in the backside dielectric layer and exposes a backside of a source epitaxial structure of the transistor. FIGS. 21A-21C illustrate cross-sectional views according to some embodiments of block S107.

At block S108, an epitaxial regrowth layer is formed over the backside of the source epitaxial structure. FIGS. 22A-22C illustrate cross-sectional views according to some embodiments of block S108.

At block S109, a via spacer is formed lining a sidewall of the backside via opening and over the epitaxial regrowth layer. FIGS. 23A-23D illustrate cross-sectional views and a top view according to some embodiments of block S109.

Figure 24A:
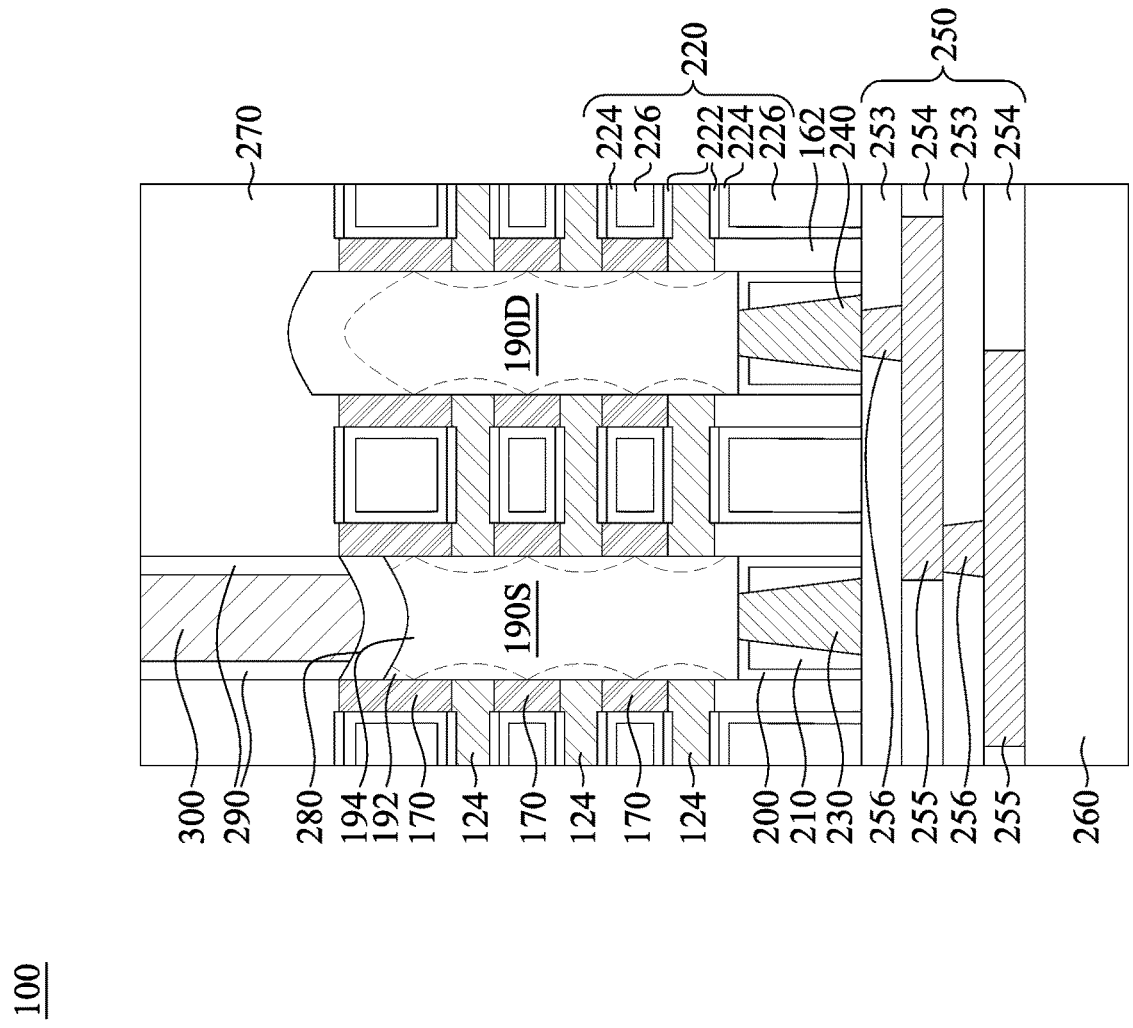
Figures 24B, 24C:
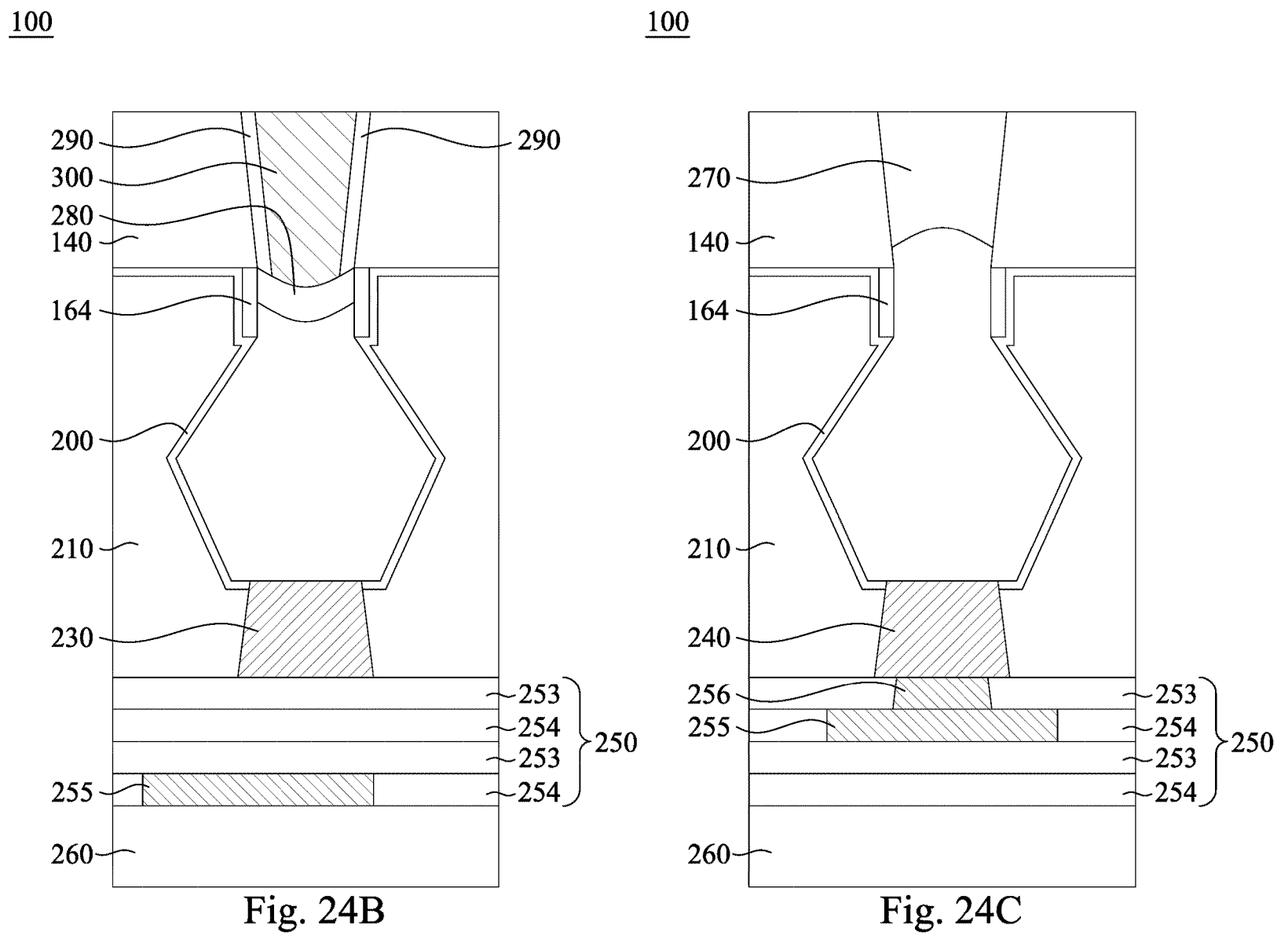
Figure 24D:
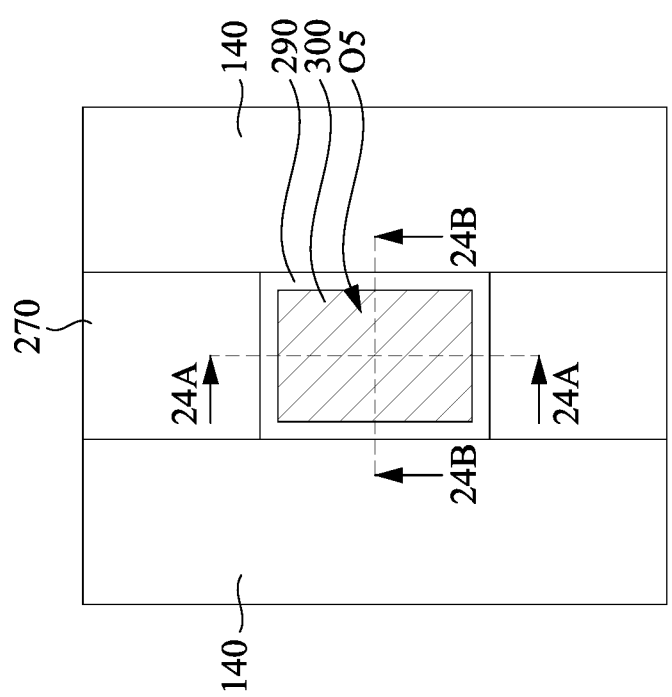

At block S110, a backside via is formed in the backside via opening. FIGS. 24A-24C illustrate cross-sectional views according to some embodiments of block S110.

At block S111, a backside MLI structure is formed over the backside via. FIG. 25 illustrates a cross-sectional view according to some embodiments of block S111

FIGS. 27A-31 illustrate cross-sectional views of various stages for intermediate stages in formation of an integrated circuit having multi-gate devices, in accordance with some embodiments of the present disclosure. The steps shown in FIGS. 27A-31 are also reflected schematically in the process flow shown in FIG. 32. It is understood that additional operations can be provided before, during, and after the processes shown by FIGS. 27A-31, and some of the operations described below can be replaced or eliminated, for additional embodiments of the method. The order of the operations/processes may be interchangeable.

FIGS. 27A, 28A, 29A, 30A and 31 are cross-sectional views of intermediate stages of fabricating an integrated circuit structure 100a along a first cut (e.g., cut X-X in FIG. 4A), which is along a lengthwise direction of channels. FIGS. 27B, 28B, 29B and 30B are cross-sectional views of intermediate stages of fabricating the integrated circuit structure 100a along a second cut (e.g., cut Y1-Y1 in FIG. 4A), which is in the source region and perpendicular to the lengthwise direction of channels. FIGS. 27C, 28C, 29C and 30C are cross-sectional views of intermediate stages of fabricating the integrated circuit structure 100a along a third cut (e.g., cut Y2-Y2 in FIG. 4A), which is in the drain region and perpendicular to the lengthwise direction of channels. FIG. 28D is a top view of an intermediate stage of fabricating the integrated circuit structure 100a according to some embodiments of the present disclosure.

Figure 27A:
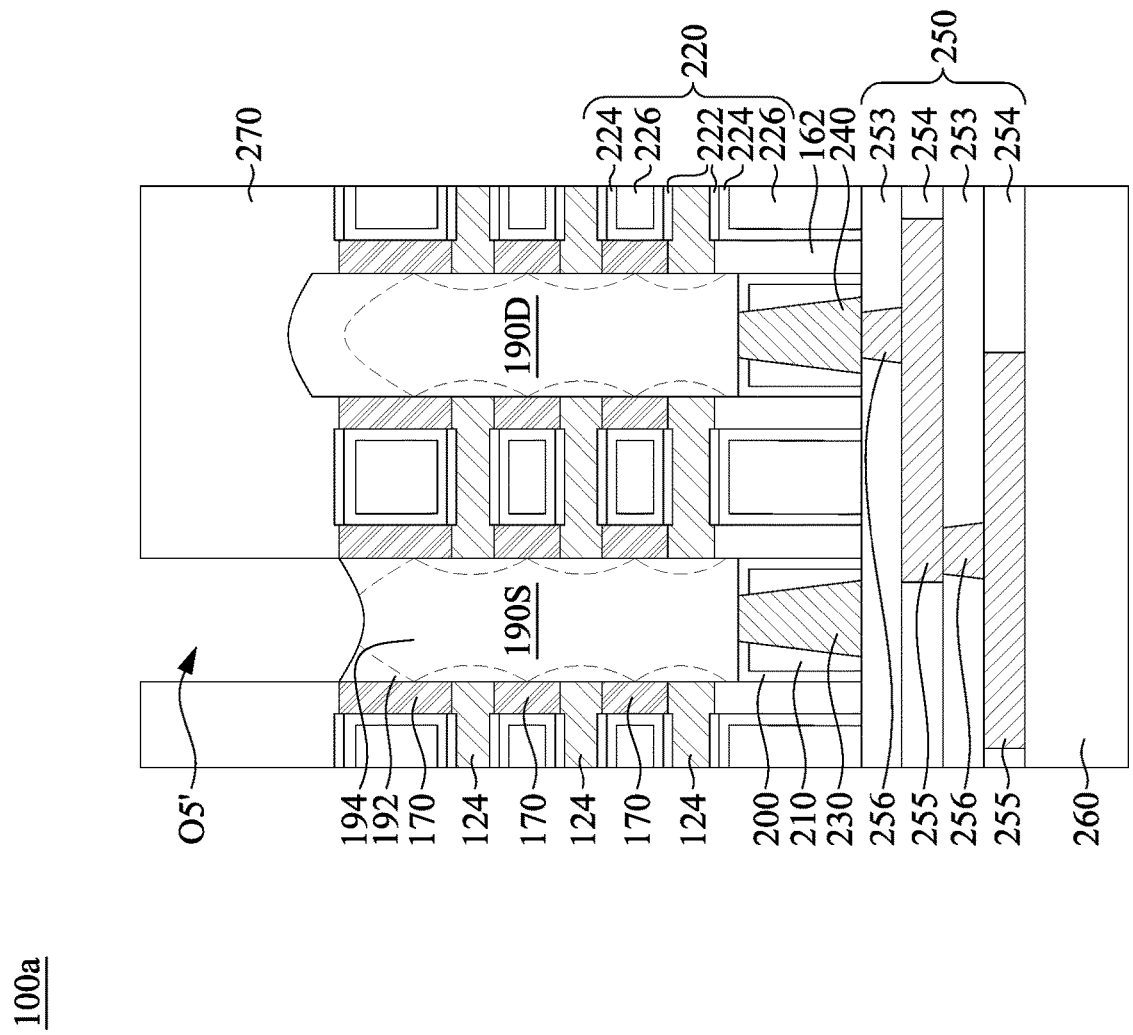
FIGS. 27A, 28A, 29A, 30A and 31 are cross-sectional views of intermediate stages of fabricating an integrated circuit structure along a first cut, which is along a lengthwise direction of channels.
Figure 27C:
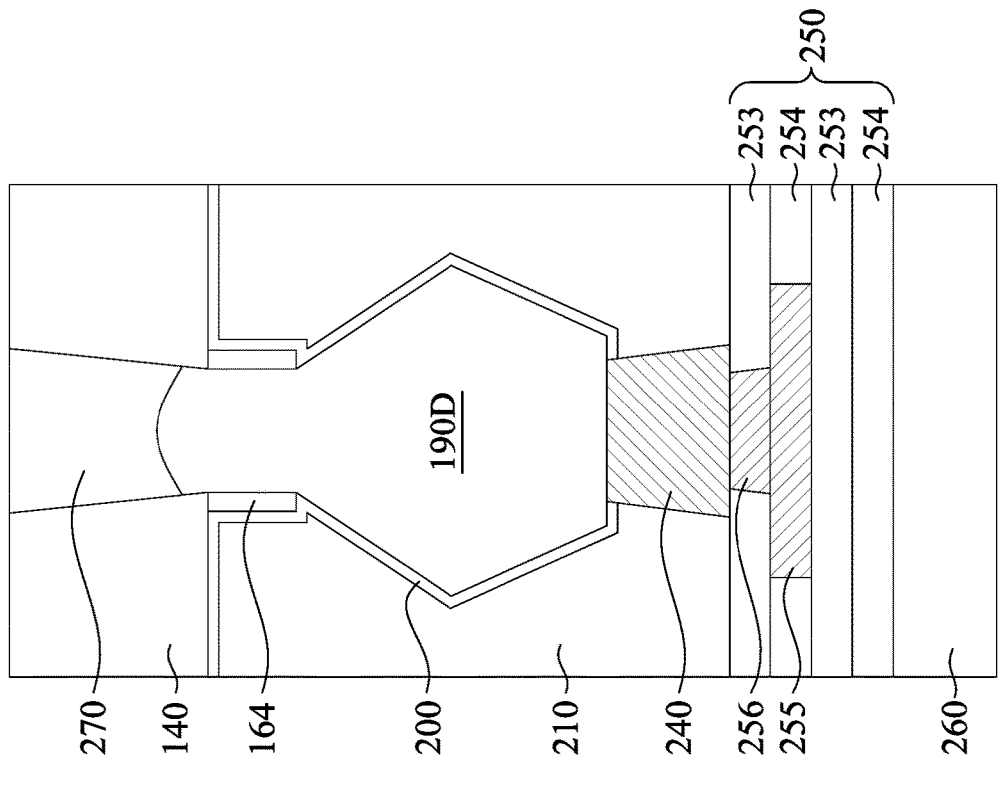
Figure 27B:
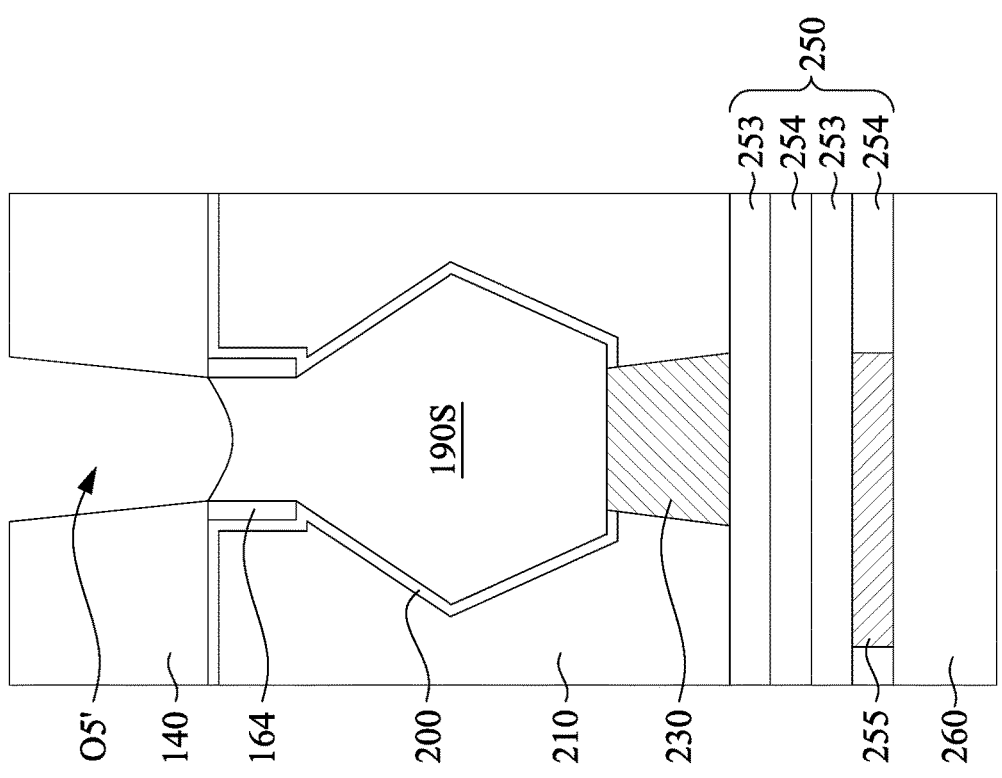

FIGS. 27A-27C illustrate some embodiments of a step subsequent to the step of FIGS. 20A-20C. In greater detail, after the backside dielectric layer 270 is formed as described previously with respect to FIGS. 20A-20C, the sacrificial epitaxial plug 180 removed to form a backside via opening O5' by using suitable etching process. The resultant structure is illustrated in FIGS. 27A-27C. Details about formation of the backside via opening O5' are discussed previously with respect to formation of the backside via opening O5 as illustrated in FIGS. 21A-21C, and thus it is not repeated herein for the sake of brevity.

Next, a via spacer 290' is formed to line sidewalls of the backside via opening O5', as illustrated in FIGS. 28A-28D. Because the via spacer 290' is formed before forming an epitaxial regrowth layer on the backside of the source epitaxial structure 190S, the via spacer 290' is in contact with the backside of the source epitaxial structure 190S. Detail materials and formation processes of the via spacer 290' are discussed previously with respect to that of the via spacer 290 as illustrated in FIGS. 23A-23D, and thus they are not repeated for the sake of brevity.

Figure 29A:
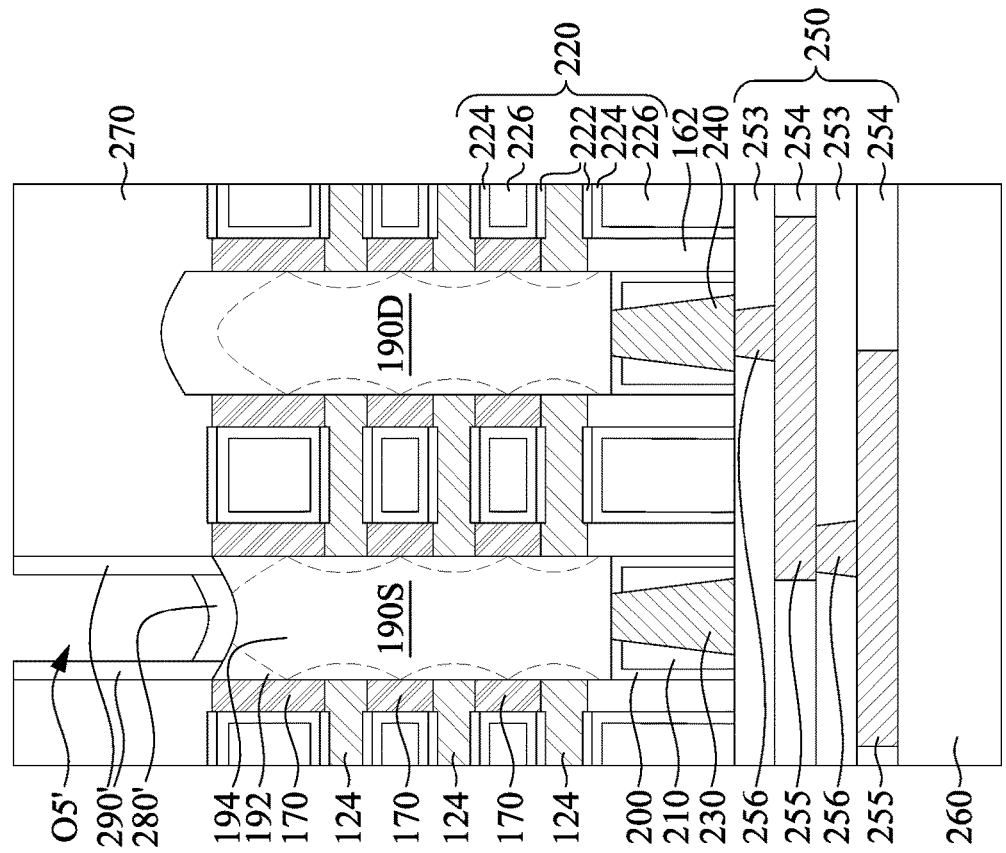
Figure 29C:
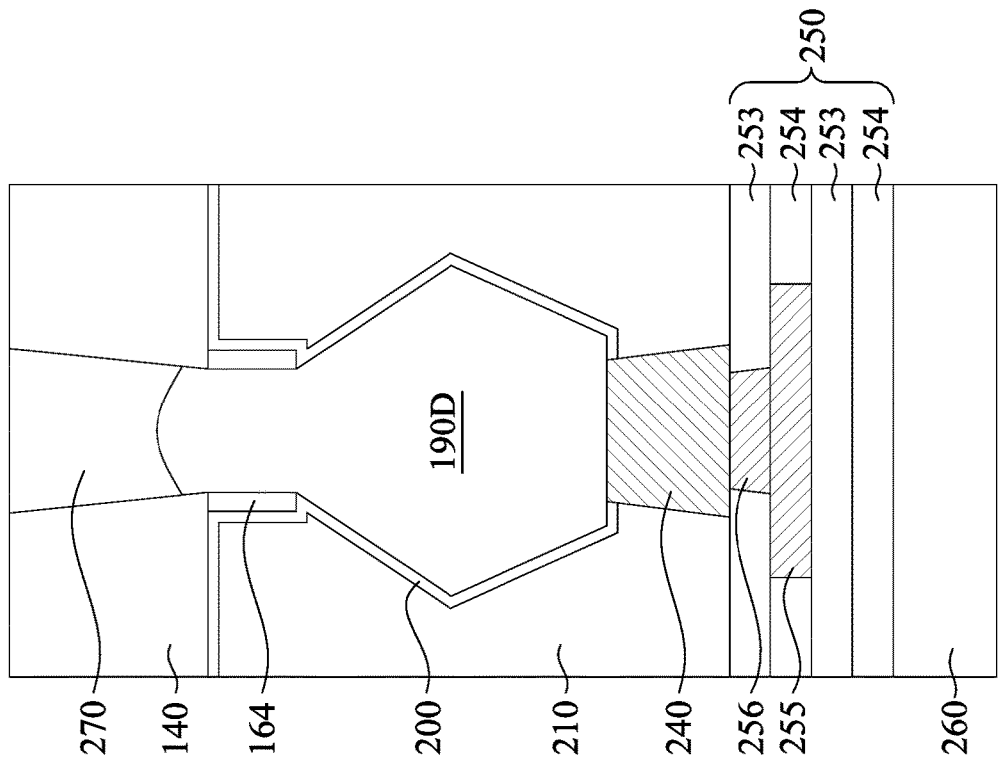
Figure 29B:
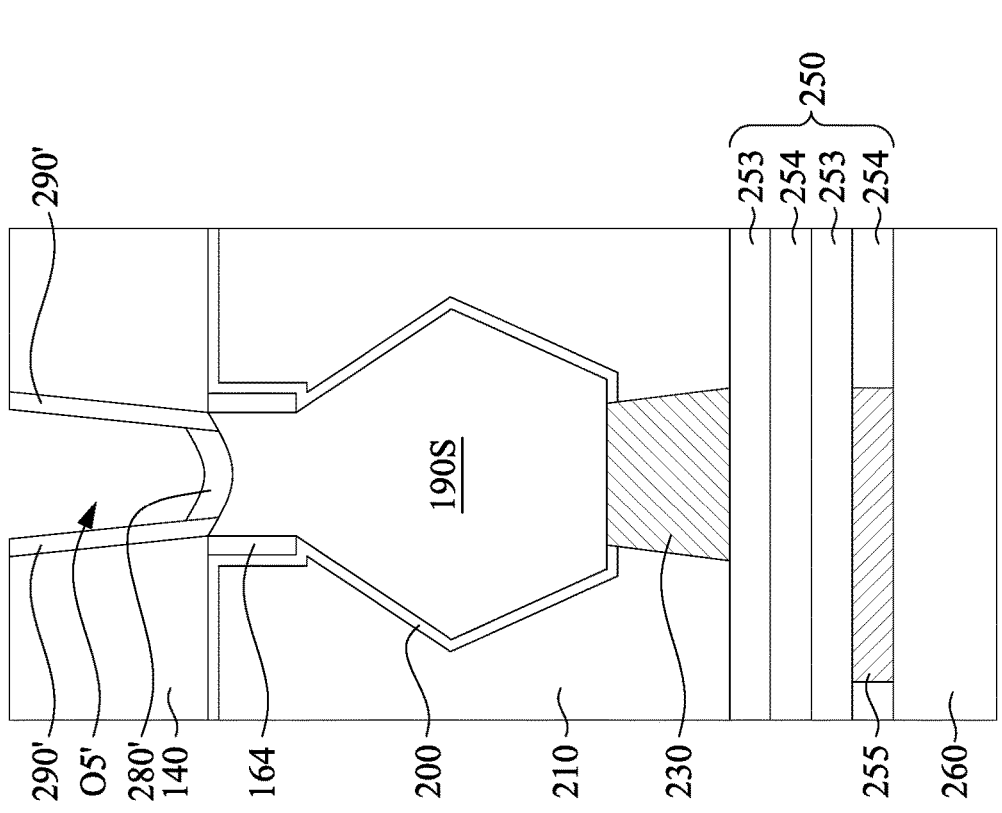

After formation of the via spacer 290' is formed to line sidewalls of the backside via opening O5', an epitaxial regrowth layer 280' is in the backside via opening O5', as illustrated in FIGS. 29A-29C. In this way, the via spacer 290' can limit the epitaxial regrowth layer 280' to a desired region in the backside via opening O5'. In some embodiments, the via spacer 290' laterally surrounds the epitaxial regrowth layer 280'. Detail materials and formation processes of the epitaxial regrowth layer 280' are discussed previously with respect to that of the epitaxial regrowth layer 28o as illustrated in FIGS. 22A-22C, and thus they are not repeated for the sake of brevity.

Figure 30A:
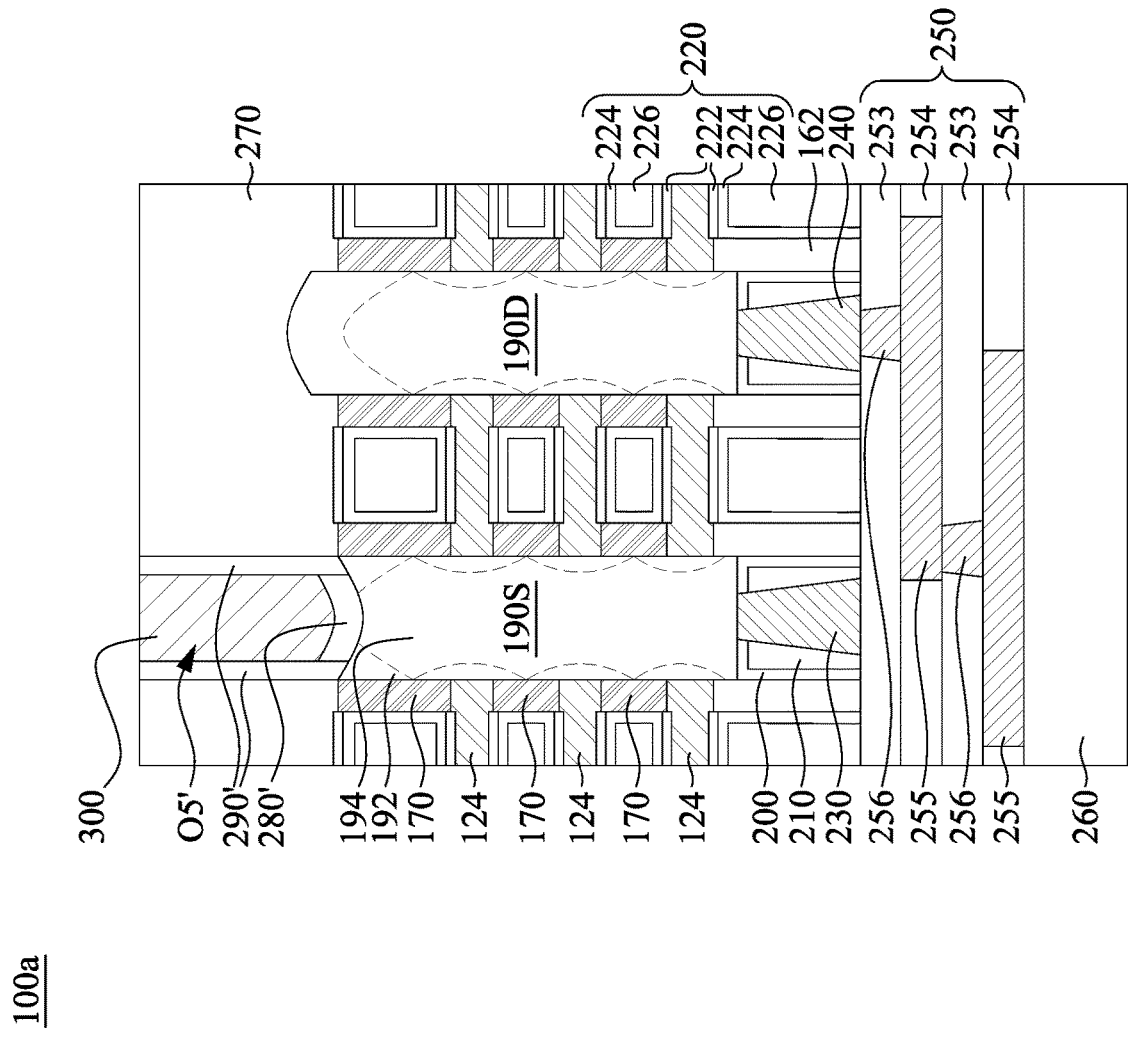
Figure 31:
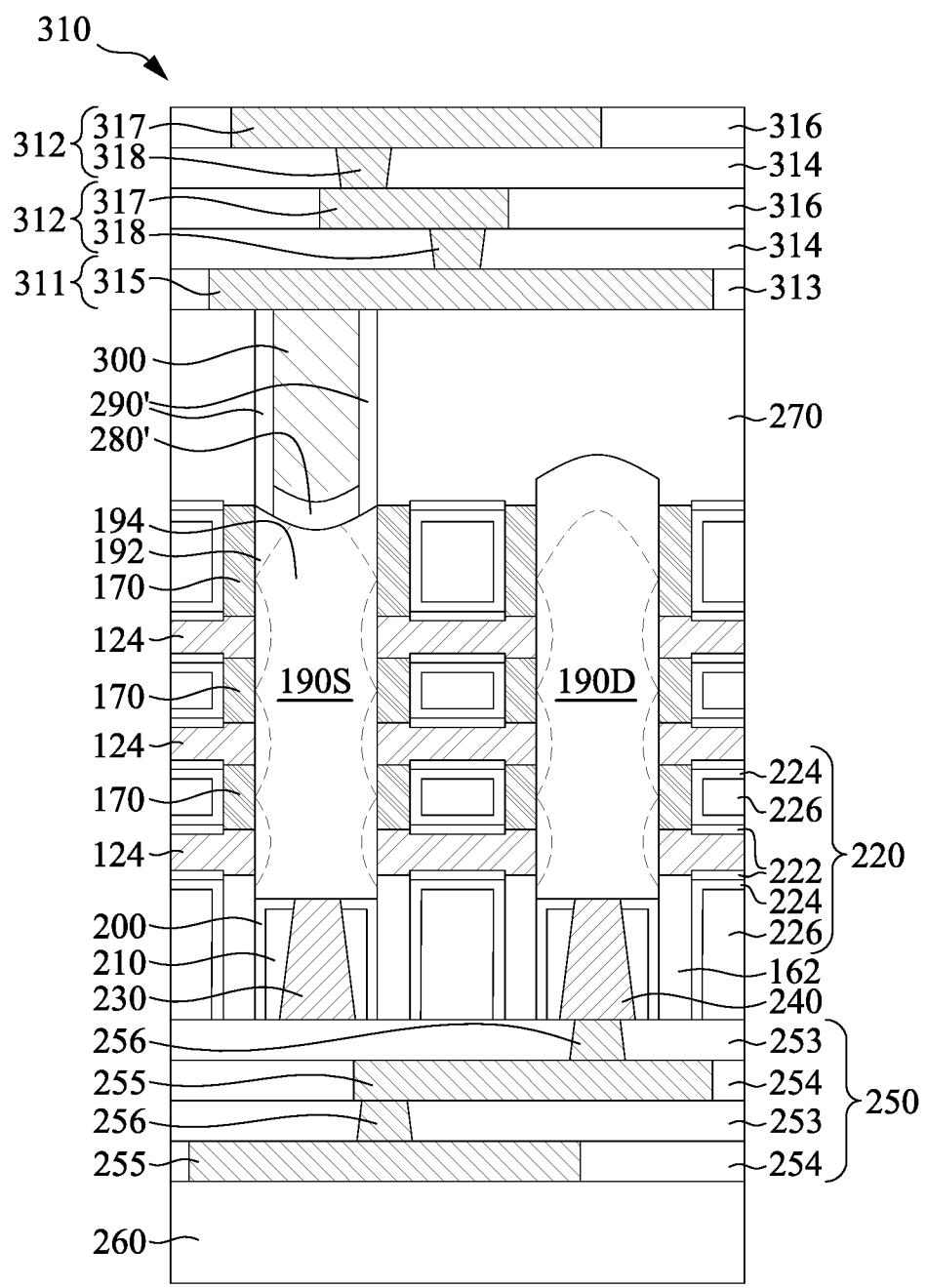

Next, a backside via 300 is formed to fill a remainder of the backside via opening O5', as illustrated in FIGS. 30A-30C. Subsequently, a backside MLI structure 310 is formed over the backside via 300, as illustrated in FIG. 31. Detail materials and formation processes of the backside via 300 and backside MLI structure 310 are discussed previously with respect to in FIGS. 24A-24C and 25, and thus they are not repeated for the sake of brevity.

Figure 32:
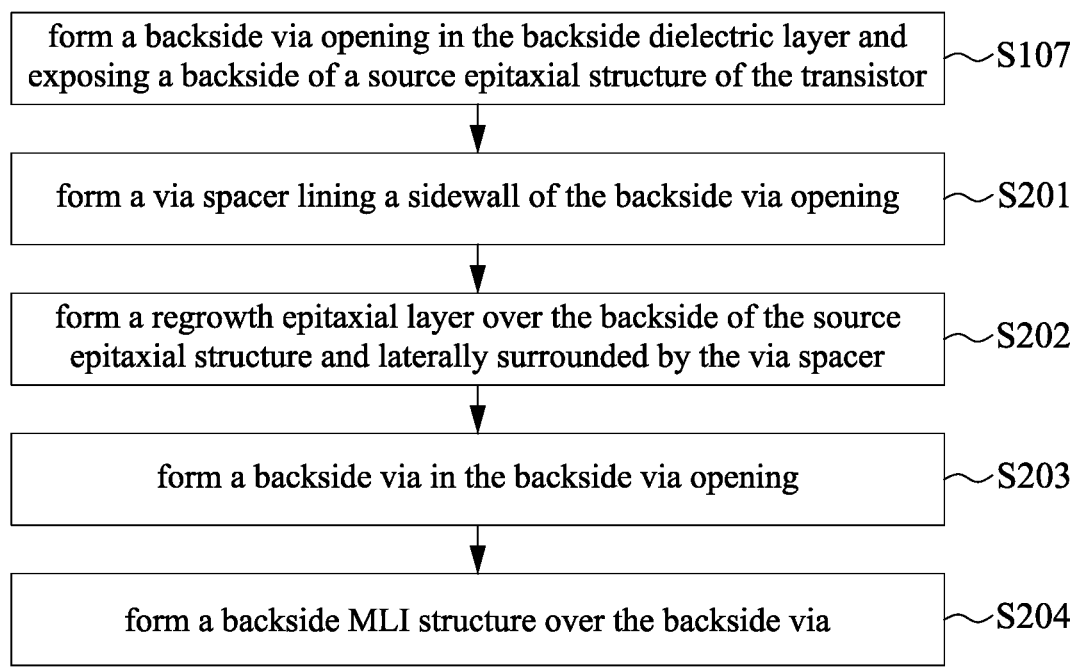
FIG. 32 is a flow chart illustrating a method of forming an integrated circuit structure in accordance with some embodiments of the present disclosure.

FIG. 32 is a flow chart illustrating a method M2 of forming an integrated circuit structure in accordance with some embodiments of the present disclosure. Although the method M2 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The method M2 may branch from block S107 of previously described method M1, and thus the method M2 may include all previous blocks (i.e., blocks S101-S106) of the method M1. FIGS. 27A-27C illustrate cross-sectional views according to some embodiments of block S107.

Figure 28A:
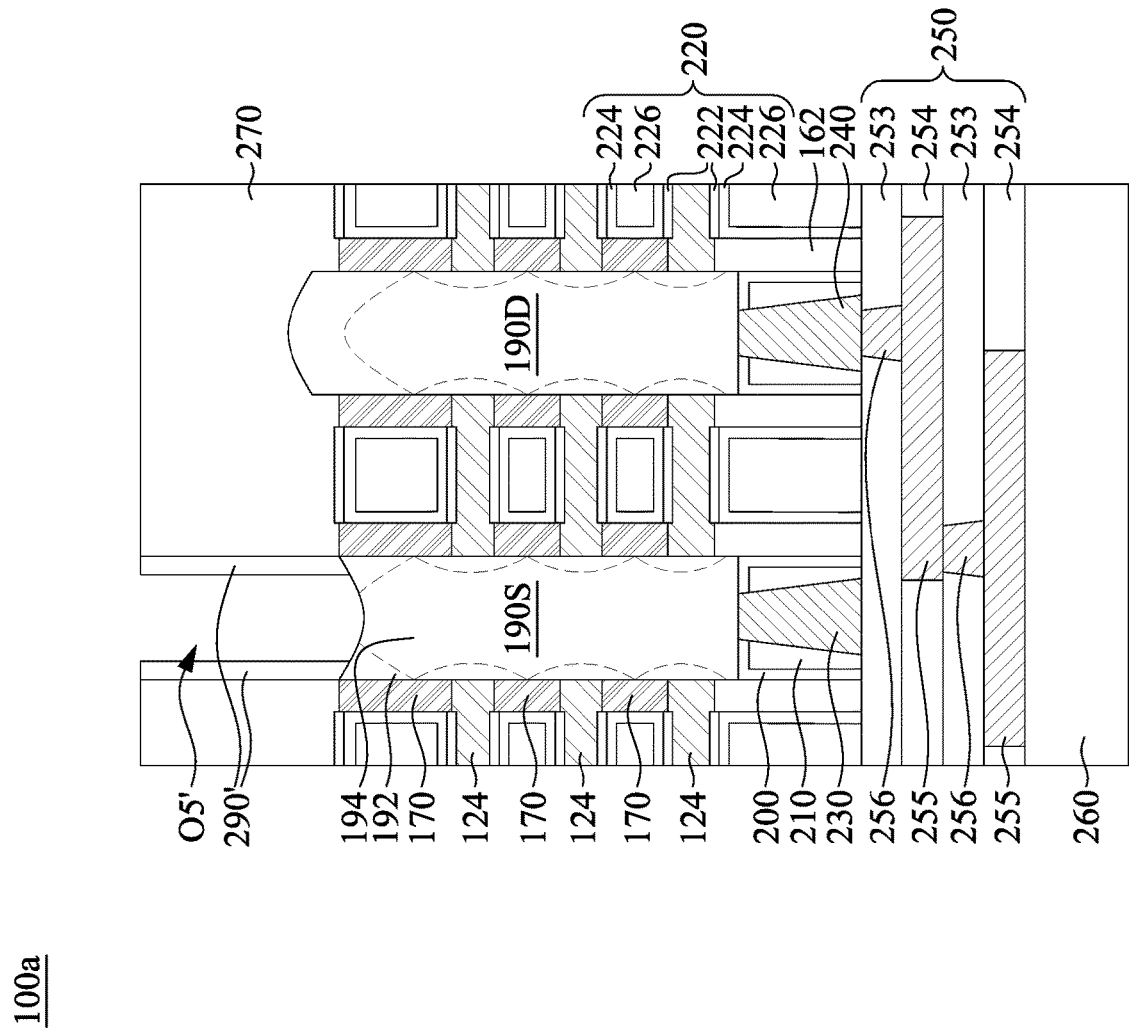
Figure 28C:
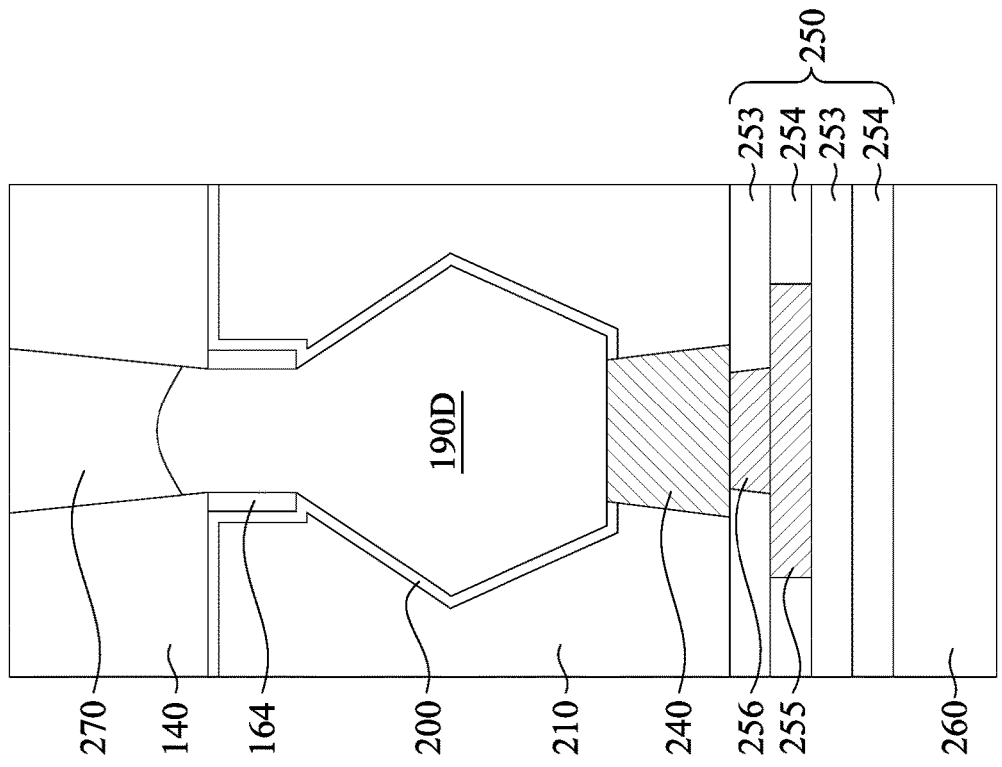
Figure 28B:
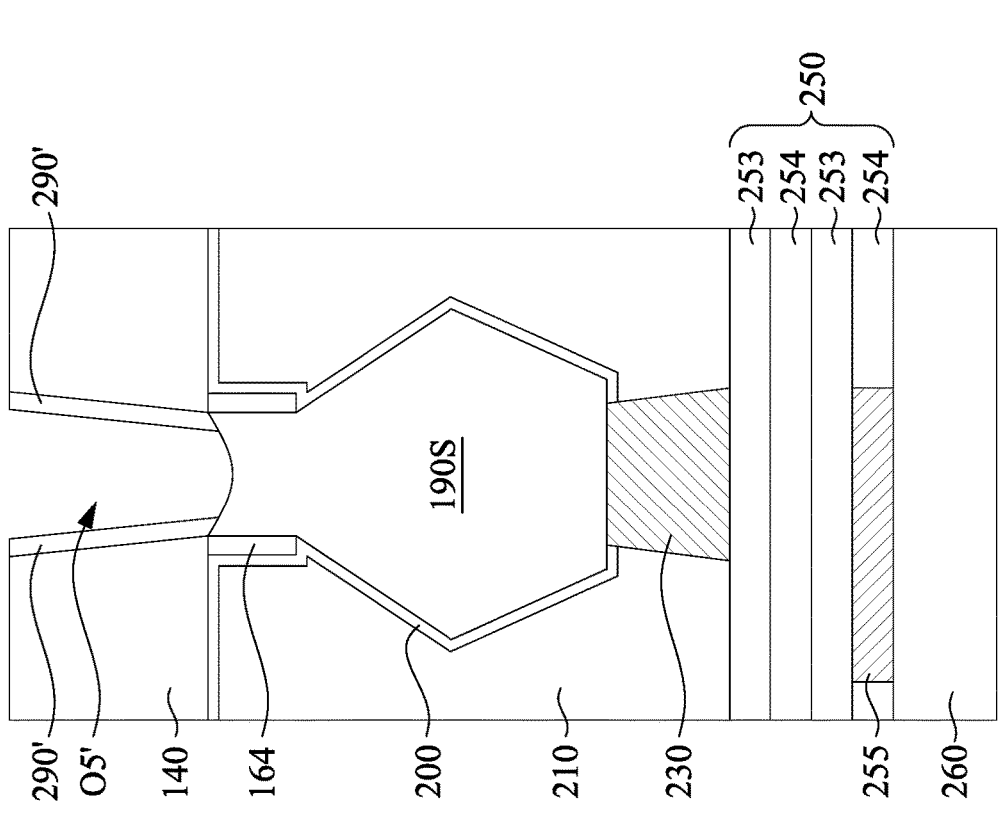
Figure 28D:
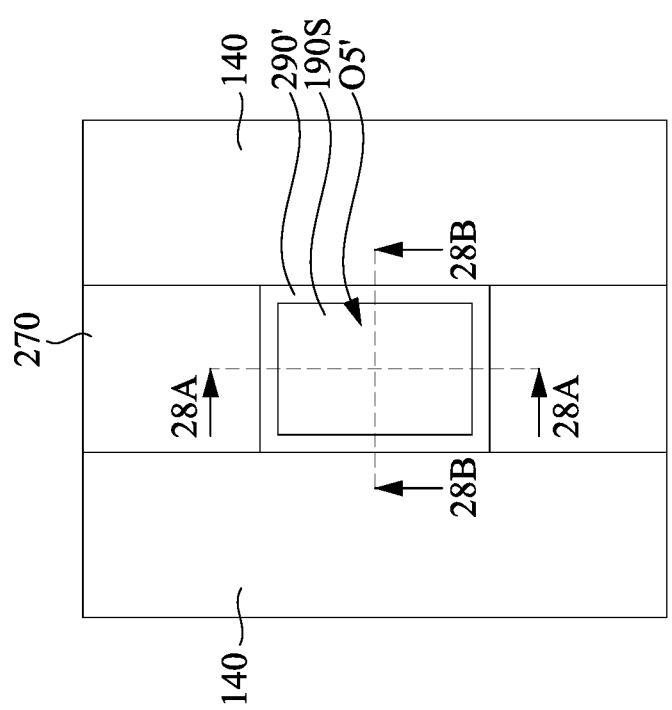
FIG. 28D is a top view of an intermediate stage of fabricating the integrated circuit structure according to some embodiments of the present disclosure.

At block S201 of the method M2, a via spacer is formed to line sidewalls of the backside via opening. FIGS. 28A-28C illustrate cross-sectional views according to some embodiments of block S201.

At block S202 of the method M2, an epitaxial regrowth layer is formed over the backside of the source epitaxial structure and laterally surrounded by the via spacer. FIGS. 29A-29C illustrate cross-sectional views according to some embodiments of block S202.

At block S203 of the method M2, a backside via is formed in the backside via opening. FIGS. 30A-30C illustrate cross-sectional views according to some embodiments of block S203.

At block S204 of the method M2, a backside MLI structure is formed over the backside via. FIG. 31 illustrates a cross-sectional view according to some embodiments of block S204.

FIGS. 33A-36 illustrate cross-sectional views of various stages for intermediate stages in formation of an integrated circuit having multi-gate devices, in accordance with some embodiments of the present disclosure. The steps shown in FIGS. 33A-36 are also reflected schematically in the process flow shown in FIG. 37. It is understood that additional operations can be provided before, during, and after the processes shown by FIGS. 33A-36, and some of the operations described below can be replaced or eliminated, for additional embodiments of the method. The order of the operations/processes may be interchangeable.

Figure 33A:
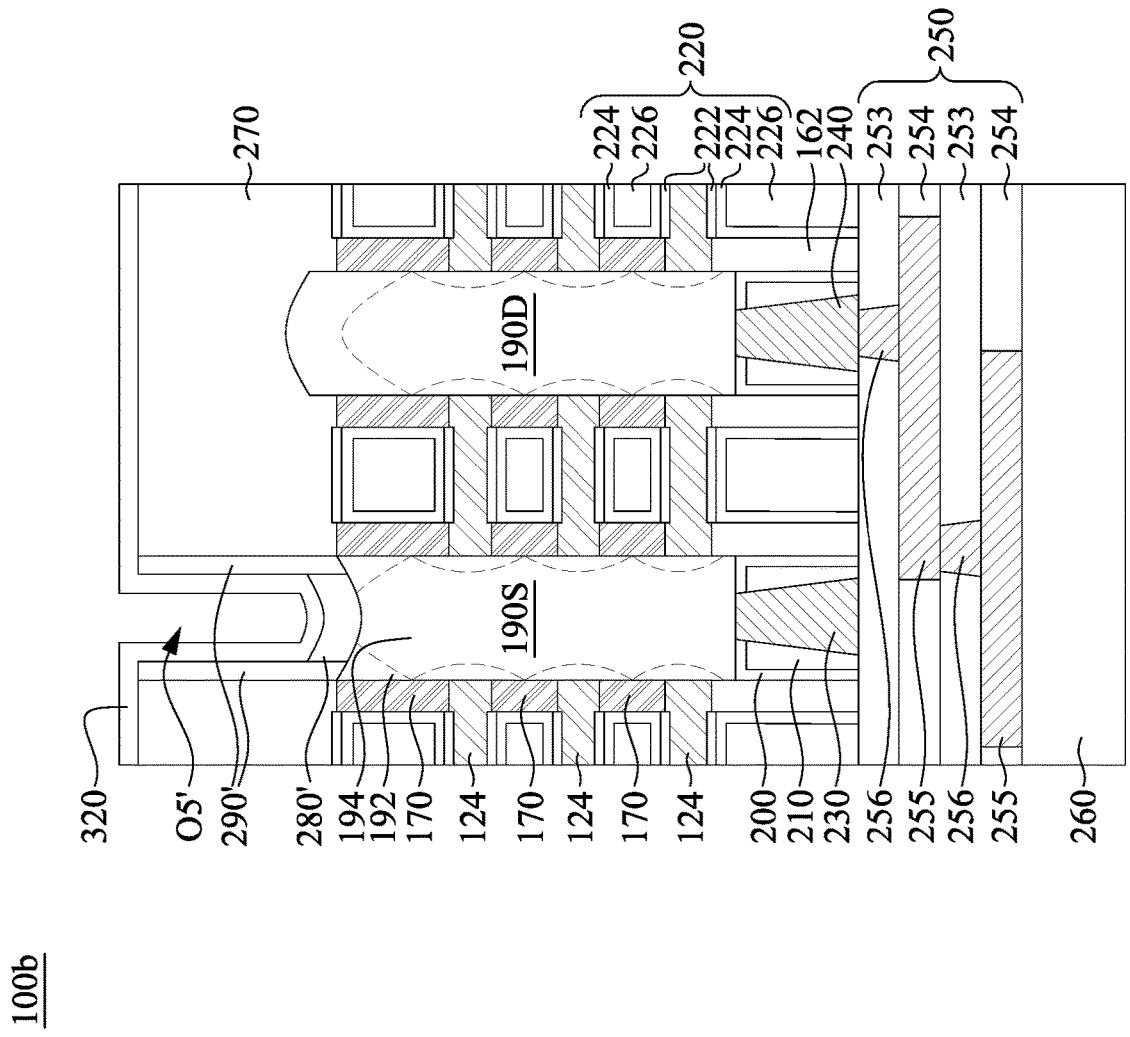
FIGS. 33A, 34A, 35A and 36 are cross-sectional views of intermediate stages of fabricating an integrated circuit structure along a first cut, which is along a lengthwise direction of channels.
Figure 34A:
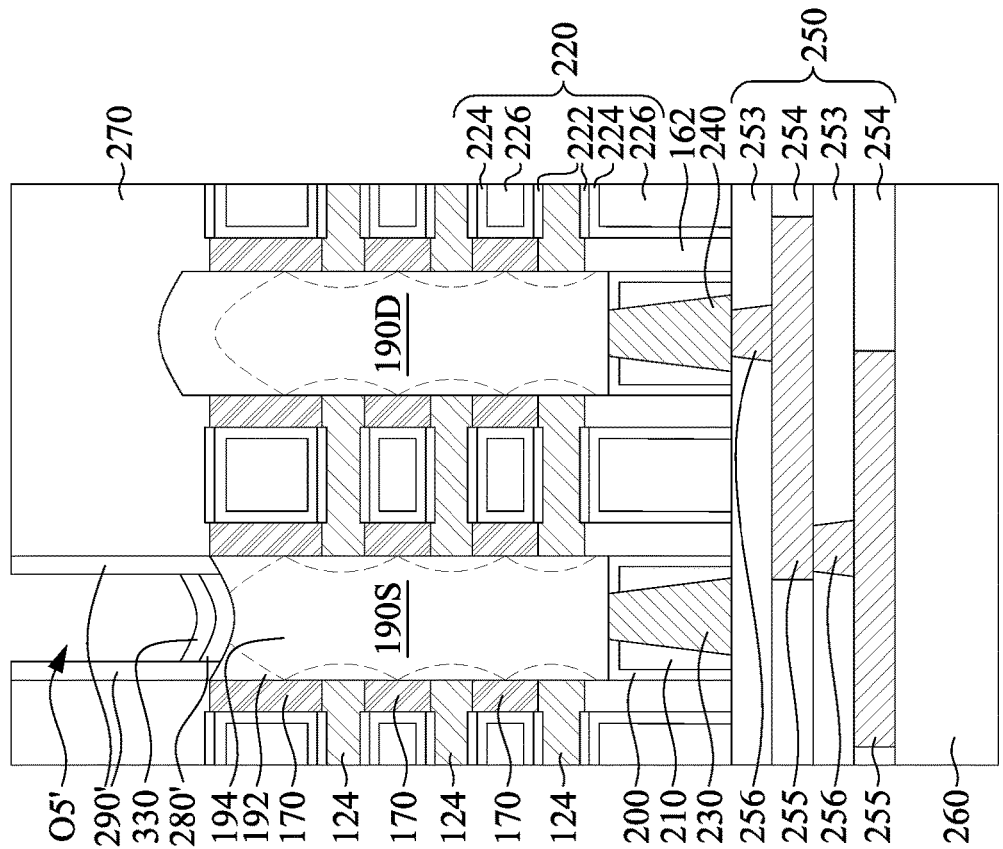
Figure 34C:
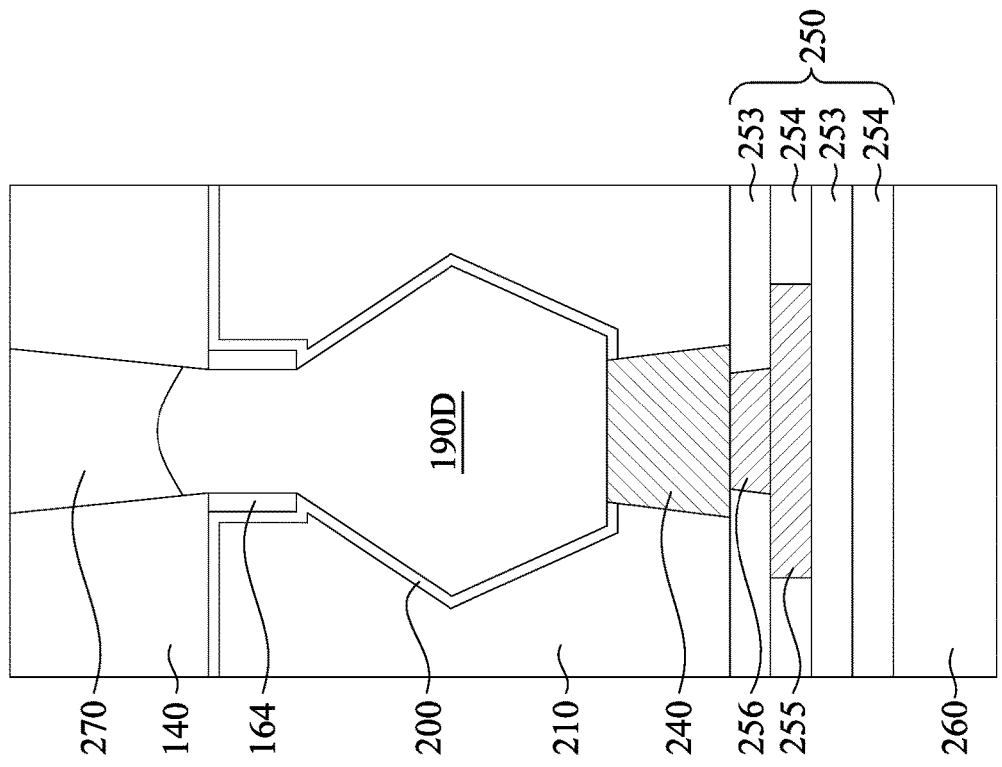
Figure 34B:
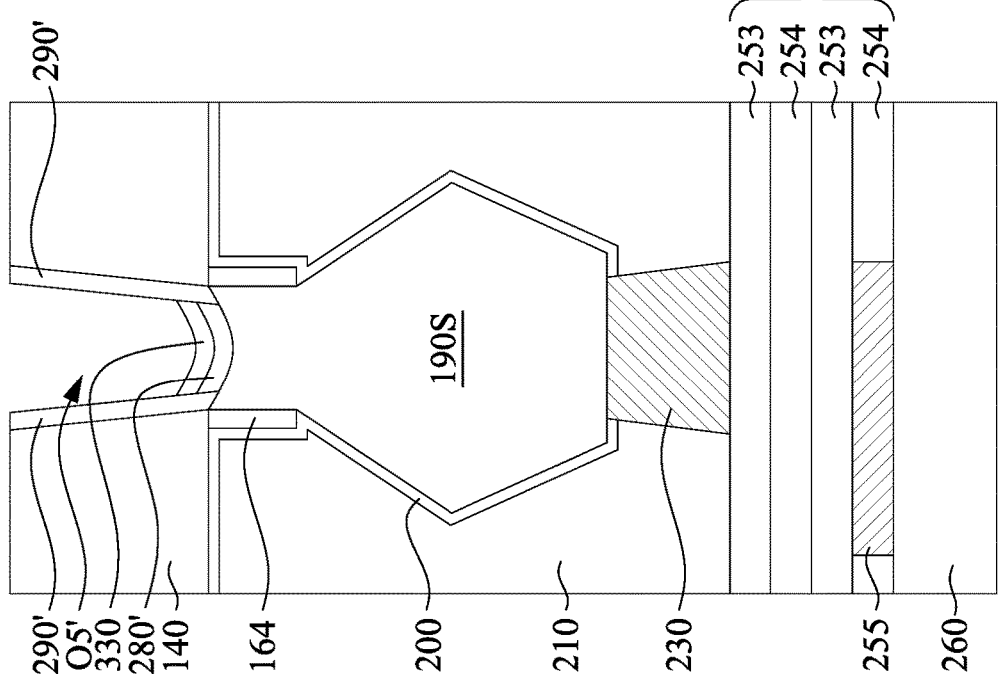

FIGS. 33A, 34A, 35A and 36 are cross-sectional views of intermediate stages of fabricating an integrated circuit structure 100b along a first cut (e.g., cut X-X in FIG. 4A), which is along a lengthwise direction of channels. FIGS. 33B, 34B and 35B are cross-sectional views of intermediate stages of fabricating the integrated circuit structure 100b along a second cut (e.g., cut Y1-Y1 in FIG. 4A), which is in the source region and perpendicular to the lengthwise direction of channels. FIGS. 33C, 34C and 35C are cross-sectional views of intermediate stages of fabricating the integrated circuit structure 100b along a third cut (e.g., cut Y2-Y2 in FIG. 4A), which is in the drain region and perpendicular to the lengthwise direction of channels.

FIGS. 33A-33C illustrate some embodiments of a step subsequent to the step of FIGS. 29A-29C. In greater detail, after the epitaxial regrowth layer 280' is formed in the backside via opening O5' and laterally surrounded by the via spacer 290', a metal layer 320 is formed over the carrier substrate 260 by using suitable deposition techniques, such as CVD, PVD, ALD, the like or combinations thereof. The metal layer 320 includes a metal capable of reacting with semiconductor materials of the underlying epitaxial regrowth layer 280', so as to form a silicide region in the epitaxial regrowth layer 280' in subsequent processing. For example, the metal layer 320 includes nickel, cobalt, titanium, tantalum, platinum, tungsten, other noble metals, other refractory metals, rare earth metals or their alloys.

After deposition of the metal layer 320, an anneal process is performed such that the metal layer 320 reacts with silicon (and germanium if present) in the epitaxial regrowth layer 280' to form a metal silicide (and germanide if germanium present in epitaxial regrowth layer 280') region 330 in the epitaxial regrowth layer 280', and then non-reacted portions of the metal layer 320 are removed by an etching process. The resultant structure is illustrated in FIGS. 34A-34C. In some embodiments, the silicide region 330 includes, for example, titanium silicide, cobalt silicide, nickel silicide, the like or combinations thereof. As discussed previously, the via spacer 290' and the backside dielectric layer 270 have different etch selectivity, and thus the etching process of removing non-reacted metal layer 320 can use an etchant that etches the via spacer 290' at a slower etch rate than it etches the backside dielectric layer 270, which in turn prevents the backside via opening O5' from being unintentionally expanded due to removal of non-reacted metal layer 320. Stated differently, the via spacer 290' has a higher etch resistance to the etching process of removing non-reacted metal layer 320 than that of the backside dielectric layer 270.

Figure 35A:
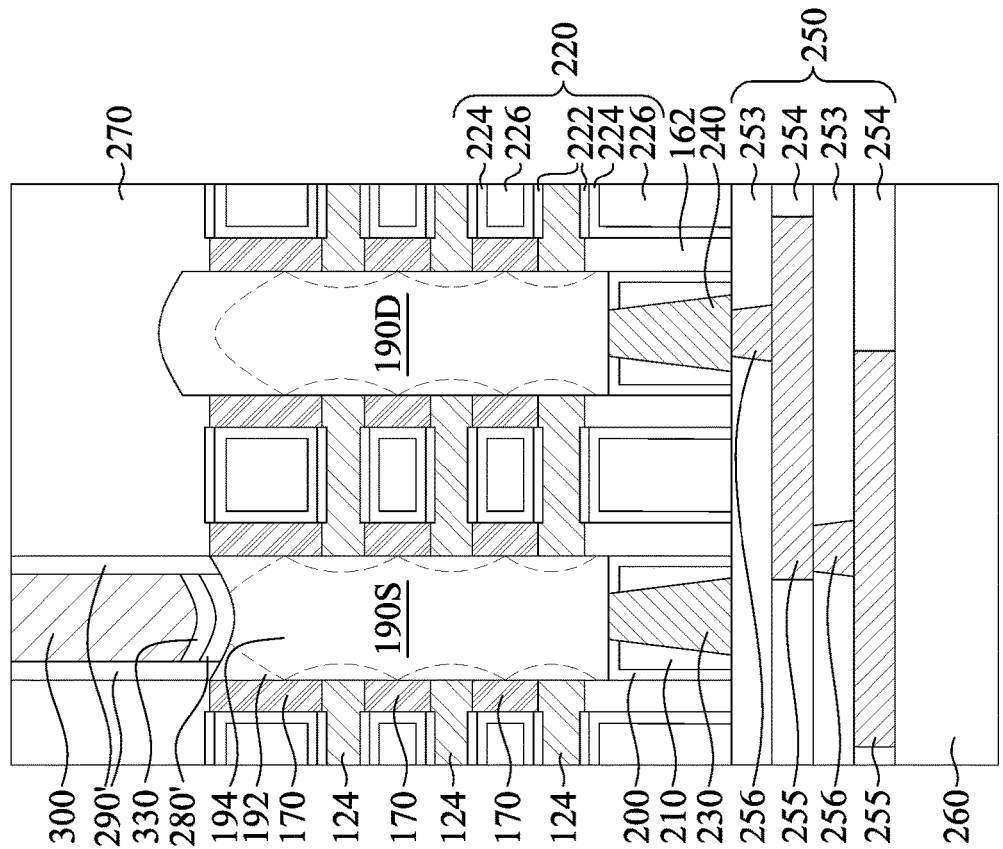
Figure 35C:
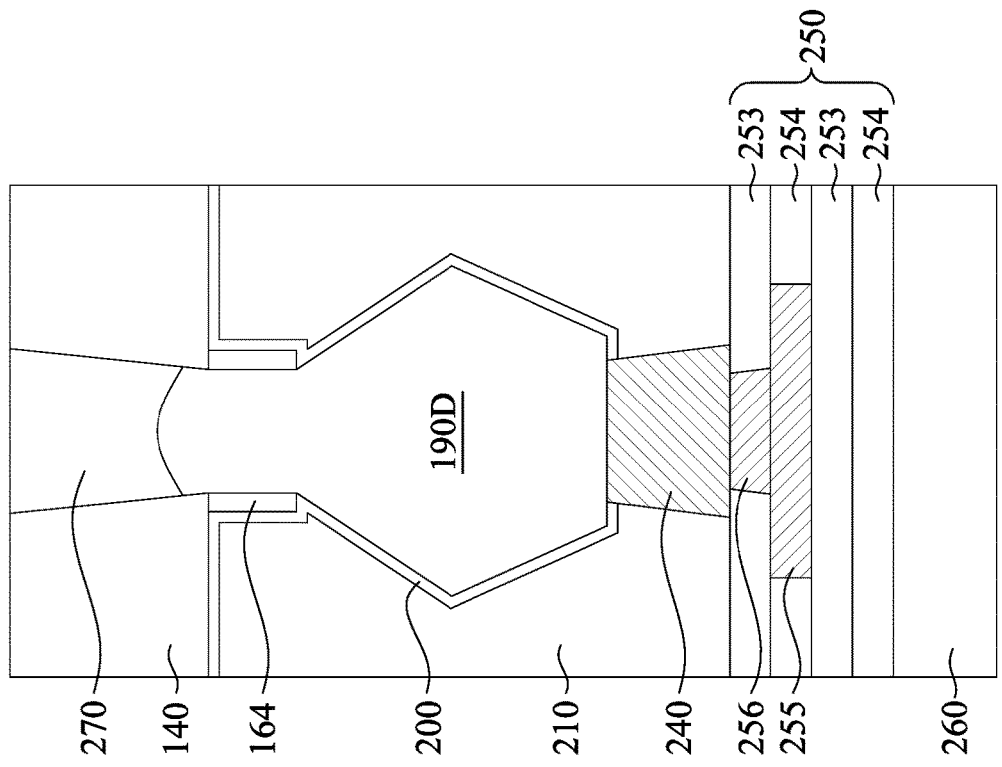
Figure 35B:
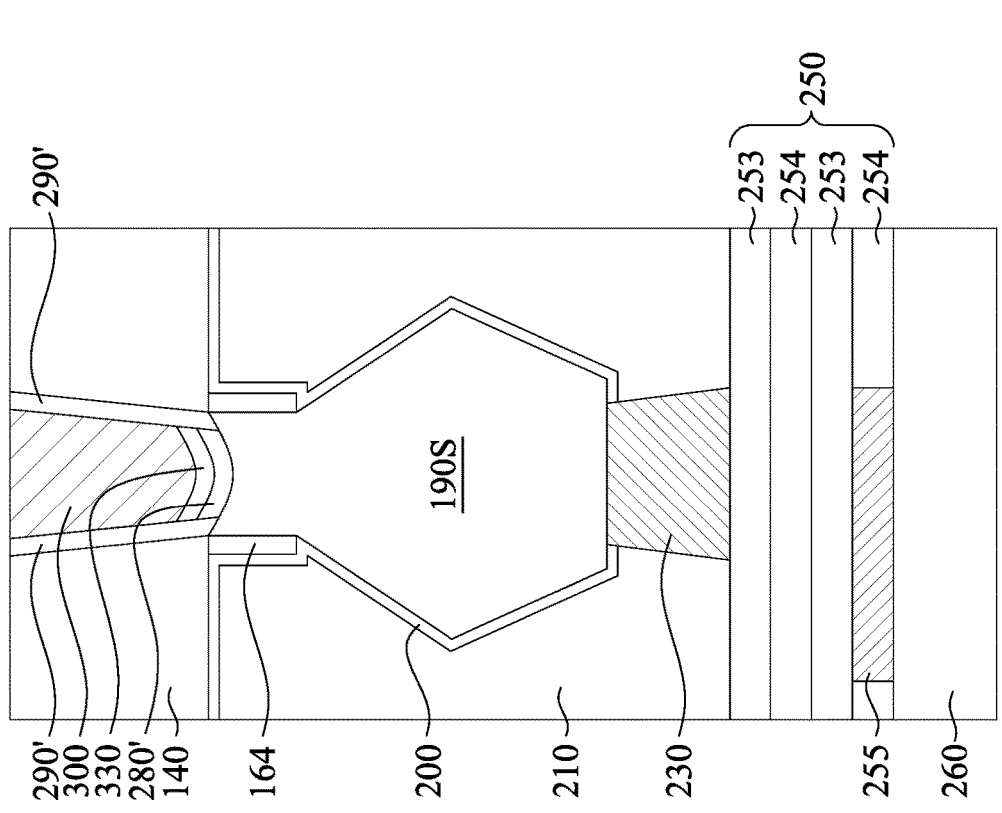
Figure 36:
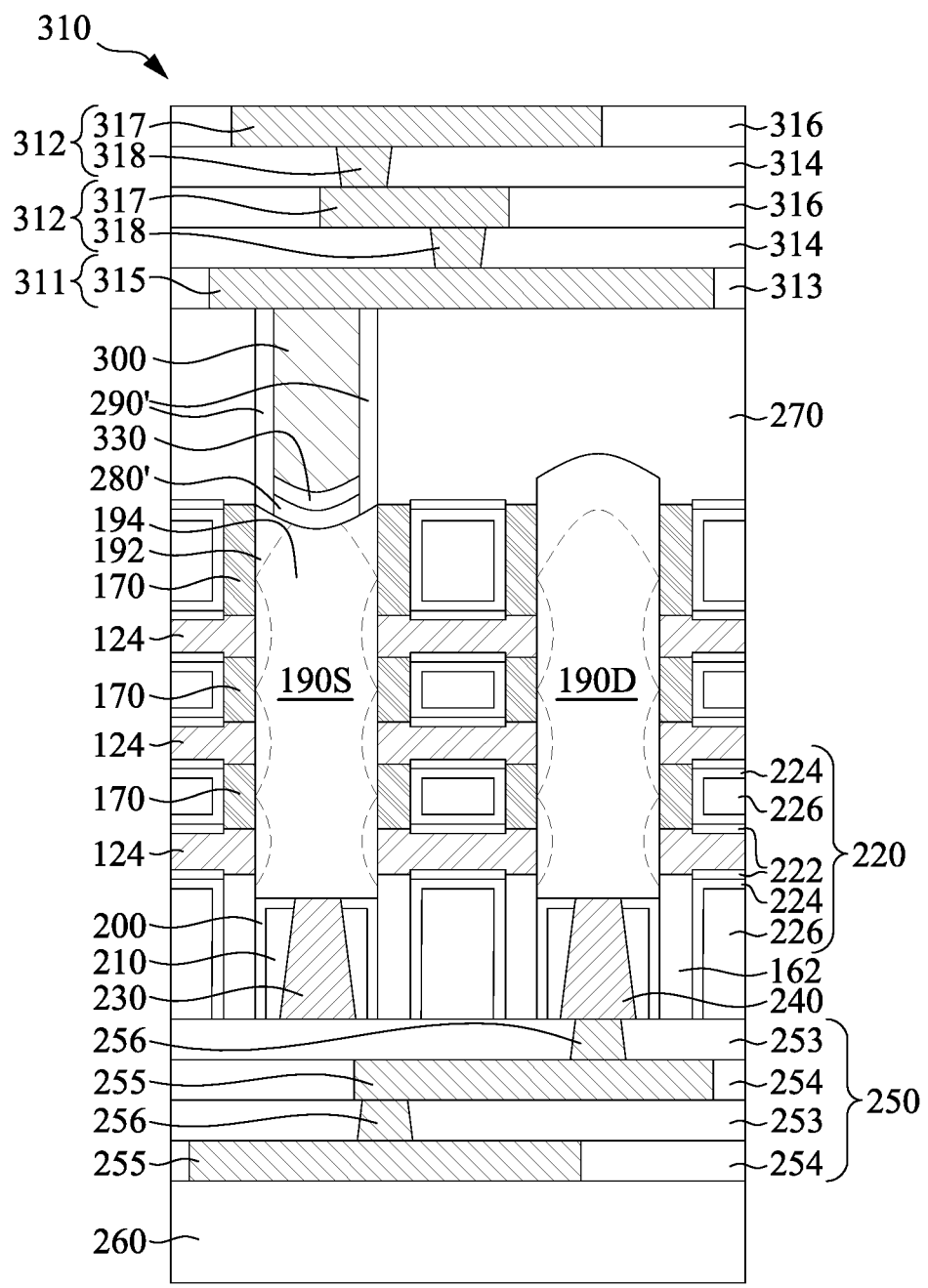

Next, a backside via 300 is formed to fill a remainder of the backside via opening O5', as illustrated in FIGS. 35A-35C. Subsequently, a backside MLI structure 310 is formed over the backside via 300, as illustrated in FIG. 36. Detail materials and formation processes of the backside via 300 and backside MLI structure 310 are discussed previously with respect to in FIGS. 24A-24C and 25, and thus they are not repeated for the sake of brevity. As illustrated in FIG. 36, the silicide region 330 is between the epitaxial regrowth layer 280' and the backside via 300, and the via spacer 290' extends through the backside dielectric layer 270 and laterally surrounds the silicide region 330.

Figure 37:
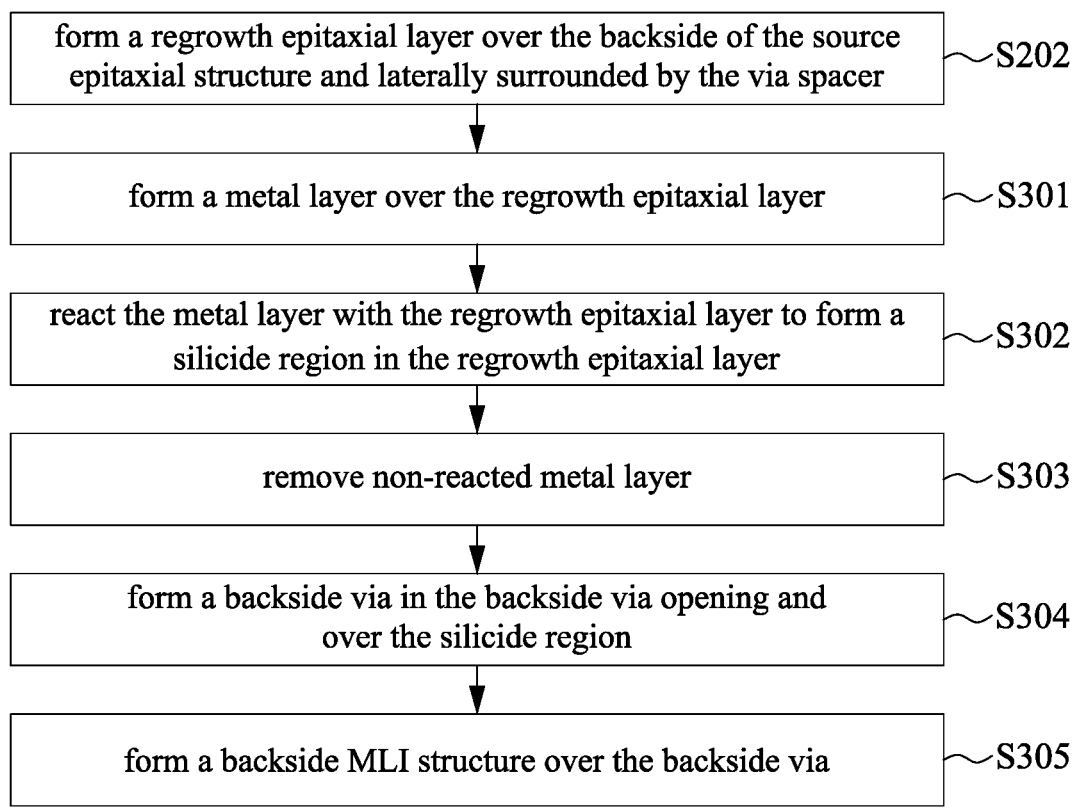
FIG. 37 is a flow chart illustrating a method of forming an integrated circuit structure in accordance with some embodiments of the present disclosure.

FIG. 37 is a flow chart illustrating a method M3 of forming an integrated circuit structure in accordance with some embodiments of the present disclosure. Although the method M3 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The method M3 may branch from block S202 of previously described method M2, and thus the method M3 may include all previous blocks of the method M2 (i.e., block S107 and S201 of the method M2). FIGS. 29A-29C illustrate cross-sectional views according to some embodiments of block S202.

At block S301 of the method M3, a metal layer is formed over the epitaxial regrowth layer. FIGS. 33A-33C illustrate cross-sectional views according to some embodiments of block S301.

At block S302 of the method M3, the metal layer is reacted with the epitaxial regrowth layer to form a silicide region in the epitaxial regrowth layer. At block S303 of the method M3, the non-reacted metal layer is removed. FIGS. 34A-34C illustrate cross-sectional views according to some embodiments of blocks S302 and S303.

At block S304 of the method M3, a backside via is formed in the backside via opening and over the silicide region. FIGS. 35A-35C illustrate cross-sectional views according to some embodiments of block S304.

At block S305 of the method M3, a backside MLI structure is formed over the backside via. FIG. 36 illustrates a cross-sectional view according to some embodiments of block S305.

FIGS. 38A-41 illustrate cross-sectional views of various stages for intermediate stages in formation of an integrated circuit having multi-gate devices, in accordance with some embodiments of the present disclosure. The steps shown in FIGS. 38A-41 are also reflected schematically in the process flow shown in FIG. 42. It is understood that additional operations can be provided before, during, and after the processes shown by FIGS. 38A-41, and some of the operations described below can be replaced or eliminated, for additional embodiments of the method. The order of the operations/processes may be interchangeable.

Figure 38A:
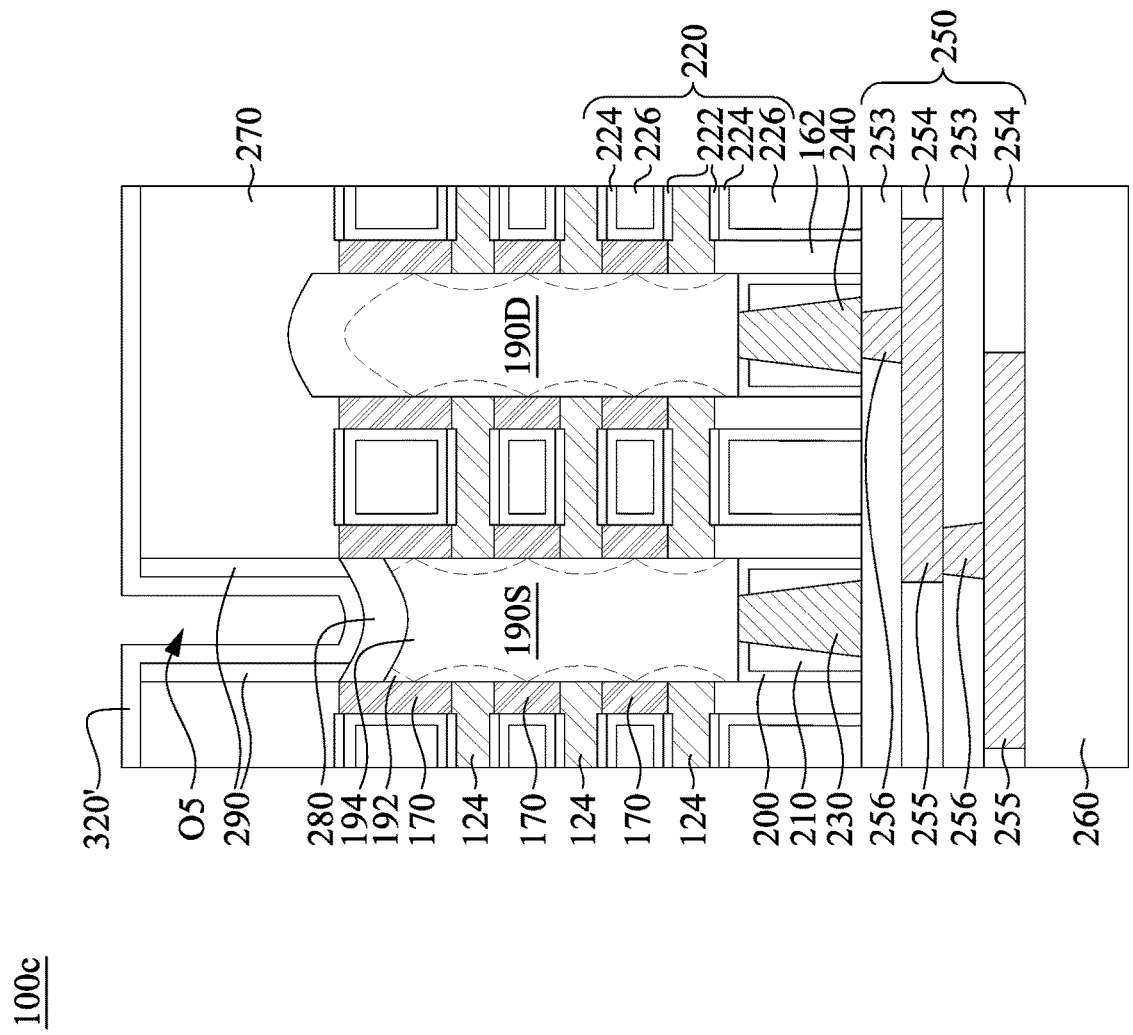
FIGS. 38A, 39A, 40A and 41 are cross-sectional views of intermediate stages of fabricating an integrated circuit structure along a first cut, which is along a lengthwise direction of channels.
Figure 39A:
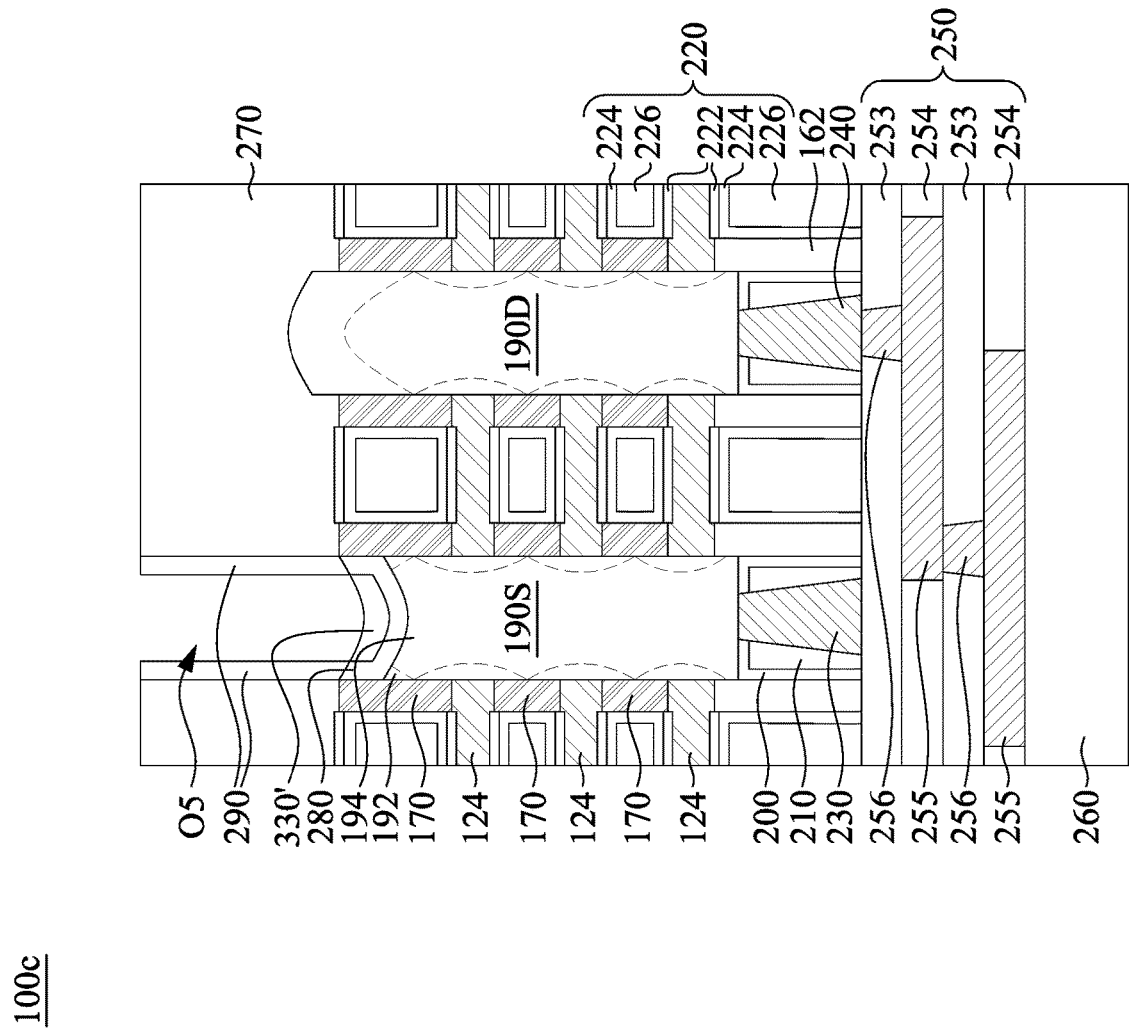
Figure 39C:
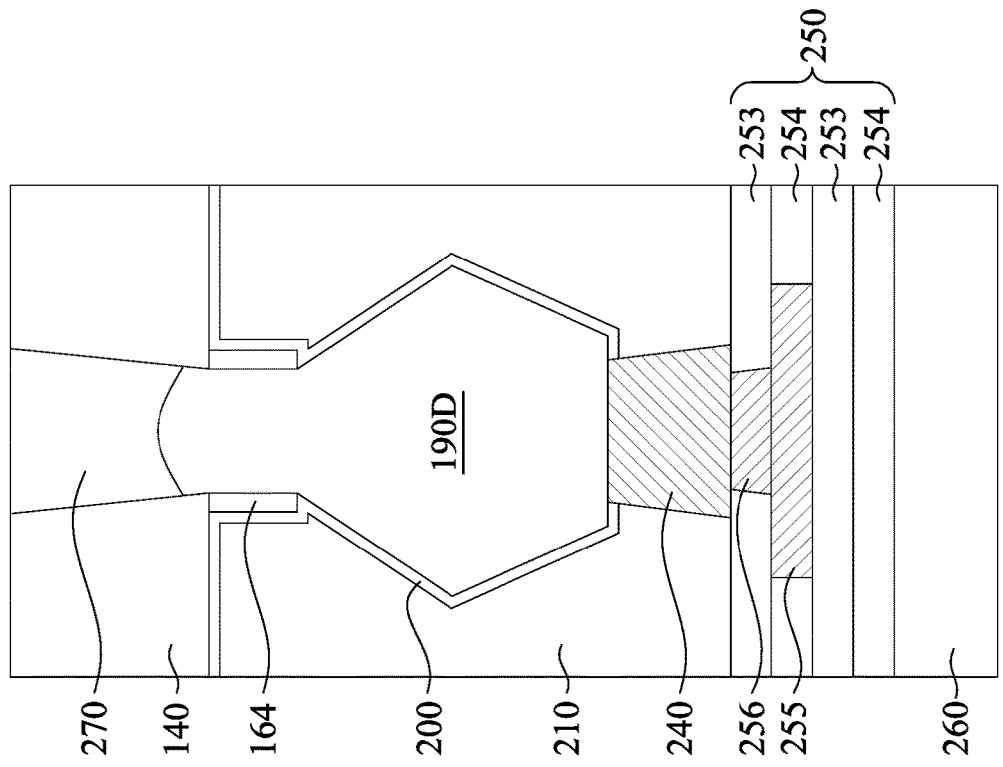
Figure 39B:
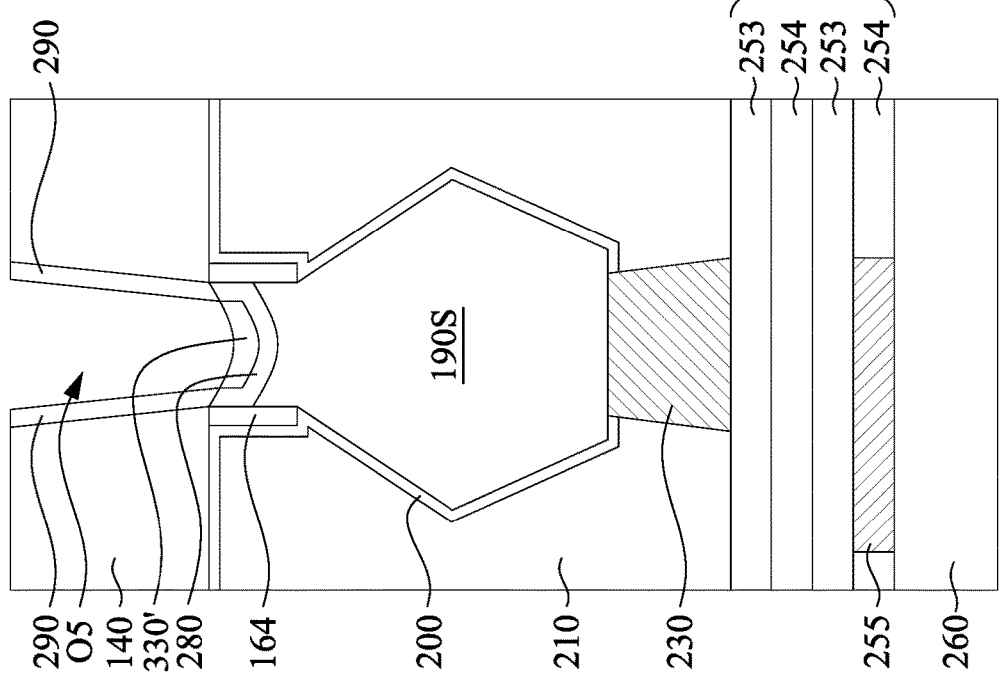

FIGS. 38A, 39A, 40A and 41 are cross-sectional views of intermediate stages of fabricating an integrated circuit structure 100c along a first cut (e.g., cut X-X in FIG. 4A), which is along a lengthwise direction of channels. FIGS. 38B, 39B and 40B are cross-sectional views of intermediate stages of fabricating the integrated circuit structure 100c along a second cut (e.g., cut Y1-Y1 in FIG. 4A), which is in the source region and perpendicular to the lengthwise direction of channels. FIGS. 38C, 39C and 40C are cross-sectional views of intermediate stages of fabricating the integrated circuit structure 100c along a third cut (e.g., cut Y2-Y2 in FIG. 4A), which is in the drain region and perpendicular to the lengthwise direction of channels.

FIG. 38A-38C illustrate some embodiments of a step subsequent to the step of FIGS. 23A-23C. In greater detail, after the via spacer 290 is formed in the backside via opening O5 and over the epitaxial regrowth layer 280, a metal layer 320' is formed over the carrier substrate 260 by using suitable deposition techniques, such as CVD, PVD, ALD, the like or combinations thereof. The metal layer 320' includes a metal capable of reacting with semiconductor materials of the underlying epitaxial regrowth layer 280, so as to form a silicide region in the epitaxial regrowth layer 280 in subsequent processing. For example, the metal layer 320' includes nickel, cobalt, titanium, tantalum, platinum, tungsten, other noble metals, other refractory metals, rare earth metals or their alloys.

After deposition of the metal layer 320', an anneal process is performed such that the metal layer 320' reacts with silicon (and germanium if present) in the epitaxial regrowth layer 280 to form a metal silicide (and germanide if germanium present in epitaxial regrowth layer 280) region 330' in the epitaxial regrowth layer 280, and then non-reacted portions of the metal layer 320' are removed by an etching process. The resultant structure is illustrated in FIGS. 39A-39C. In the depicted embodiment, the silicide region 330' is inlaid in the epitaxial regrowth layer 280. In greater detail, a peripheral region of the epitaxial regrowth layer 280 is not converted into silicide because it is covered by the via spacer 290 during the silicidation process. Instead, the peripheral region of the epitaxial regrowth layer 280 laterally surrounds the silicide region 330'. In some embodiments, the silicide region 330' includes, for example, titanium silicide, cobalt silicide, nickel silicide, the like or combinations thereof. As discussed previously, the via spacer 290 and the backside dielectric layer 270 have different etch selectivity, and thus the etching process of removing non-reacted metal layer 320' can use an etchant that etches the via spacer 290 at a slower etch rate than it etches the backside dielectric layer 270, which in turn prevents the backside via opening O5 from being unintentionally expanded due to removal of non-reacted metal layer 320'.

Figure 40A:
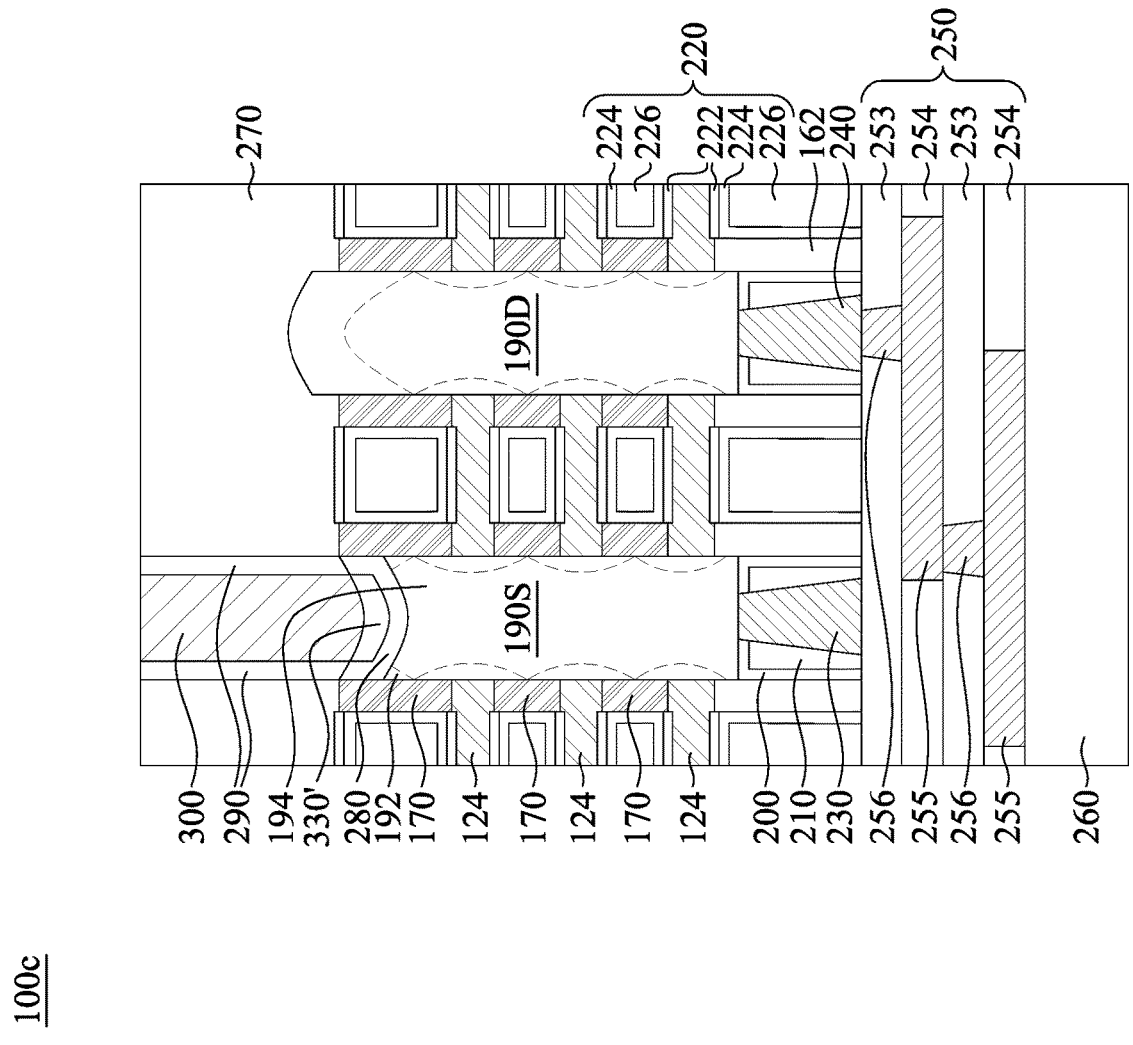
Figure 40C:
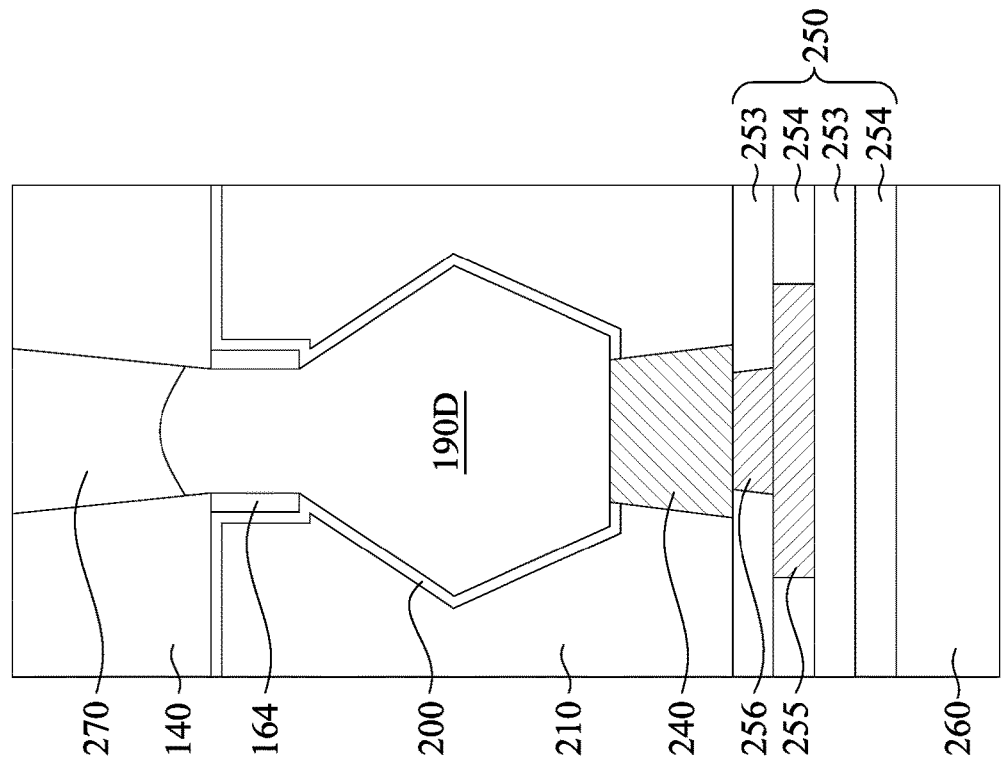
Figure 40B:
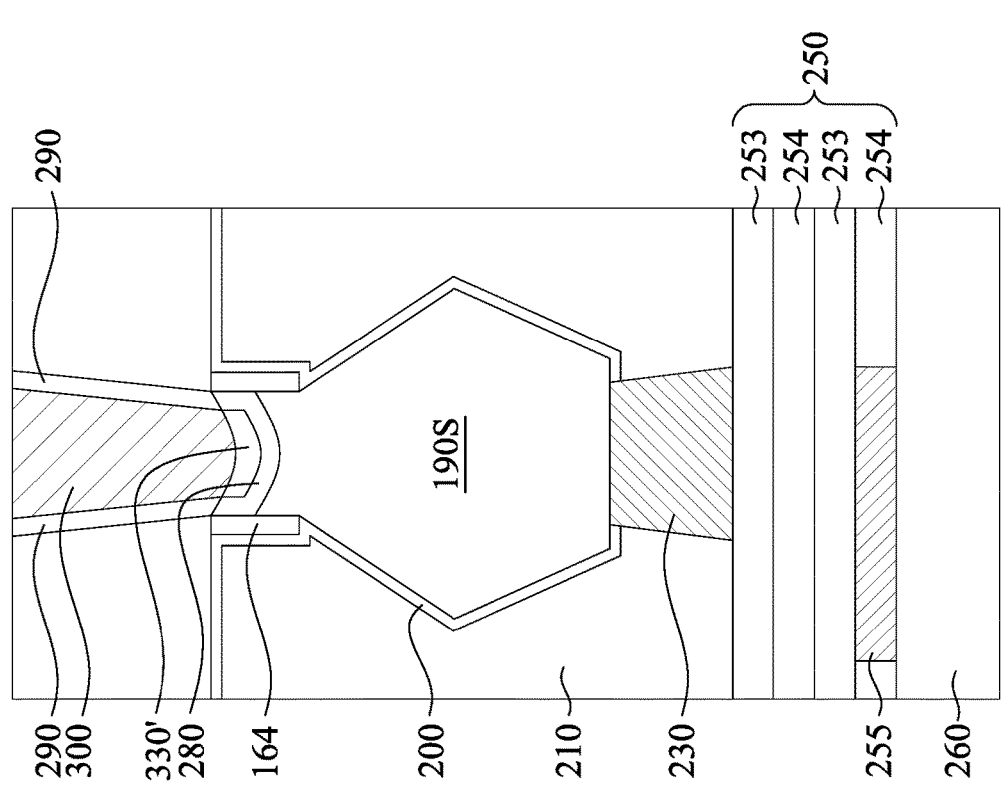
Figure 41:
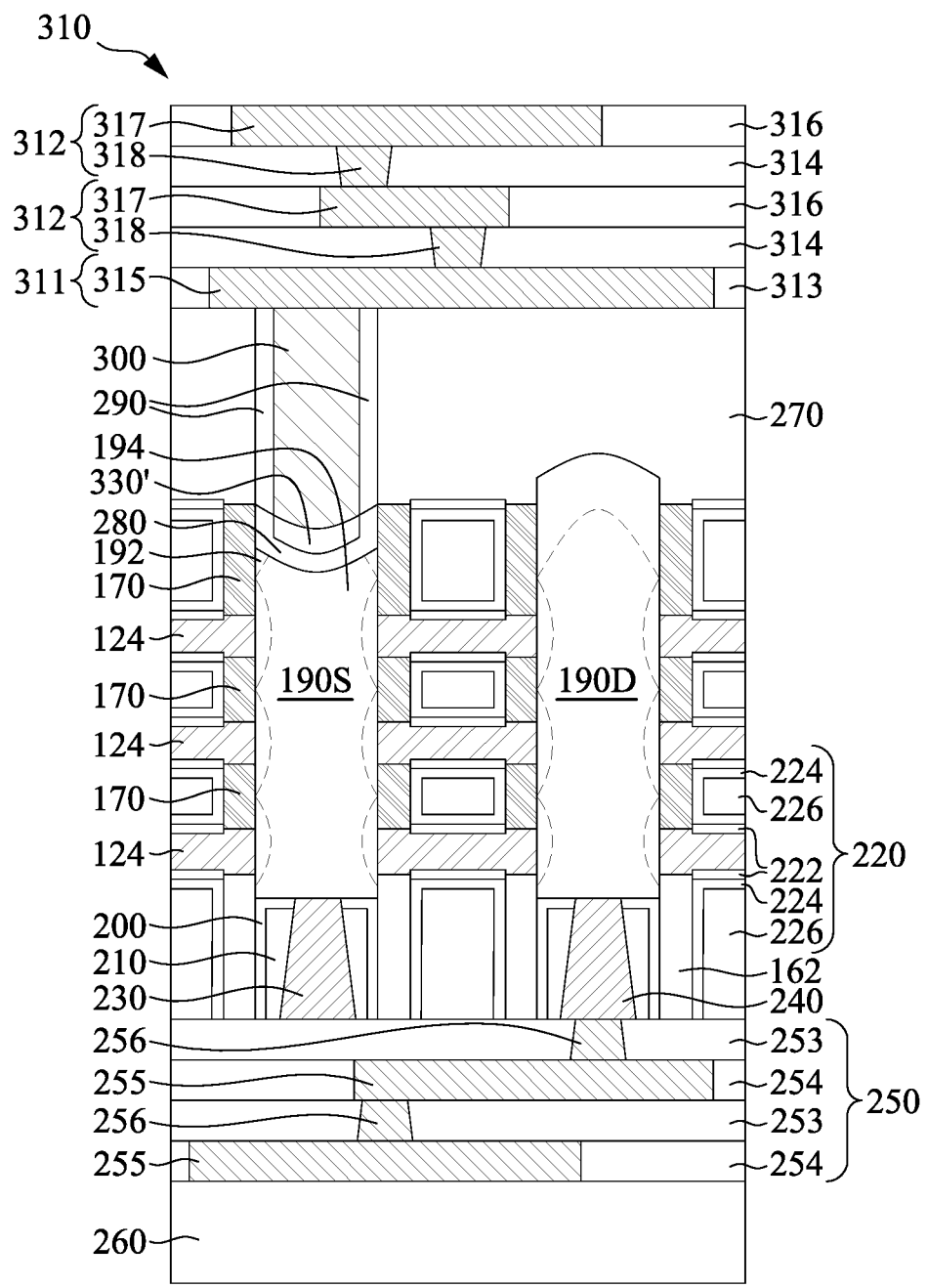

Next, a backside via 300 is formed to fill a remainder of the backside via opening O5, as illustrated in FIGS. 40A-40C. Subsequently, a backside MLI structure 310 is formed over the backside via 300, as illustrated in FIG. 41. Detail materials and formation processes of the backside via 300 and backside MLI structure 310 are discussed previously with respect to in FIGS. 24A-24C and 25, and thus they are not repeated for the sake of brevity.

Figure 42:
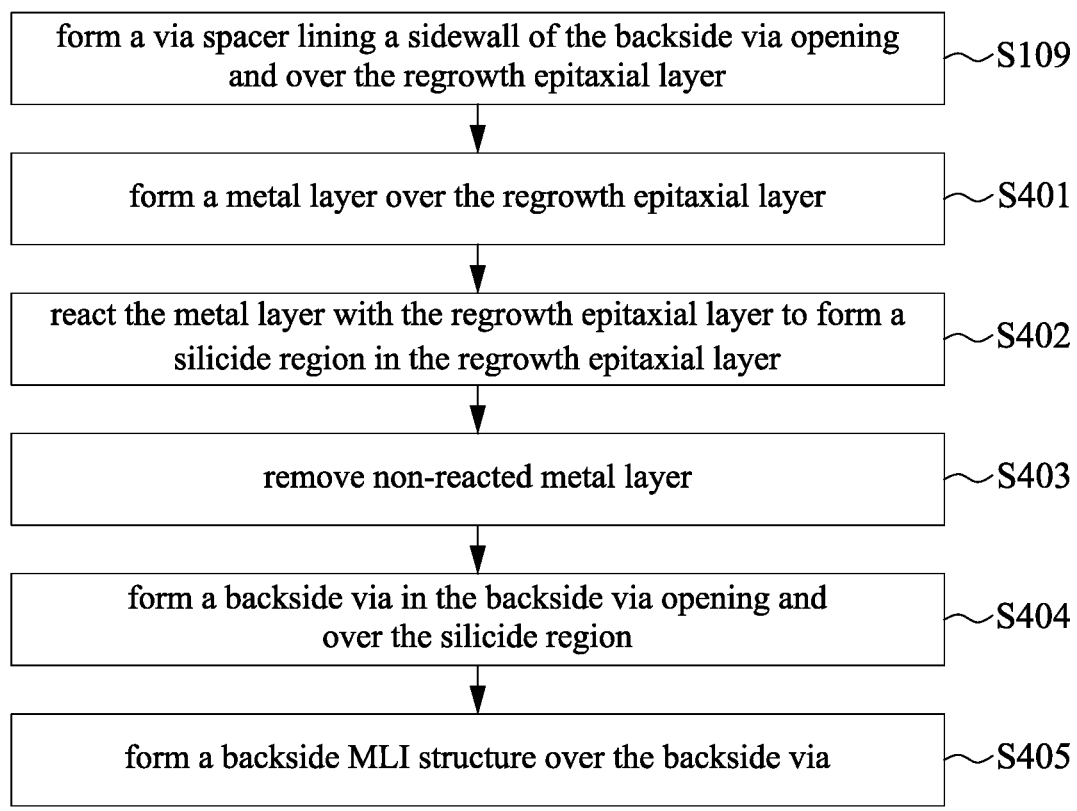
FIG. 42 is a flow chart illustrating a method of forming an integrated circuit structure in accordance with some embodiments of the present disclosure.

FIG. 42 is a flow chart illustrating a method M4 of forming an integrated circuit structure in accordance with some embodiments of the present disclosure. Although the method M4 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

The method M4 may branch from block S109 of previously described method M1 illustrated in FIG. 26, and thus the method M4 may include all previous blocks of the method M1 (i.e., blocks S101-S108). FIGS. 23A-23D illustrate cross-sectional views and a top view according to some embodiments of block S109.

At block S401 of the method M4, a metal layer is formed over the epitaxial regrowth layer. FIGS. 38A-38C illustrate cross-sectional views according to some embodiments of block S401.

At block S402 of the method M4, the metal layer is reacted with the epitaxial regrowth layer to form a silicide region in the epitaxial regrowth layer. At block S403 of the method M4, the non-reacted metal layer is removed. FIGS. 39A-39C illustrate cross-sectional views according to some embodiments of blocks S402 and S403.

At block S404 of the method M4, a backside via is formed in the backside via opening and over the silicide region. FIGS. 40A-40C illustrate cross-sectional views according to some embodiments of block S404.

At block S405 of the method M4, a backside MLI structure is formed over the backside via. FIG. 41 illustrates a cross-sectional view according to some embodiments of block S405.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that backside vias and backside metal lines (e.g., backside power rails) can be formed on a backside of transistors, which in turn allows for more routing space and hence higher routing density. Another advantage is that epitaxial regrowth layer formed on backside of the source epitaxial structure experiences less thermal processes than the source epitaxial structure, so that the epitaxial regrowth layer may have a better quality than the source epitaxial structure, which in turn helps in reducing the contact resistance between the backside via and the epitaxial regrowth layer.

In some embodiments, an integrated circuit (IC) structure includes a gate structure, a source epitaxial structure, a drain epitaxial structure, a front-side interconnection structure, a backside dielectric layer, an epitaxial regrowth layer, and a backside via. The source epitaxial structure and the drain epitaxial structure are respectively on opposite sides of the gate structure. The front-side interconnection structure is over a front-side of the source epitaxial structure and a front-side of the drain epitaxial structure. The backside dielectric layer is over a backside of the source epitaxial structure and a backside of the drain epitaxial structure. The epitaxial regrowth layer is on the backside of a first one of the source epitaxial structure and the drain epitaxial structure. The backside via extends through the backside dielectric layer and overlaps the epitaxial regrowth layer.

In some embodiments, an IC structure includes a plurality of channel layers, a gate structure, a source epitaxial structure, a drain epitaxial structure, a front-side interconnection structure, a backside via, and an epitaxial regrowth layer. The plurality of channel layers are arranged one above another in a spaced apart manner. The gate structure surrounds each of the plurality of channel layers. The source epitaxial structure and the drain epitaxial structure are respectively on opposite end surfaces of the plurality of channel layers. The front-side interconnection structure is over a front-side of the source epitaxial structure and a front-side of the drain epitaxial structure. The backside via is over a backside of a first one of the source epitaxial structure and the drain epitaxial structure. The epitaxial regrowth layer is between the backside via and the first one of the source epitaxial structure and the drain epitaxial structure.

In some embodiments, a method includes forming a transistor over a substrate, the transistor comprising a source epitaxial structure, a drain epitaxial structure, and a gate structure laterally between the source epitaxial structure and the drain epitaxial structure; removing the substrate to expose a backside of the transistor; forming a backside dielectric layer over the exposed backside of the transistor; forming a backside via opening in the backside dielectric layer to expose a backside of the source epitaxial structure of the transistor; forming an epitaxial regrowth layer over the exposed backside of the source epitaxial structure of the transistor; and forming a backside via in the backside via opening and over the epitaxial regrowth layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a transistor over a substrate, the transistor comprising a first source/drain epitaxial structure, a second source/drain epitaxial structure, and a gate structure laterally between the first source/drain epitaxial structure and the second source/drain epitaxial structure;
   removing at least a portion of the substrate to expose a backside of the transistor;
   forming a backside dielectric layer over the exposed backside of the transistor;
   forming a backside via opening in the backside dielectric layer to expose a backside of the first source/drain epitaxial structure of the transistor;
   forming an epitaxial regrowth layer over the exposed backside of the first source/drain epitaxial structure of the transistor; and
   forming a backside via in the backside via opening and over the epitaxial regrowth layer.

2. The method of claim 1, further comprising:
   forming a via spacer lining sidewalls of the backside via opening before forming the epitaxial regrowth layer.

3. The method of claim 1, further comprising:
   forming a via spacer lining sidewalls of the backside via opening after forming the epitaxial regrowth layer and before forming the backside via.

4. The method of claim 1, further comprising:
   forming a via spacer lining sidewalls of the backside via opening; and
   after forming the via spacer, forming a silicide region in the epitaxial regrowth layer.

5. The method of claim 4, wherein forming the via spacer is performed prior to forming the epitaxial regrowth layer.

6. The method of claim 4, wherein forming the via spacer is performed after forming the epitaxial regrowth layer and prior to forming the silicide region.

7. The method of claim 1, wherein forming the epitaxial regrowth layer comprises doping the epitaxial regrowth layer with n-type or p-type dopants.

8. A method comprising:
   forming a first recess and a second recess in a first side of a substrate;
   forming a sacrificial layer on a bottom surface of the first recess;

forming a first epitaxial region over the sacrificial layer in the first recess and a second epitaxial region in the second recess;
removing at least a portion of the substrate to expose the sacrificial layer;
forming a backside dielectric layer along sidewalls of the sacrificial layer;
removing the sacrificial layer to form a third recess in the backside dielectric layer;
forming a third epitaxial region on the first epitaxial region in the third recess; and
forming a backside via to the third epitaxial region in the third recess.

9. The method of claim 8, wherein the first recess is deeper than the second recess.

10. The method of claim 8, wherein removing the substrate exposes the second epitaxial region.

11. The method of claim 8, wherein the substrate comprises a fin, wherein the first recess and the second recess are formed in the fin, further comprising:
forming isolation regions on opposing sides of the fin, wherein the isolation regions extends along opposite sidewalls of the second epitaxial region.

12. The method of claim 8, further comprising:
forming spacers on sidewalls of the third recess prior to forming the third epitaxial region.

13. The method of claim 12, wherein the spacers completely encircles the backside via in a plan view.

14. The method of claim 8, further comprising:
after forming the third epitaxial region, forming spacers along sidewalls of the third recess over the third epitaxial region.

15. A method comprising:
forming a fin protruding from a first side of a substrate;
forming isolation region over the substrate on opposing sides of the fin, wherein the fin protrudes above the isolation region;
performing a first etch process to form a first recess and a second recess in the fin, wherein the first recess and the second recess extends below an upper surface of the isolation region;
epitaxially growing a sacrificial layer on a bottom surface of the first recess;
epitaxially growing a first epitaxial region over the sacrificial layer in the first recess, wherein the first epitaxial region is a different material than the sacrificial layer;
epitaxially growing a second epitaxial region in the second recess;
removing at least a portion of a second side of the substrate to expose the sacrificial layer, the second epitaxial region, and a bottom side of the isolation region;
forming a backside dielectric layer on the second epitaxial region, along sidewalls of the sacrificial layer, and the bottom side of the isolation region;
removing the sacrificial layer to form a third recess in the backside dielectric layer, wherein the first epitaxial region is exposed in the third recess;
forming a regrowth layer on the first epitaxial region in the third recess; and
forming a backside via to the regrowth layer in the third recess.

16. The method of claim 15, further comprising, prior to epitaxially growing the sacrificial layer, performing a second etch process to extend a depth of the first recess, wherein after performing the second etch process the depth of the first recess is greater than a depth of the second recess.

17. The method of claim 15, further comprising:
forming spacers along sidewalls of the third recess prior to forming the regrowth layer.

18. The method of claim 15, further comprising:
forming spacers along sidewalls of the third recess after forming the regrowth layer.

19. The method of claim 15, wherein the sacrificial layer is free of n-type and p-type dopants.

20. The method of claim 15, further comprising:
siliciding a surface of the regrowth layer prior to forming the backside via.

* * * * *